United States Patent
Takada et al.

(10) Patent No.: US 10,847,192 B2
(45) Date of Patent: Nov. 24, 2020

(54) SEMICONDUCTOR MEMORY DEVICE

(71) Applicant: Toshiba Memory Corporation, Minato-ku (JP)

(72) Inventors: Marie Takada, Yokohama (JP); Masanobu Shirakawa, Chigasaki (JP); Takuya Futatsuyama, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/568,662

(22) Filed: Sep. 12, 2019

(65) Prior Publication Data

US 2020/0273500 A1 Aug. 27, 2020

(30) Foreign Application Priority Data

Feb. 26, 2019 (JP) .................. 2019-032875

(51) Int. Cl.
| | |
|---|---|
| G11C 5/06 | (2006.01) |
| G11C 16/26 | (2006.01) |
| G11C 16/08 | (2006.01) |
| G11C 16/10 | (2006.01) |
| G11C 16/24 | (2006.01) |
| G11C 7/08 | (2006.01) |
| H01L 27/11582 | (2017.01) |
| H01L 27/1157 | (2017.01) |
| H01L 23/522 | (2006.01) |

(52) U.S. Cl.
CPC .............. *G11C 5/063* (2013.01); *G11C 7/08* (2013.01); *G11C 16/08* (2013.01); *G11C 16/10* (2013.01); *G11C 16/24* (2013.01); *G11C 16/26* (2013.01); *H01L 23/5226* (2013.01); *H01L 27/1157* (2013.01); *H01L 27/11582* (2013.01)

(58) Field of Classification Search
CPC .......... G11C 5/063; G11C 7/08; G11C 16/08; G11C 16/10; G11C 16/24; G11C 16/26; H01L 23/5226; H01L 27/1157; H01L 27/11582
See application file for complete search history.

(56) References Cited

U.S. PATENT DOCUMENTS

| | | | |
|---|---|---|---|
| 8,250,437 B2 | 8/2012 | Sakurada et al. | |
| 8,649,225 B2 * | 2/2014 | Nagadomi | G11C 16/08 |
| | | | 365/185.29 |
| 9,153,325 B2 * | 10/2015 | Maejima | G11C 16/16 |
| 9,613,713 B2 | 4/2017 | Shirakawa et al. | |
| 9,653,172 B2 * | 5/2017 | Lee | G11C 16/28 |

(Continued)

*Primary Examiner* — Tri M Hoang
(74) *Attorney, Agent, or Firm* — Oblon, McClelland, Maier & Neustadt, L.L.P.

(57) ABSTRACT

According to one embodiment, a semiconductor memory device includes: a first memory cell; a second memory cell; a first word line; a second word line; and a first bit line. The first memory cell faces the second memory cell. When reading data from the first memory cell, the semiconductor memory device is configured to perform the first operation in which a first voltage is applied to the first word line and a second voltage higher than the first voltage is applied to the second word line, and perform the second operation in which a third voltage higher than the first voltage and a fourth voltage different from the third voltage are applied to the first word line and a fifth voltage lower than the second to the fourth voltage is applied to the second word line.

20 Claims, 54 Drawing Sheets

(56) References Cited

U.S. PATENT DOCUMENTS

| | | |
|---|---|---|
| 9,659,663 B2 * | 5/2017 | Shirakawa .......... G11C 16/3427 |
| 9,721,668 B2 | 8/2017 | Yeh et al. |
| 9,870,832 B2 * | 1/2018 | Kim ........................ G11C 7/22 |
| 10,204,680 B2 * | 2/2019 | Tokutomi ........... G11C 16/0483 |
| 2017/0053934 A1 | 2/2017 | Lue |

* cited by examiner

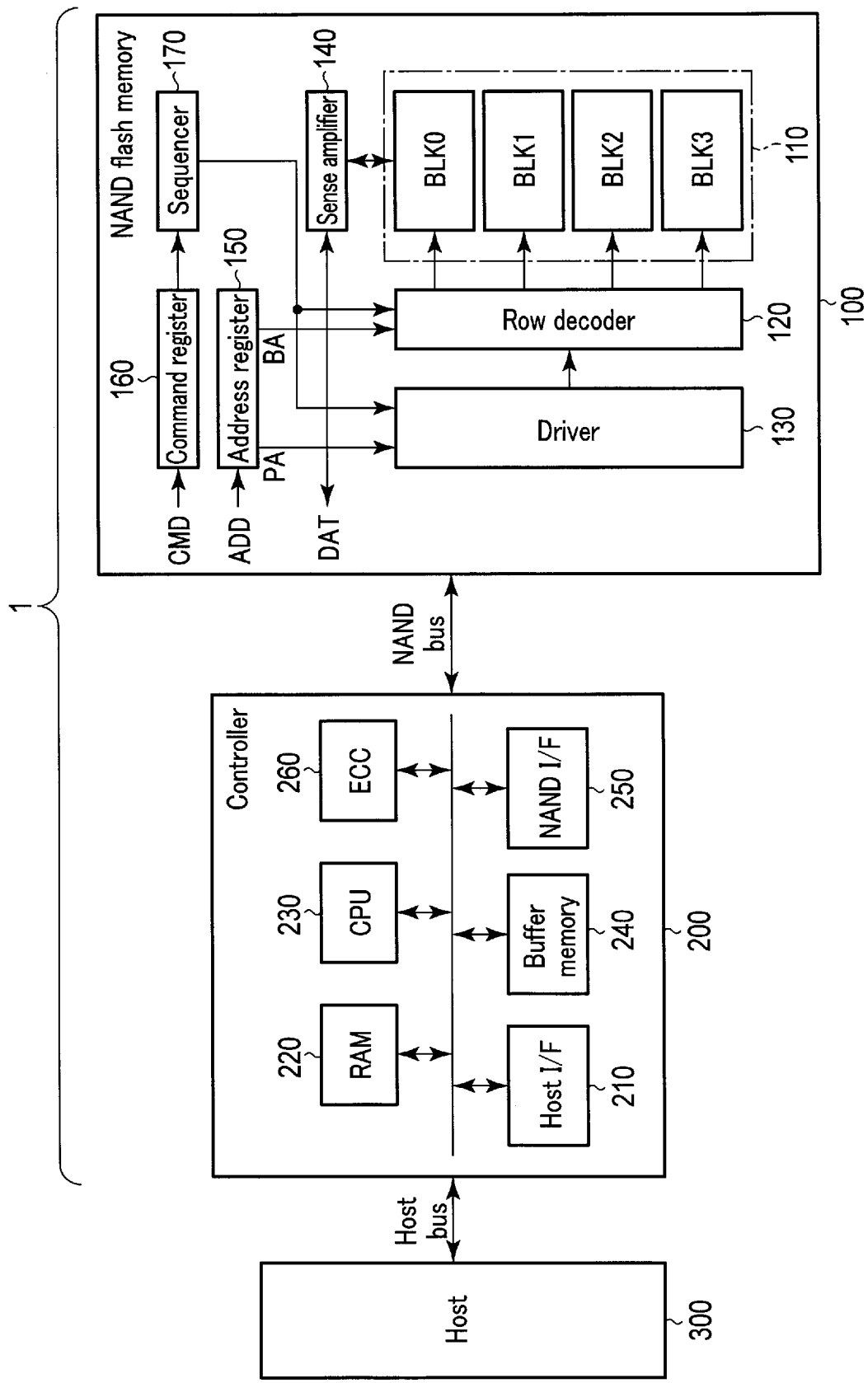
F I G. 1

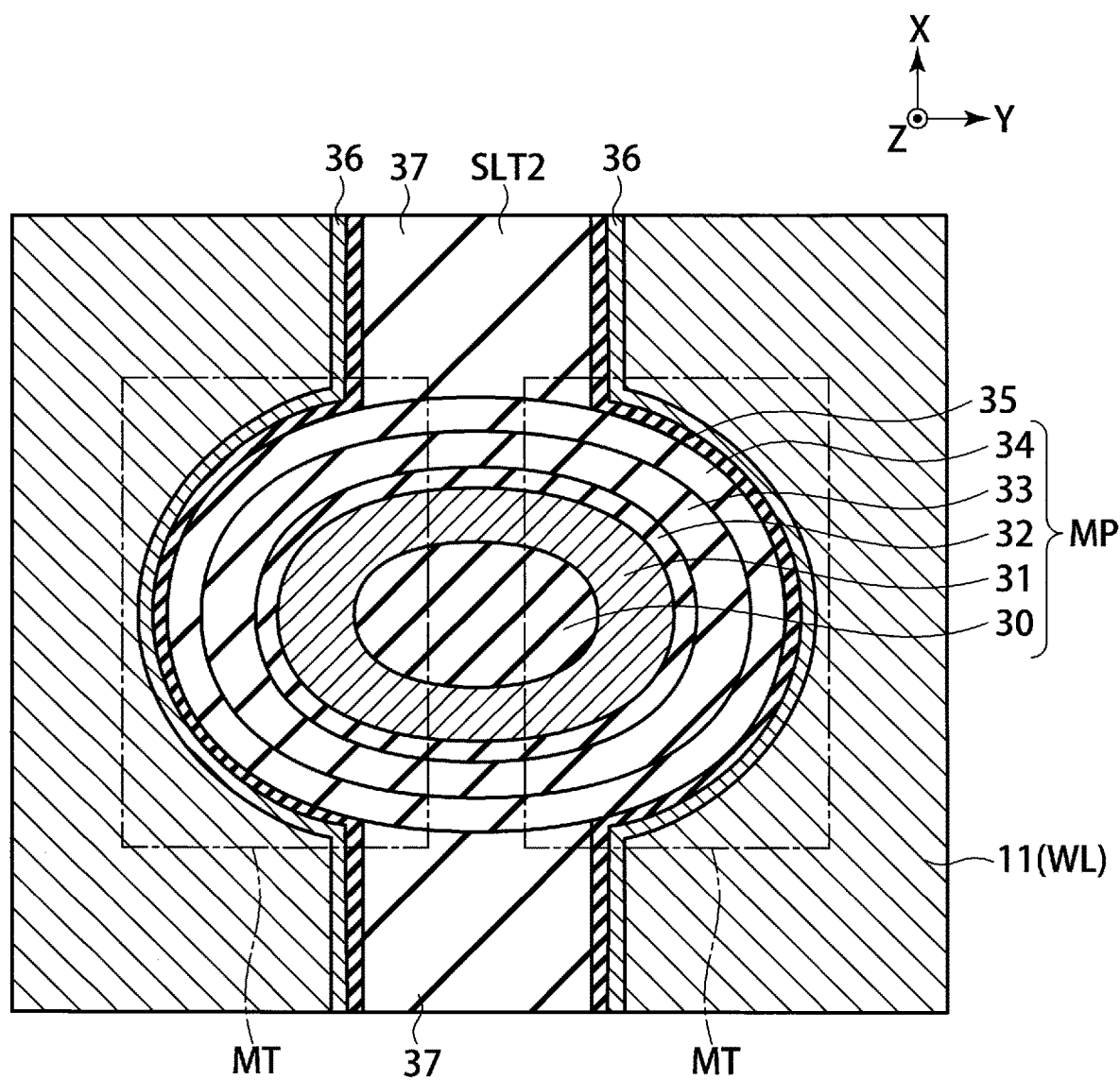
F I G. 6

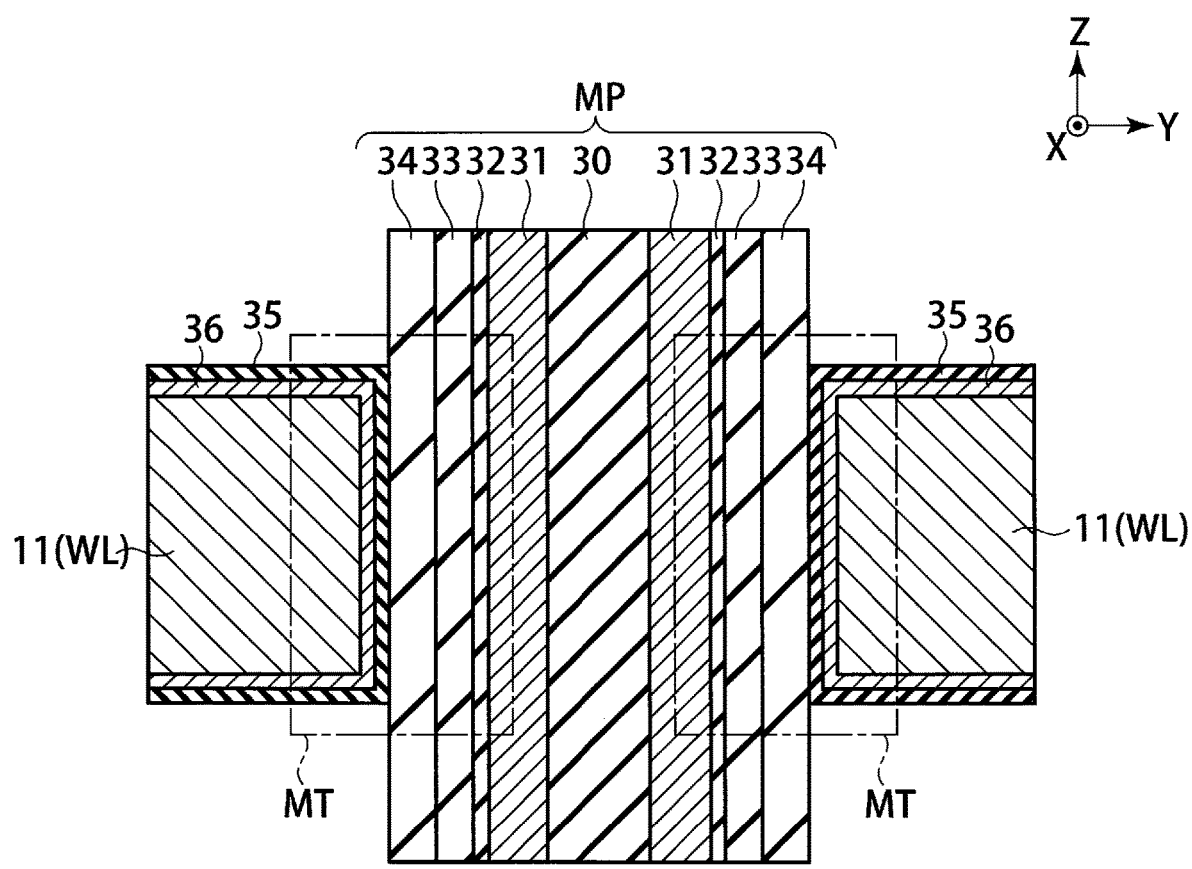
F I G. 7

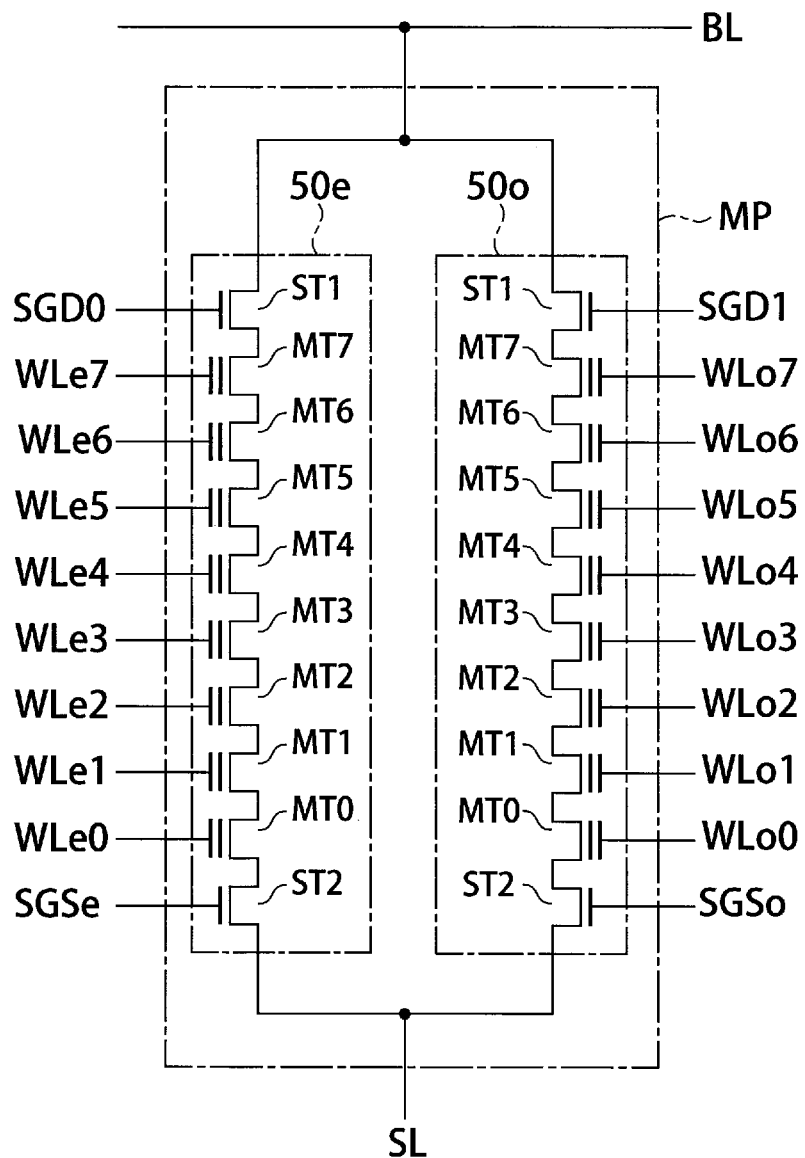
F I G. 8

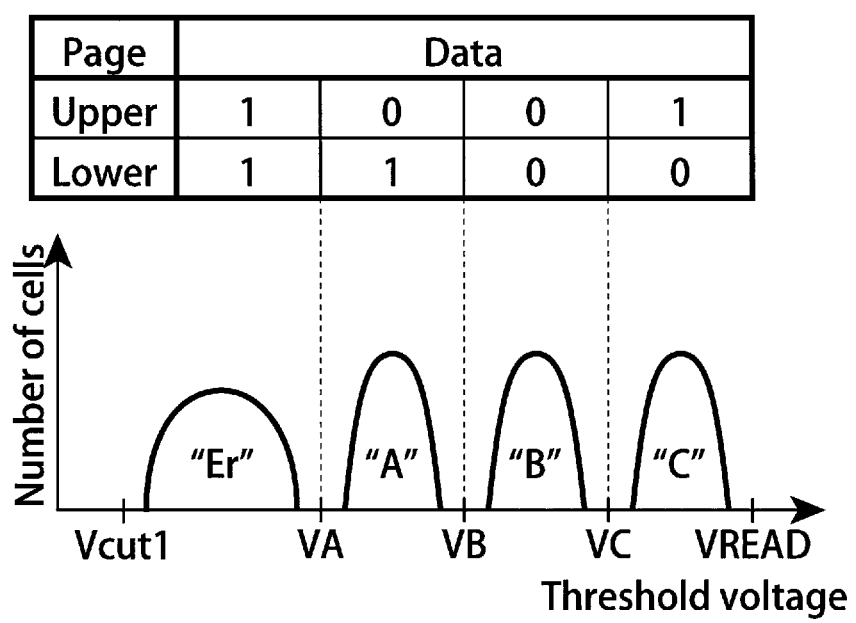
F I G. 9

F I G. 10

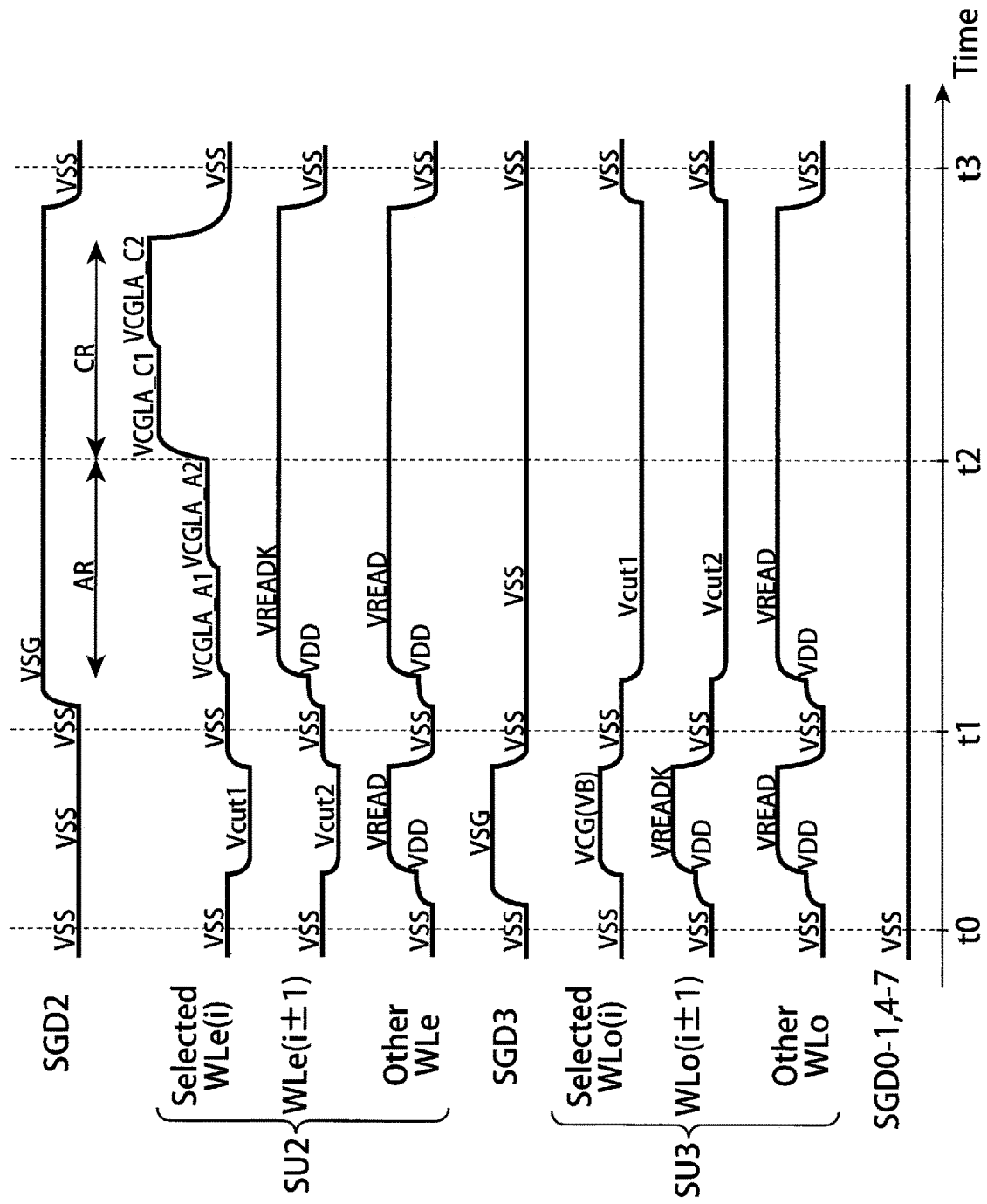
F I G. 12

| Read target SU | Prior-read target SU | Subject bit line |
|---|---|---|
| SU0 | SU1<br>SU7 | BL(4j)<br>BL(4j+1), BL(4j+2), BL(4j+3) |
| SU1 | SU2 | BL(4j+1), BL(4j+2), BL(4j+3) |
| SU2 | SU3 | BL(4j) |
| SU3 | SU4 | BL(4j+1), BL(4j+2), BL(4j+3) |
| SU4 | SU5 | BL(4j) |
| SU5 | SU6 | BL(4j+1), BL(4j+2), BL(4j+3) |
| SU6 | SU7 | BL(4j) |
| SU7 | | |

F I G. 13

| Read target SU | Prior-read target SU | Subject bit line |
|---|---|---|
| SU0 | SU1<br>SU7 | BL(4j)<br>BL(4j+1), BL(4j+2), BL(4j+3) |
| SU1 | | |
| SU2 | SU1<br>SU3 | BL(4j+1), BL(4j+2), BL(4j+3)<br>BL(4j) |
| SU3 | | |
| SU4 | SU3<br>SU5 | BL(4j+1), BL(4j+2), BL(4j+3)<br>BL(4j) |
| SU5 | | |
| SU6 | SU5<br>SU7 | BL(4j+1), BL(4j+2), BL(4j+3)<br>BL(4j) |
| SU7 | | |

F I G. 15

| WL(i+1) Backside cell | "Er"/"A" | "B"/"C" |
|---|---|---|
| "Er"/"A" | Small<br>·VCGLA_A1(≒VA)<br>·VCGLA_C1(≒VC) | Medium<br>·VCGLA_A2<br>·VCGLA_C2 |
| "B"/"C" | Medium<br>·VCGLA_A3<br>·VCGLA_C3 | Large<br>·VCGLA_A4<br>·VCGLA_C4 |

F I G. 18B

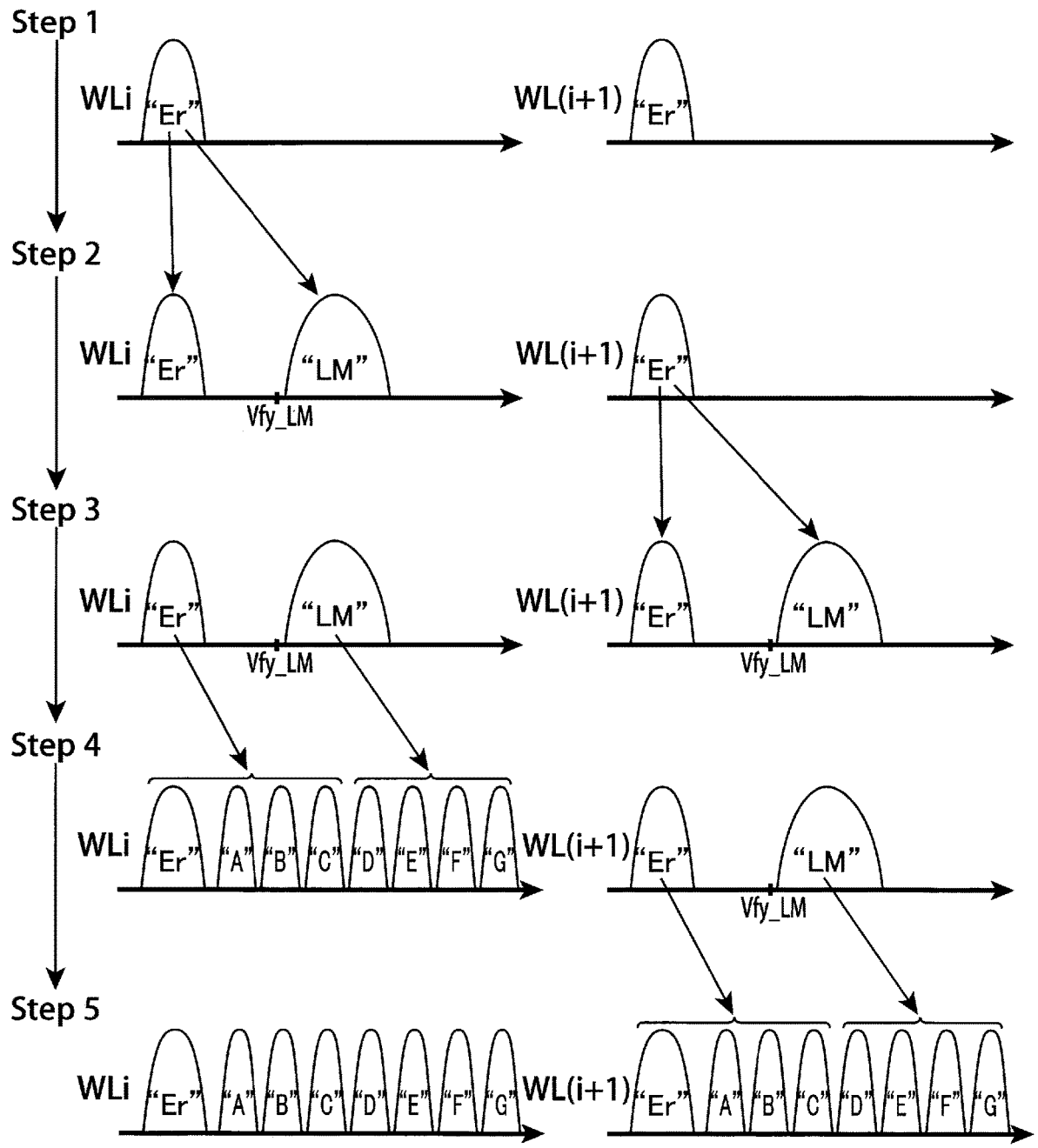
F I G. 20

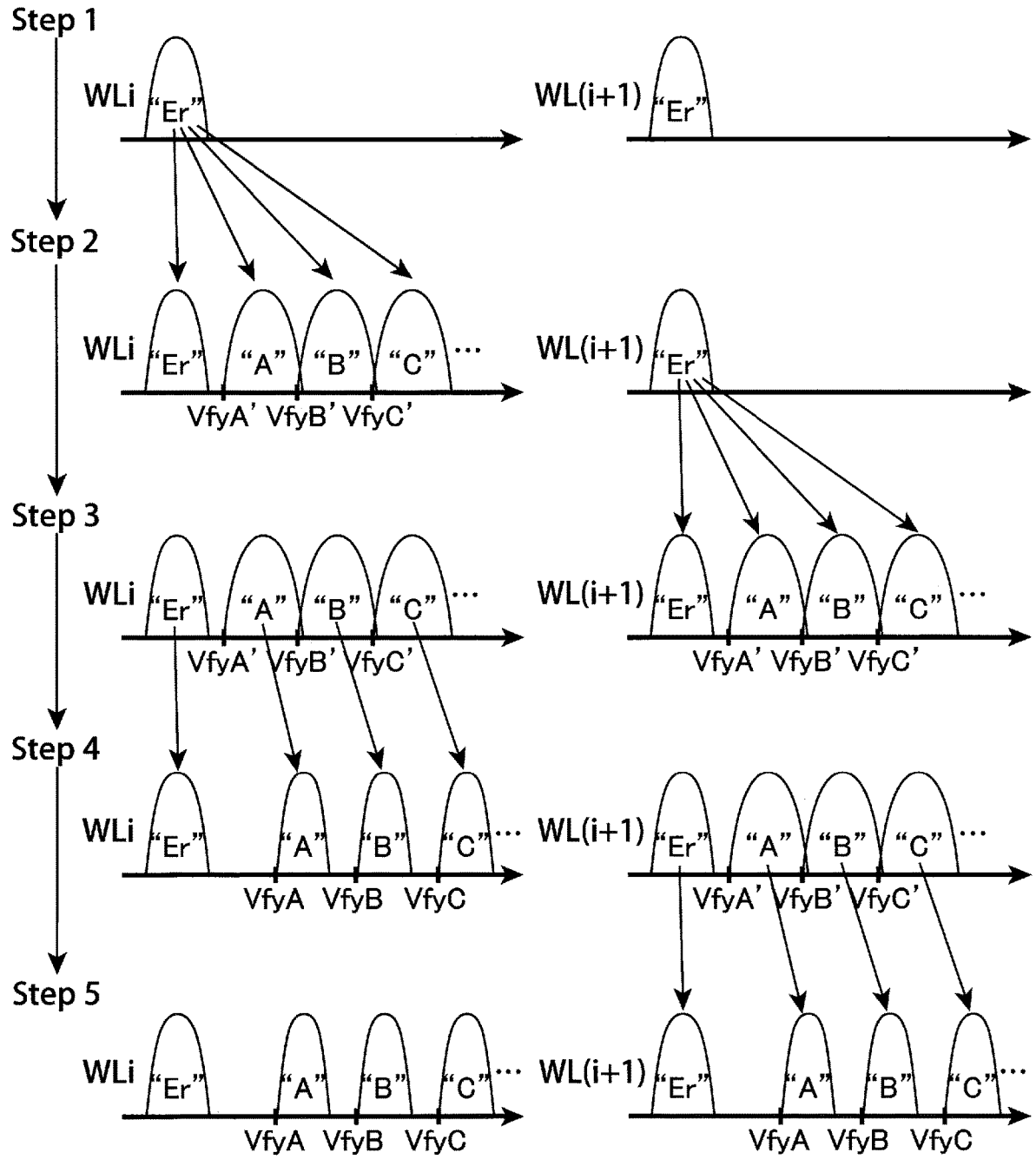
F I G. 21

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 104 | 120 | 105 | 121 | 106 | 122 | 107 | 123 | 108 | 124 | 109 | 125 | 110 | 126 | 111 | 127 |
| WL6 | 88 | 112 | 89 | 113 | 90 | 114 | 91 | 115 | 92 | 116 | 93 | 117 | 94 | 118 | 95 | 119 |
| WL5 | 72 | 96 | 73 | 97 | 74 | 98 | 75 | 99 | 76 | 100 | 77 | 101 | 78 | 102 | 79 | 103 |
| WL4 | 56 | 80 | 57 | 81 | 58 | 82 | 59 | 83 | 60 | 84 | 61 | 85 | 62 | 86 | 63 | 87 |
| WL3 | 40 | 64 | 41 | 65 | 42 | 66 | 43 | 67 | 44 | 68 | 45 | 69 | 46 | 70 | 47 | 71 |
| WL2 | 24 | 48 | 25 | 49 | 26 | 50 | 27 | 51 | 28 | 52 | 29 | 53 | 30 | 54 | 31 | 55 |
| WL1 | 8 | 32 | 9 | 33 | 10 | 34 | 11 | 35 | 12 | 36 | 13 | 37 | 14 | 38 | 15 | 39 |
| WL0 | 0 | 16 | 1 | 17 | 2 | 18 | 3 | 19 | 4 | 20 | 5 | 21 | 6 | 22 | 7 | 23 |

F I G. 22

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 104 | 120 | 108 | 124 | 105 | 121 | 109 | 125 | 106 | 122 | 110 | 126 | 107 | 123 | 111 | 127 |
| WL6 | 88 | 112 | 92 | 116 | 89 | 113 | 93 | 117 | 90 | 114 | 94 | 118 | 91 | 115 | 95 | 119 |
| WL5 | 72 | 96 | 76 | 100 | 73 | 97 | 77 | 101 | 74 | 98 | 78 | 102 | 75 | 99 | 79 | 103 |
| WL4 | 56 | 80 | 60 | 84 | 57 | 81 | 61 | 85 | 58 | 82 | 62 | 86 | 59 | 83 | 63 | 87 |
| WL3 | 40 | 64 | 44 | 68 | 41 | 65 | 45 | 69 | 42 | 66 | 46 | 70 | 43 | 67 | 47 | 71 |
| WL2 | 24 | 48 | 28 | 52 | 25 | 49 | 29 | 53 | 26 | 50 | 30 | 54 | 27 | 51 | 31 | 55 |
| WL1 | 8 | 32 | 12 | 36 | 9 | 33 | 13 | 37 | 10 | 34 | 14 | 38 | 11 | 35 | 15 | 39 |
| WL0 | 0 | 16 | 4 | 20 | 1 | 17 | 5 | 21 | 2 | 18 | 6 | 22 | 3 | 19 | 7 | 23 |

F I G. 24

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 52 | 60 | 116 | 124 | 53 | 61 | 117 | 125 | 54 | 62 | 118 | 126 | 55 | 63 | 119 | 127 |
| WL6 | 44 | 56 | 108 | 120 | 45 | 57 | 109 | 121 | 46 | 58 | 110 | 122 | 47 | 59 | 111 | 123 |
| WL5 | 36 | 48 | 100 | 112 | 37 | 49 | 101 | 113 | 38 | 50 | 102 | 114 | 39 | 51 | 103 | 115 |
| WL4 | 28 | 40 | 92 | 104 | 29 | 41 | 93 | 105 | 30 | 42 | 94 | 106 | 31 | 43 | 95 | 107 |
| WL3 | 20 | 32 | 84 | 96 | 21 | 33 | 85 | 97 | 22 | 34 | 86 | 98 | 23 | 35 | 87 | 99 |
| WL2 | 12 | 24 | 76 | 88 | 13 | 25 | 77 | 89 | 14 | 26 | 78 | 90 | 15 | 27 | 79 | 91 |
| WL1 | 4 | 16 | 68 | 80 | 5 | 17 | 69 | 81 | 6 | 18 | 70 | 82 | 7 | 19 | 71 | 83 |
| WL0 | 0 | 8 | 64 | 72 | 1 | 9 | 65 | 73 | 2 | 10 | 66 | 74 | 3 | 11 | 67 | 75 |

F I G. 25

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 97 | 120 | 99 | 121 | 101 | 122 | 103 | 123 | 105 | 124 | 107 | 125 | 109 | 126 | 111 | 127 |
| WL6 | 81 | 112 | 83 | 113 | 85 | 114 | 87 | 115 | 89 | 116 | 91 | 117 | 93 | 118 | 95 | 119 |
| WL5 | 65 | 96 | 67 | 98 | 69 | 100 | 71 | 102 | 73 | 104 | 75 | 106 | 77 | 108 | 79 | 110 |
| WL4 | 49 | 80 | 51 | 82 | 53 | 84 | 55 | 86 | 57 | 88 | 59 | 90 | 61 | 92 | 63 | 94 |
| WL3 | 33 | 64 | 35 | 66 | 37 | 68 | 39 | 70 | 41 | 72 | 43 | 74 | 45 | 76 | 47 | 78 |
| WL2 | 17 | 48 | 19 | 50 | 21 | 52 | 23 | 54 | 25 | 56 | 27 | 58 | 29 | 60 | 31 | 62 |
| WL1 | 1 | 32 | 3 | 34 | 5 | 36 | 7 | 38 | 9 | 40 | 11 | 42 | 13 | 44 | 15 | 46 |
| WL0 | 0 | 16 | 2 | 18 | 4 | 20 | 6 | 22 | 8 | 24 | 10 | 26 | 12 | 28 | 14 | 30 |

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 97 | 120 | 105 | 124 | 99 | 121 | 107 | 125 | 101 | 122 | 109 | 126 | 103 | 123 | 111 | 127 |
| WL6 | 81 | 112 | 89 | 116 | 83 | 113 | 91 | 117 | 85 | 114 | 93 | 118 | 87 | 115 | 95 | 119 |
| WL5 | 65 | 96 | 73 | 104 | 67 | 98 | 75 | 106 | 69 | 100 | 77 | 108 | 71 | 102 | 79 | 110 |
| WL4 | 49 | 80 | 57 | 88 | 51 | 82 | 59 | 90 | 53 | 84 | 61 | 92 | 55 | 86 | 63 | 94 |
| WL3 | 33 | 64 | 41 | 72 | 35 | 66 | 43 | 74 | 37 | 68 | 45 | 76 | 39 | 70 | 47 | 78 |
| WL2 | 17 | 48 | 25 | 56 | 19 | 50 | 27 | 58 | 21 | 52 | 29 | 60 | 23 | 54 | 31 | 62 |
| WL1 | 1 | 32 | 9 | 40 | 3 | 34 | 11 | 42 | 5 | 36 | 13 | 44 | 7 | 38 | 15 | 46 |
| WL0 | 0 | 16 | 8 | 24 | 2 | 18 | 10 | 26 | 4 | 20 | 12 | 28 | 6 | 22 | 14 | 30 |

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 49 | 60 | 113 | 124 | 51 | 61 | 115 | 125 | 53 | 62 | 117 | 126 | 55 | 63 | 119 | 127 |
| WL6 | 41 | 56 | 105 | 120 | 43 | 57 | 107 | 121 | 45 | 58 | 109 | 122 | 47 | 59 | 111 | 123 |
| WL5 | 33 | 48 | 97 | 112 | 35 | 50 | 99 | 114 | 37 | 52 | 101 | 116 | 39 | 54 | 103 | 118 |
| WL4 | 25 | 40 | 89 | 104 | 27 | 42 | 91 | 106 | 29 | 44 | 93 | 108 | 31 | 46 | 95 | 110 |
| WL3 | 17 | 32 | 81 | 96 | 19 | 34 | 83 | 98 | 21 | 36 | 85 | 100 | 23 | 38 | 87 | 102 |
| WL2 | 9 | 24 | 73 | 88 | 11 | 26 | 75 | 90 | 13 | 28 | 77 | 92 | 15 | 30 | 79 | 94 |
| WL1 | 1 | 16 | 65 | 80 | 3 | 18 | 67 | 82 | 5 | 20 | 69 | 84 | 7 | 22 | 71 | 86 |
| WL0 | 0 | 8 | 64 | 72 | 2 | 10 | 66 | 74 | 4 | 12 | 68 | 76 | 6 | 14 | 70 | 78 |

F I G. 28

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 104 | 120 | 106 | 121 | 108 | 122 | 110 | 123 | 112 | 124 | 114 | 125 | 116 | 126 | 118 | 127 |
| WL6 | 88 | 105 | 90 | 107 | 92 | 109 | 94 | 111 | 96 | 113 | 98 | 115 | 100 | 117 | 102 | 119 |
| WL5 | 72 | 89 | 74 | 91 | 76 | 93 | 78 | 95 | 80 | 97 | 82 | 99 | 84 | 101 | 86 | 103 |
| WL4 | 56 | 73 | 58 | 75 | 60 | 77 | 62 | 79 | 64 | 81 | 66 | 83 | 68 | 85 | 70 | 87 |
| WL3 | 40 | 57 | 42 | 59 | 44 | 61 | 46 | 63 | 48 | 65 | 50 | 67 | 52 | 69 | 54 | 71 |
| WL2 | 24 | 41 | 26 | 43 | 28 | 45 | 30 | 47 | 32 | 49 | 34 | 51 | 36 | 53 | 38 | 55 |
| WL1 | 1 | 25 | 4 | 27 | 7 | 29 | 10 | 31 | 13 | 33 | 16 | 35 | 19 | 37 | 22 | 39 |
| WL0 | 0 | 2 | 3 | 5 | 6 | 8 | 9 | 11 | 12 | 14 | 15 | 17 | 18 | 20 | 21 | 23 |

F I G. 29

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 104 | 120 | 112 | 124 | 106 | 121 | 114 | 125 | 108 | 122 | 116 | 126 | 110 | 123 | 118 | 127 |
| WL6 | 88 | 105 | 96 | 113 | 90 | 107 | 98 | 115 | 92 | 109 | 100 | 117 | 94 | 111 | 102 | 119 |
| WL5 | 72 | 89 | 80 | 97 | 74 | 91 | 82 | 99 | 76 | 93 | 84 | 101 | 78 | 95 | 86 | 103 |
| WL4 | 56 | 73 | 64 | 81 | 58 | 75 | 66 | 83 | 60 | 77 | 68 | 85 | 62 | 79 | 70 | 87 |
| WL3 | 40 | 57 | 48 | 65 | 42 | 59 | 50 | 67 | 44 | 61 | 52 | 69 | 46 | 63 | 54 | 71 |
| WL2 | 24 | 41 | 32 | 49 | 26 | 43 | 34 | 51 | 28 | 45 | 36 | 53 | 30 | 47 | 38 | 55 |
| WL1 | 1 | 25 | 13 | 33 | 4 | 27 | 16 | 35 | 7 | 29 | 19 | 37 | 10 | 31 | 22 | 39 |
| WL0 | 0 | 2 | 12 | 14 | 3 | 5 | 15 | 17 | 6 | 8 | 18 | 20 | 9 | 11 | 21 | 23 |

F I G. 30

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 52 | 60 | 116 | 124 | 54 | 61 | 118 | 125 | 56 | 62 | 120 | 126 | 58 | 63 | 122 | 127 |
| WL6 | 44 | 53 | 108 | 117 | 46 | 55 | 110 | 119 | 48 | 57 | 112 | 121 | 50 | 59 | 114 | 123 |
| WL5 | 36 | 45 | 100 | 109 | 38 | 47 | 102 | 111 | 40 | 49 | 104 | 113 | 42 | 51 | 106 | 115 |
| WL4 | 28 | 37 | 92 | 101 | 30 | 39 | 94 | 103 | 32 | 41 | 96 | 105 | 34 | 43 | 98 | 107 |
| WL3 | 20 | 29 | 84 | 93 | 22 | 31 | 86 | 95 | 24 | 33 | 88 | 97 | 26 | 35 | 90 | 99 |
| WL2 | 12 | 21 | 76 | 85 | 14 | 23 | 78 | 87 | 16 | 25 | 80 | 89 | 18 | 27 | 82 | 91 |
| WL1 | 1 | 13 | 65 | 77 | 4 | 15 | 68 | 79 | 7 | 17 | 71 | 81 | 10 | 19 | 74 | 83 |
| WL0 | 0 | 2 | 64 | 66 | 3 | 5 | 67 | 69 | 6 | 8 | 70 | 72 | 9 | 11 | 73 | 75 |

FIG. 31

|     | SU0 | | SU1 | | SU2 | | SU3 | | SU4 | | SU5 | | SU6 | | SU7 | |
|-----|-----|-----|-----|-----|-----|-----|-----|-----|-----|-----|-----|-----|-----|-----|-----|-----|
|     | 1st | 2nd | 1st | 2nd | 1st | 2nd | 1st | 2nd | 1st | 2nd | 1st | 2nd | 1st | 2nd | 1st | 2nd |
| WL7 | 104 | 120 | 106 | 121 | 108 | 122 | 110 | 123 | 112 | 124 | 114 | 125 | 116 | 126 | 118 | 127 |
| WL6 | 88  | 105 | 90  | 107 | 92  | 109 | 94  | 111 | 96  | 113 | 98  | 115 | 100 | 117 | 102 | 119 |
| WL5 | 72  | 89  | 74  | 91  | 76  | 93  | 78  | 95  | 80  | 97  | 82  | 99  | 84  | 101 | 86  | 103 |
| WL4 | 56  | 73  | 58  | 75  | 60  | 77  | 62  | 79  | 64  | 81  | 66  | 83  | 68  | 85  | 70  | 87  |
| WL3 | 40  | 57  | 42  | 59  | 44  | 61  | 46  | 63  | 48  | 65  | 50  | 67  | 52  | 69  | 54  | 71  |
| WL2 | 24  | 41  | 26  | 43  | 28  | 45  | 30  | 47  | 32  | 49  | 34  | 51  | 36  | 53  | 38  | 55  |
| WL1 | 8   | 25  | 10  | 27  | 12  | 29  | 14  | 31  | 16  | 33  | 18  | 35  | 20  | 37  | 22  | 39  |
| WL0 | 0   | 9   | 1   | 11  | 2   | 13  | 3   | 15  | 4   | 17  | 5   | 19  | 6   | 21  | 7   | 23  |

F I G. 32

| | SU0 | | SU1 | | SU2 | | SU3 | | SU4 | | SU5 | | SU6 | | SU7 | |
|---|---|---|---|---|---|---|---|---|---|---|---|---|---|---|---|---|
| | 1st | 2nd | 1st | 2nd | 1st | 2nd | 1st | 2nd | 1st | 2nd | 1st | 2nd | 1st | 2nd | 1st | 2nd |
| WL7 | 104 | 120 | 112 | 124 | 106 | 121 | 114 | 125 | 108 | 122 | 116 | 126 | 110 | 123 | 118 | 127 |
| WL6 | 88 | 105 | 96 | 113 | 90 | 107 | 98 | 115 | 92 | 109 | 100 | 117 | 94 | 111 | 102 | 119 |
| WL5 | 72 | 89 | 80 | 97 | 74 | 91 | 82 | 99 | 76 | 93 | 84 | 101 | 78 | 95 | 86 | 103 |
| WL4 | 56 | 73 | 64 | 81 | 58 | 75 | 66 | 83 | 60 | 77 | 68 | 85 | 62 | 79 | 70 | 87 |
| WL3 | 40 | 57 | 48 | 65 | 42 | 59 | 50 | 67 | 44 | 61 | 52 | 69 | 46 | 63 | 54 | 71 |
| WL2 | 24 | 41 | 32 | 49 | 26 | 43 | 34 | 51 | 28 | 45 | 36 | 53 | 30 | 47 | 38 | 55 |
| WL1 | 8 | 25 | 16 | 33 | 10 | 27 | 18 | 35 | 12 | 29 | 20 | 37 | 14 | 31 | 22 | 39 |
| WL0 | 0 | 9 | 4 | 17 | 1 | 11 | 5 | 19 | 2 | 13 | 6 | 21 | 3 | 15 | 7 | 23 |

F I G. 33

|  | SU0 | | SU1 | | SU2 | | SU3 | | SU4 | | SU5 | | SU6 | | SU7 | |
|---|---|---|---|---|---|---|---|---|---|---|---|---|---|---|---|---|
|  | 1st | 2nd | 1st | 2nd | 1st | 2nd | 1st | 2nd | 1st | 2nd | 1st | 2nd | 1st | 2nd | 1st | 2nd |
| WL7 | 52 | 60 | 116 | 124 | 54 | 61 | 118 | 125 | 56 | 62 | 120 | 126 | 58 | 63 | 122 | 127 |
| WL6 | 44 | 53 | 108 | 117 | 46 | 55 | 110 | 119 | 48 | 57 | 112 | 121 | 50 | 59 | 114 | 123 |
| WL5 | 36 | 45 | 100 | 109 | 38 | 47 | 102 | 111 | 40 | 49 | 104 | 113 | 42 | 51 | 106 | 115 |
| WL4 | 28 | 37 | 92 | 101 | 30 | 39 | 94 | 103 | 32 | 41 | 96 | 105 | 34 | 43 | 98 | 107 |
| WL3 | 20 | 29 | 84 | 93 | 22 | 31 | 86 | 95 | 24 | 33 | 88 | 97 | 26 | 35 | 90 | 99 |
| WL2 | 12 | 21 | 76 | 85 | 14 | 23 | 78 | 87 | 16 | 25 | 80 | 89 | 18 | 27 | 82 | 91 |
| WL1 | 4 | 13 | 68 | 77 | 6 | 15 | 70 | 79 | 8 | 17 | 72 | 81 | 10 | 19 | 74 | 83 |
| WL0 | 0 | 5 | 64 | 69 | 1 | 7 | 65 | 71 | 2 | 9 | 66 | 73 | 3 | 11 | 67 | 75 |

F I G. 34

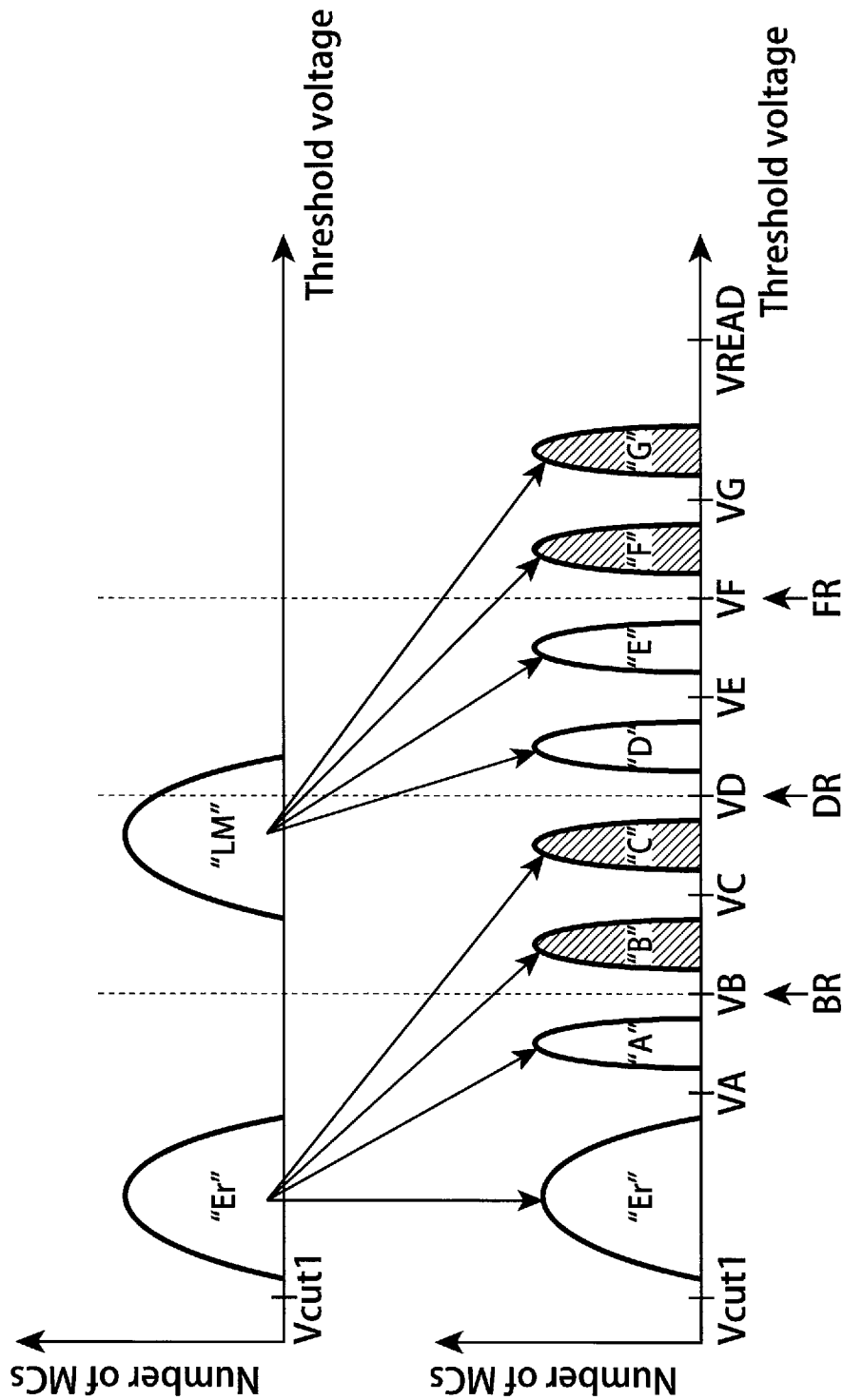
F I G. 35

| WL(i+1) \ Backside cell | "Er"/"A"/"D"/"E" | "B"/"C"/"F"/"G" |
|---|---|---|
| "Er"/"A"/"B"/"C" | Small<br>•VCGLA_A1(≒VA)<br>•VCGLA_B1(≒VB)<br>•VCGLA_C1(≒VC)<br>•VCGLA_D1(≒VD)<br>•VCGLA_E1(≒VE)<br>•VCGLA_F1(≒VF)<br>•VCGLA_G1(≒VG) | Medium<br>•VCGLA_A2<br>•VCGLA_B2<br>•VCGLA_C2<br>•VCGLA_D2<br>•VCGLA_E2<br>•VCGLA_F2<br>•VCGLA_G2 |
| "D"/"E"/"F"/"G" | Medium<br>•VCGLA_A3<br>•VCGLA_B3<br>•VCGLA_C3<br>•VCGLA_D3<br>•VCGLA_E3<br>•VCGLA_F3<br>•VCGLA_G3 | Large<br>•VCGLA_A4<br>•VCGLA_B4<br>•VCGLA_C4<br>•VCGLA_D4<br>•VCGLA_E4<br>•VCGLA_F4<br>•VCGLA_G4 |

F I G. 36A

| WL(i+1)<br>Backside cell | "Er"/"A"/"D"/"E" | "B"/"C"/"F"/"G" |
|---|---|---|
| "Er"/"A"/"D"/"E" | Small<br>・VCGLA_A1(≒VA)<br>・VCGLA_B1(≒VB)<br>・VCGLA_C1(≒VC)<br>・VCGLA_D1(≒VD)<br>・VCGLA_E1(≒VE)<br>・VCGLA_F1(≒VF)<br>・VCGLA_G1(≒VG) | Medium<br>・VCGLA_A2<br>・VCGLA_B2<br>・VCGLA_C2<br>・VCGLA_D2<br>・VCGLA_E2<br>・VCGLA_F2<br>・VCGLA_G2 |
| "B"/"C"/"F"/"G" | Medium<br>・VCGLA_A3<br>・VCGLA_B3<br>・VCGLA_C3<br>・VCGLA_D3<br>・VCGLA_E3<br>・VCGLA_F3<br>・VCGLA_G3 | Large<br>・VCGLA_A4<br>・VCGLA_B4<br>・VCGLA_C4<br>・VCGLA_D4<br>・VCGLA_E4<br>・VCGLA_F4<br>・VCGLA_G4 |

FIG. 36B

| WL(i+1) / Backside cell | "Er"/"B" | "A"/"C" |
|---|---|---|
| "Er"/"A" | Small<br>·VCGLA_A1(≒VA)<br>·VCGLA_B1(≒VB)<br>·VCGLA_C1(≒VC) | Medium<br>·VCGLA_A2<br>·VCGLA_B2<br>·VCGLA_C2 |
| "B"/"C" | Medium<br>·VCGLA_A3<br>·VCGLA_B3<br>·VCGLA_C3 | Large<br>·VCGLA_A4<br>·VCGLA_B4<br>·VCGLA_C4 |

F I G. 39A

| WL(i+1) / Backside cell | "Er"/"B" | "A"/"C" |
|---|---|---|
| "Er"/"B" | Small<br>•VCGLA_A1(≒VA)<br>•VCGLA_B1(≒VB)<br>•VCGLA_C1(≒VC) | Medium<br>•VCGLA_A2<br>•VCGLA_B2<br>•VCGLA_C2 |
| "A"/"C" | Medium<br>•VCGLA_A3<br>•VCGLA_B3<br>•VCGLA_C3 | Large<br>•VCGLA_A4<br>•VCGLA_B4<br>•VCGLA_C4 |

F I G. 39B

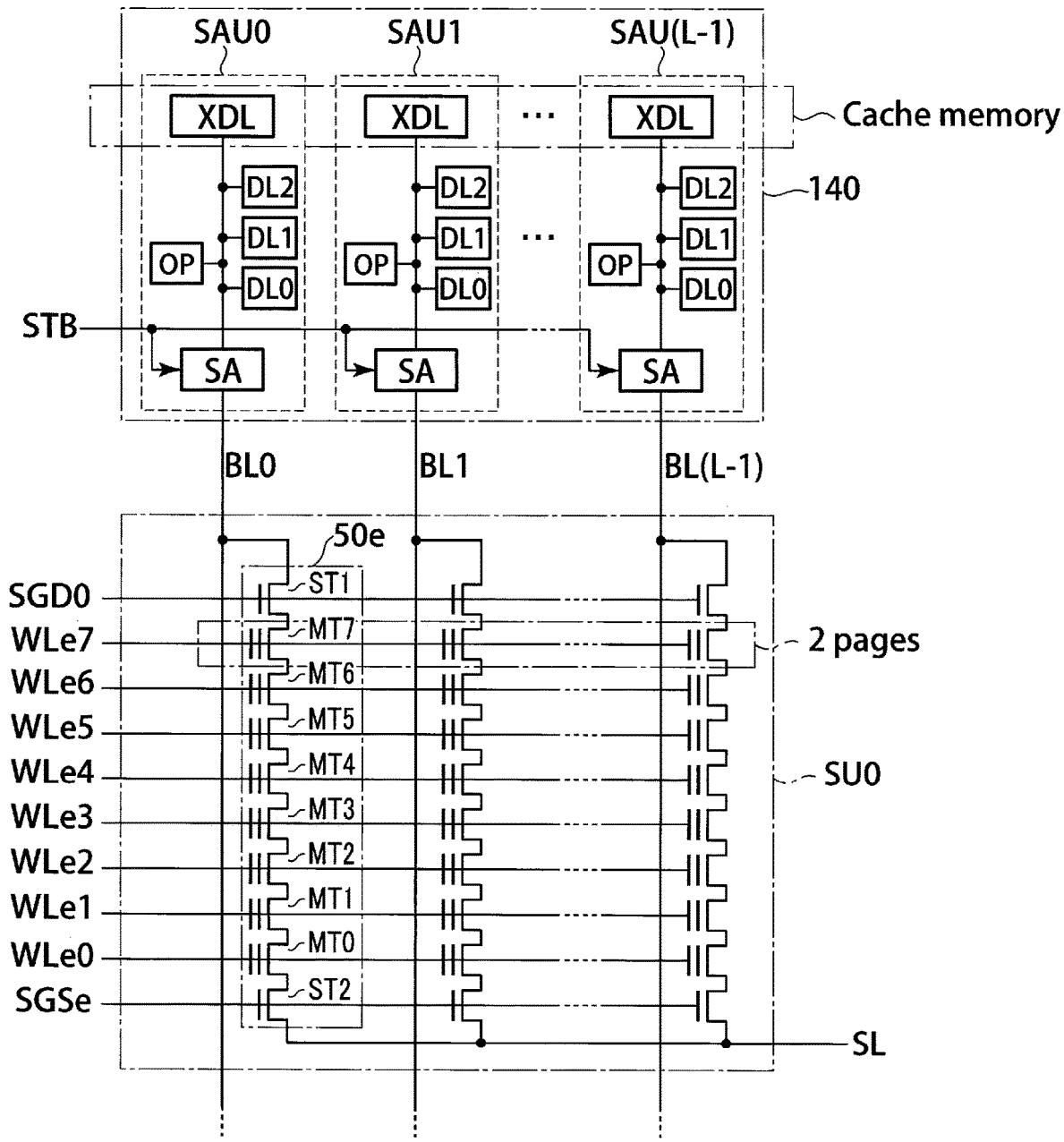
F I G. 41

| Bit line | | BL(4j) | CASE I | CASE II | CASE III | CASE IV | CASE V | CASE VI | CASE VII | CASE VIII |
|---|---|---|---|---|---|---|---|---|---|---|
| | SU2:WLi | Er/A/B/C | BL(4j+1) Er/A/B/C | BL(4j+1) Er/A/B/C | BL(4j+1) Er/A/B/C | BL(4j+1) Er/A/B/C | BL(4j+1) Er/A/B/C | BL(4j+1) Er/A/B/C | BL(4j+1) Er/A/B/C | BL(4j+1) Er/A/B/C |
| | SU3:WLi | | BL(4j+2) Er | BL(4j+2) Erh | BL(4j+2) A | BL(4j+2) Ah | BL(4j+2) B | BL(4j+2) Bh | BL(4j+2) C | BL(4j+2) Ch |
| | SU4:WLi | Er/A/B/C | BL(4j+3) Er/A | BL(4j+3) B/C | BL(4j+3) Er/A | BL(4j+3) B/C | BL(4j+3) Er/A | BL(4j+3) B/C | BL(4j+3) Er/A | BL(4j+3) B/C |
| Operation | Latch circuit | | | | | | | | | |
| BR: SU4,WLi | SA | 0/0/1/1 | 0 | | 0 | | 0 | | 0 | |
| SA→DL0 | DL0 | 0/0/1/1 | 0 | 1 | 0 | 1 | 0 | 1 | 0 | 1 |
| BL(4j)→"L" | DL0 | 0 | 0 | 1 | 1 | 1 | 1 | 1 | 1 | 1 |
| ARL: SU3,WLi | SA | 0 | 0 | 0/1 | 0 | 0 | 1 | 0 | 1 | 0 |
| ~SA&~DL0→XDL | XDL | 1 | 1 | 0 | 0 | 0 | 1 | 0 | 1 | 0 |
| ARH: SU3,WLi | SA | 0 | 0 | 1 | 0/1 | 1 | 0 | 1 | 1 | 1 |
| ~SA&DL0|XDL→XDL | XDL | 1 | 1 | 0 | 0 | 0 | 0 | 0/1 | 1 | 0 |
| CRL: SU3,WLi | SA | 0 | 0 | 1 | 0 | 0 | 0 | 0 | 1 | 1 |
| SA&~DL0|XDL→XDL | XDL | 1 | 1 | 0 | 0 | 0 | 0 | 0 | 0/1 | 0 |
| CRH: SU3,WLi | SA | 0 | 0 | 0 | 0 | 0 | 0 | 0 | 1 | 1 |
| SA&DL0|XDL→XDL | XDL | 1 | 1 | 1 | 0 | 0 | 0 | 0 | 1 | 1 |

F I G. 43

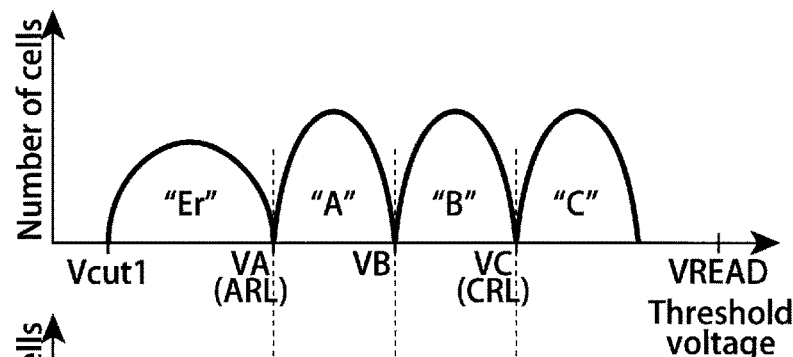
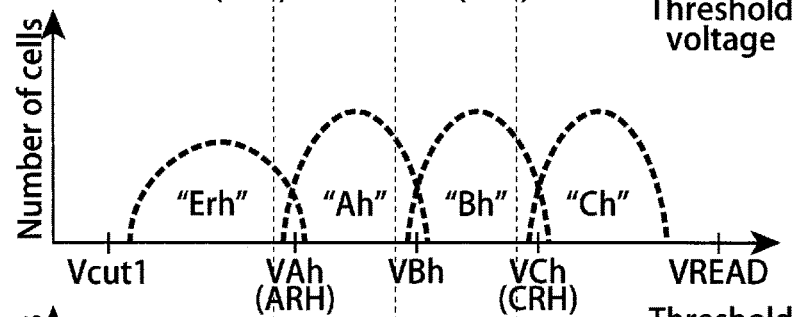
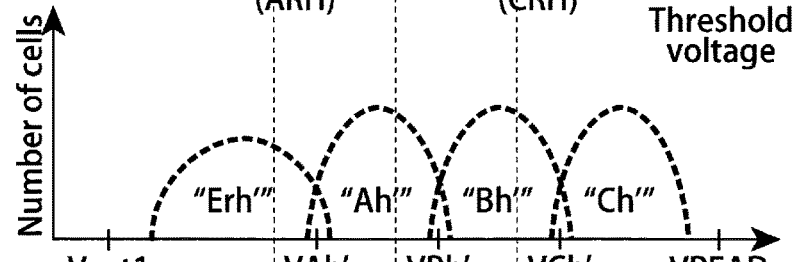
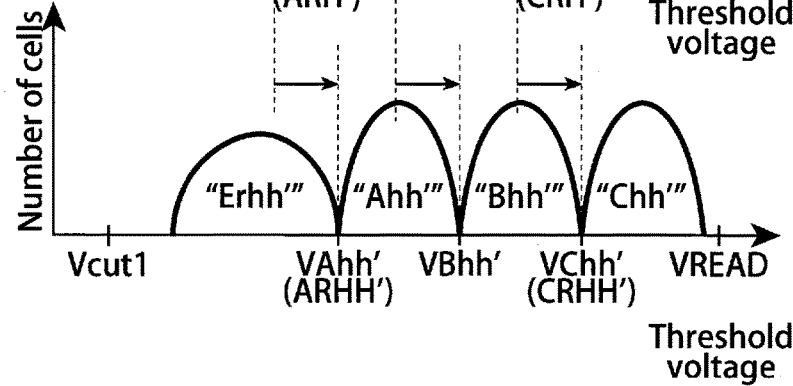
FIG. 44

FIG. 45

| Bit line | SU5:WLi | BL(4j) | BL(4j) | CASE I BL(4j+1) BL(4j+2) BL(4j+3) | CASE II BL(4j+1) BL(4j+2) BL(4j+3) | CASE III BL(4j+1) BL(4j+2) BL(4j+3) | CASE IV BL(4j+1) BL(4j+2) BL(4j+3) | CASE V BL(4j+1) BL(4j+2) BL(4j+3) | CASE VI BL(4j+1) BL(4j+2) BL(4j+3) | CASE VII BL(4j+1) BL(4j+2) BL(4j+3) | CASE VIII BL(4j+1) BL(4j+2) BL(4j+3) |
|---|---|---|---|---|---|---|---|---|---|---|---|
| | SU4:WLi | Er/A | B/C | Er/A/B/C | Er/A/B/C | Er/A/B/C | Er/A/B/C | Er/A/B/C | Er/A/B/C | Er/A/B/C | Er/A/B/C |
| | SU3:WLi | Er | Erh | Er | Erh | A | Ah | B | Bh | C | Ch |
| Operation | Latch circuit | Er/A/B/C | Er/A/B/C | Er/A | B/C | Er/A | B/C | Er/A | B/C | Er/A | B/C |
| BR:SU3,WLi | SA | 0 | 1 | 0/0/1/1 | 0/0/1/1 | 0/0/1/1 | 0/0/1/1 | 0/0/1/1 | 0/0/1/1 | 0/0/1/1 | 0/0/1/1 |
| SA→DL0 | DL0 | 0 | 1 | 0 | 0 | 0 | 0 | 0 | 0 | 0 | 0 |
| BL(4j+1)/+2/+3→"L" | DL0 | 0 | 1 | 0 | 0 | 0 | 0 | 0 | 0 | 0 | 0 |
| BR:SU3,WLi | SA | 0/0/1/1 | 0/0/1/1 | 0 | 0 | 0 | 0 | 0 | 0 | 0 | 0 |
| SA→DL1 | DL1 | 0/0/1/1 | 0/0/1/1 | 0 | 0 | 0 | 0 | 0 | 0 | 0 | 0 |
| BL(4j)→"L" | DL1 | 0 | 0 | 0 | 0 | 0 | 0 | 0 | 0 | 0 | 0 |
| DL0|DL1→DL0 | DL0 | 0 | 1 | 0 | 1 | 0 | 1 | 0 | 1 | 0 | 1 |
| ARL:SU4,WLi | SA | 0 | 0/1 | 0 | 0/1 | 1 | 1 | 1 | 1 | 1 | 1 |
| ~SA&~DL0→XDL | XDL | 1 | 0 | 1 | 0 | 0 | 0 | 0 | 0 | 0 | 0 |
| ARH:SU4,WLi | SA | 0 | 1 | 0 | 1 | 1 | 1 | 1 | 1 | 1 | 1 |
| ~SA&DL0|XDL→XDL | XDL | 1 | 0 | 1 | 0 | 0 | 0 | 0 | 0/1 | 0 | 1 |
| CRL:SU4,WLi | SA | 0 | 1 | 0 | 1 | 0 | 1 | 0 | 0 | 0 | 0 |
| SA&~DL0|XDL→XDL | XDL | 1 | 0 | 1 | 0 | 1 | 0 | 1 | 0 | 0/1 | 0 |
| CRH:SU4,WLi | SA | 0 | 1 | 0 | 1 | 0 | 1 | 0 | 0 | 0 | 0 |
| SA&DL0|XDL→XDL | XDL | 1 | 1 | 1 | 1 | 0 | 0 | 0 | 0 | 1 | 1 |

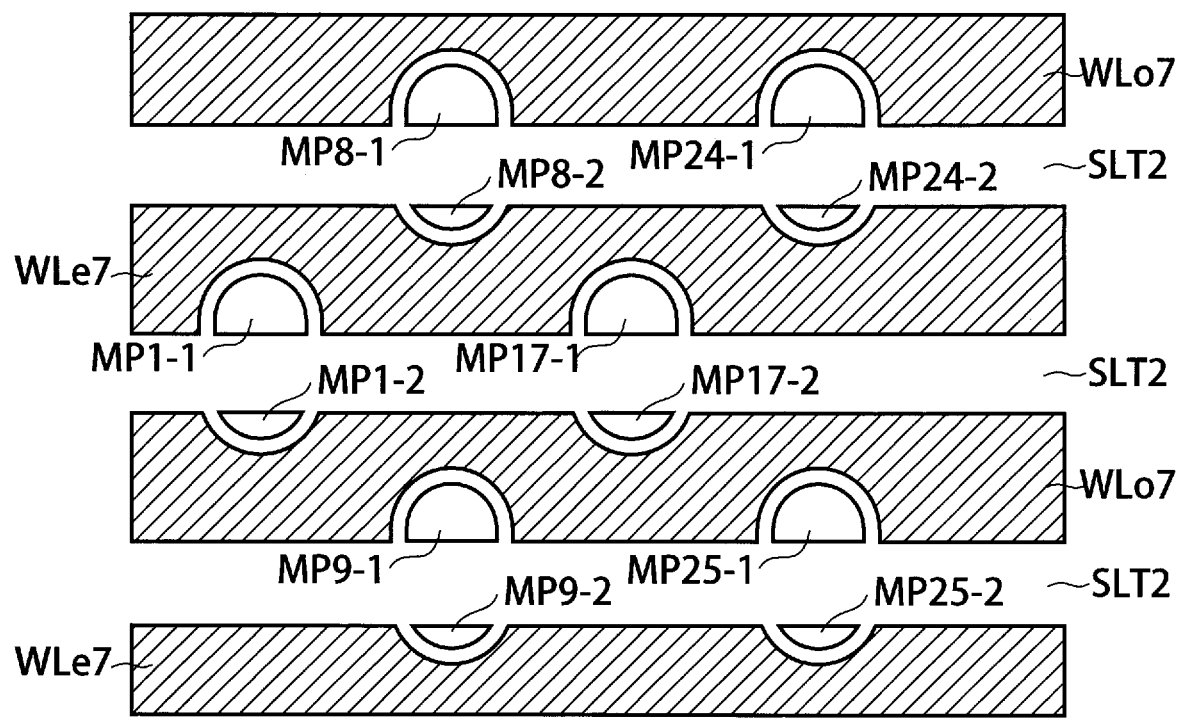
F I G. 48

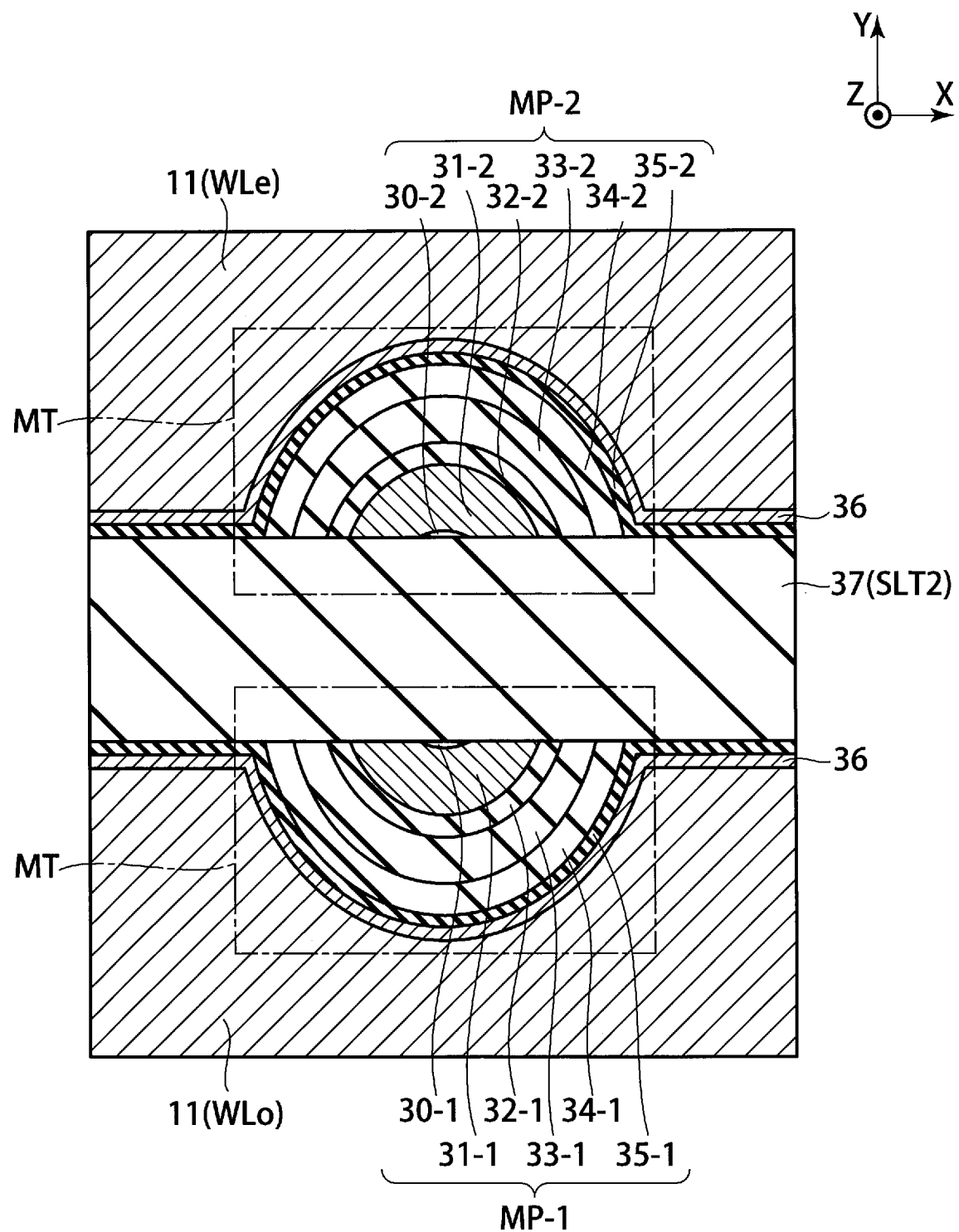
F I G. 49

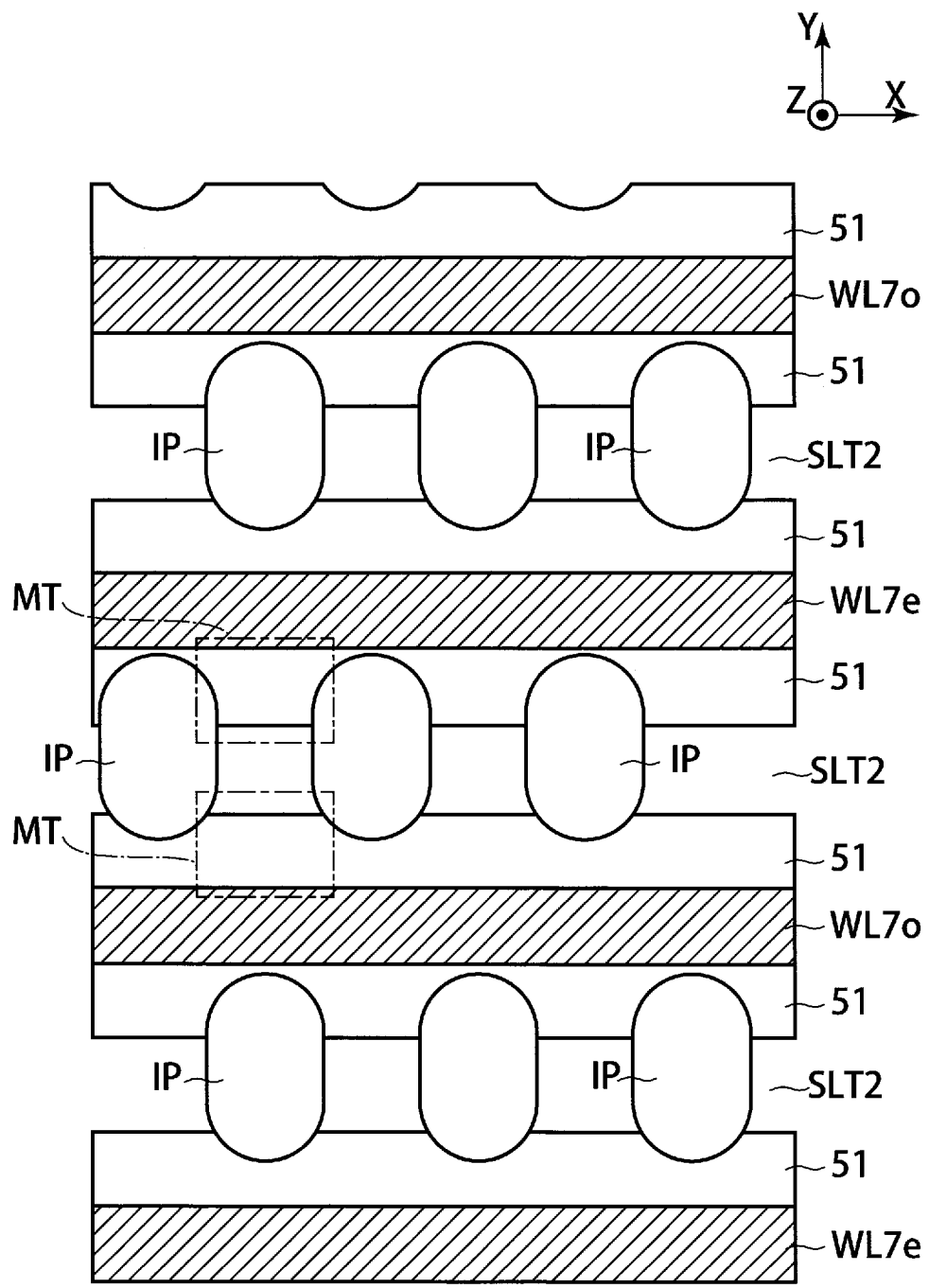
F I G. 50

SEMICONDUCTOR MEMORY DEVICE

CROSS-REFERENCE TO RELATED APPLICATIONS

This application is based upon and claims the benefit of priority from Japanese Patent Application No. 2019-032875, filed Feb. 26, 2019, the entire contents of which are incorporated herein by reference.

FIELD

Embodiments described herein relate generally to a semiconductor memory device.

BACKGROUND

A semiconductor memory having three-dimensionally arranged memory cells is known.

BRIEF DESCRIPTION OF THE DRAWINGS

FIG. 1 is a block diagram of a memory system according to a first embodiment;

FIG. 6 and FIG. 7 each are a cross section of a memory cell transistor according to the first embodiment;

FIG. 8 is an equivalent circuit diagram for a memory pillar according to the first embodiment;

FIG. 9 is a conceptual diagram showing data in a memory cell and threshold distributions according to the first embodiment;

FIG. 10 is a diagram showing an order of data writing according to the first embodiment;

FIG. 11 and FIG. 12 each are a timing chart showing changes in voltage on respective interconnects in a read operation according to the first embodiment;

FIG. 13 is a diagram showing string units targeted for prior-reading in the read operation according to the first embodiment;

FIG. 15 is a diagram showing string units targeted for prior-reading in a read operation according to the second embodiment;

FIG. 18B is a diagram showing read voltages for the read operation according to the third embodiment;

FIG. 20 and FIG. 21 each are a diagram showing threshold transitions of memory cells in a data write operation according to the fourth embodiment;

FIG. 22 is a diagram showing an order of data writing according to the fourth embodiment;

FIG. 24 to FIG. 31 are diagrams showing first to eighth examples of an order of data writing according to a fifth embodiment, respectively;

FIG. 32 is a diagram showing an order of data writing according to a sixth embodiment;

FIG. 33 and FIG. 34 each are a diagram showing an order of data writing according to a certain modification given in the sixth embodiment;

FIG. 35 includes graphs showing threshold transitions appearing in a data write method related to a certain example of a seventh embodiment;

FIG. 36A and FIG. 36B show read voltages used according to data held in a backside cell and a drain-side neighboring memory cell according to an example of the data write method of the seventh embodiment;

FIG. 39A and FIG. 39B show read voltages used according to data held in a backside cell and a drain-side neighboring memory cell according to another example of the data write method of the seventh embodiment;

FIG. 41 is a circuit diagram of a sense amplifier according to an eighth embodiment;

FIG. 43 is a diagram showing operations within the sense amplifier according to the eighth embodiment;

FIG. 44 includes graphs showing threshold distributions of memory cells before and after undergoing inter-cell interference effects in a second example of the eighth embodiment;

FIG. 45 to FIG. 47 are a diagram showing operations within the sense amplifier according to the eighth embodiment;

FIG. 48 and FIG. 49 are a cross section of memory cell transistors according to a first modification of the first to eighth embodiments; and FIG. 50 and FIG. 51 are a cross section of memory cell transistors according to a second modification of the first to eighth embodiments.

DETAILED DESCRIPTION

Figure 2:
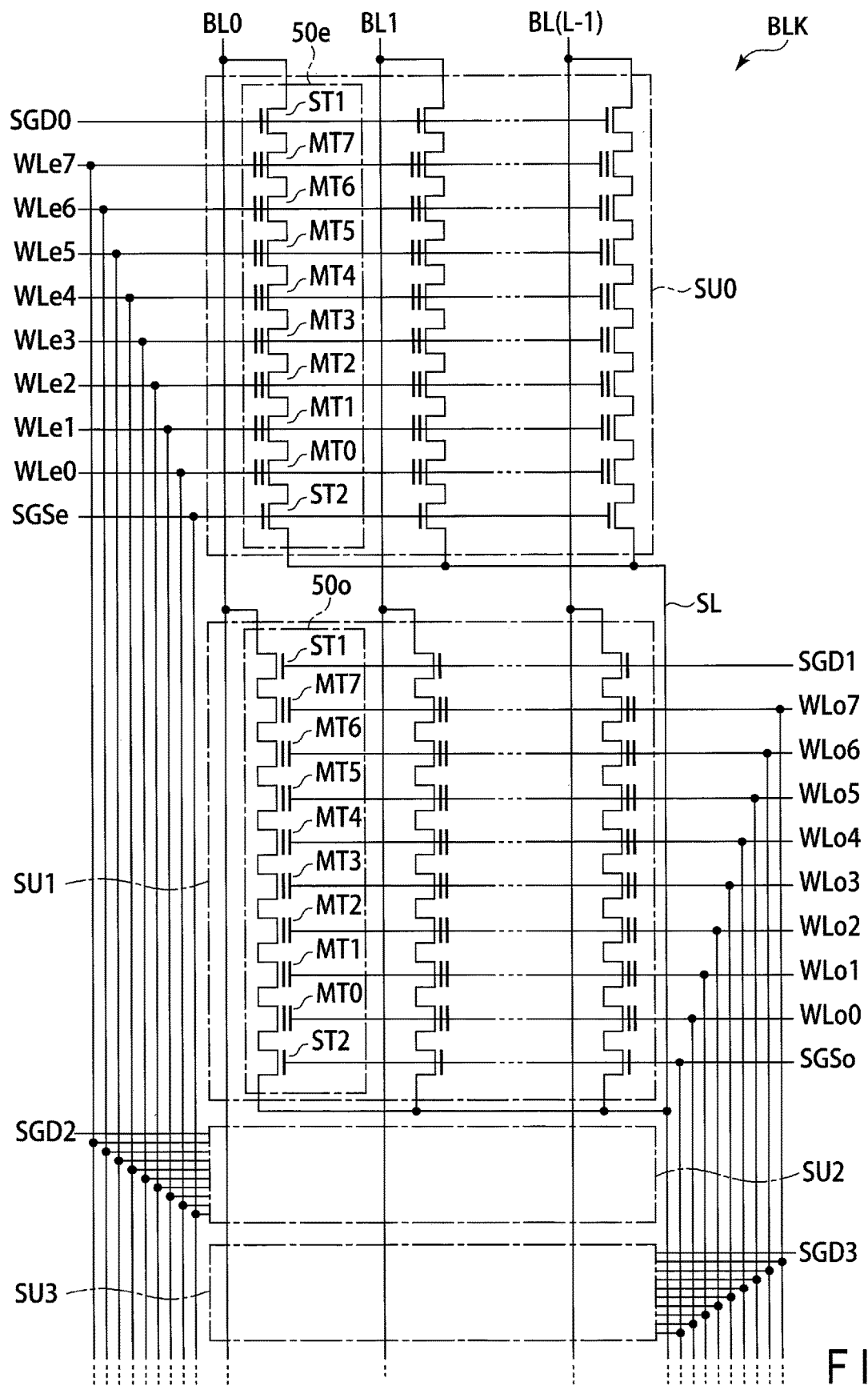
FIG. 2 is a circuit diagram of a memory cell array according to the first embodiment.

In general, according to one embodiment, a semiconductor memory device includes: a first memory cell; a second memory cell; a first word line coupled to the first memory cell; a second word line coupled to the second memory cell; and a first bit line capable of being electrically coupled to both the first memory cell and the second memory cell. The first memory cell faces the second memory cell with a first semiconductor layer interposed therebetween. The semiconductor memory device is configured to perform a data read operation including a first operation and a second operation. When reading data from the first memory cell, the semiconductor memory device is configured to perform the first operation in which a first voltage is applied to the first word line and a second voltage higher than the first voltage is applied to the second word line, and perform, after the first operation, the second operation in which a third voltage higher than the first voltage and a fourth voltage different from the third voltage are applied to the first word line and a fifth voltage lower than the second to the fourth voltage is applied to the second word line. The first voltage and the fifth voltage turn off a memory cell.

1. First Embodiment

A semiconductor memory device according to the first embodiment will be described. By way of example, a memory system including a NAND flash memory as the semiconductor memory device will be described.

1.1 Configurations

First, description will be given of the configurations for the memory system according to the present embodiment.

1.1.1 Overall Configuration

The description will start with the general, overall configuration of the memory system according to the embodiment, referring to FIG. 1.

FIG. 1 shows a memory system 1 including a NAND flash memory 100 and a controller 200. For example, the NAND flash memory 100 and the controller 200 may be combined together to constitute a single semiconductor device, and such a single semiconductor device may be a memory card (e.g., an SD™ card), a solid state drive (SSD), and so on. The controller 200 may be provided as, for example, a system on chip (SoC).

The NAND flash memory 100 includes a plurality of memory cells and stores data in a non-volatile manner. The controller 200 is connected to the NAND flash memory 100 via a NAND bus, as well as to a host device 300 via a host bus. The controller 200 controls the NAND flash memory 100, and accesses the NAND flash memory 100 according to instructions from the host device 300. Examples of the host device 300 include a digital camera, a personal computer, etc., and a bus complying with, for example, the SD™ interface specifications may be adopted as the host bus. The NAND bus allows for signal transmission and reception in compliance with the NAND interface specifications.

1.1.2 Configuration of Controller 200

Referring to FIG. 1, the configuration of the controller 200 will be described in detail. The controller 200 includes, as shown in FIG. 1, a host interface circuit 210, an embedded memory (RAM) 220, a processor (CPU) 230, a buffer memory 240, a NAND interface circuit 250, and an error checking and correcting (ECC) circuit 260.

The host interface circuit 210 is connected to the host device 300 via the host bus, and transfers instructions and data from the host device 300 to the processor 230 and the buffer memory 240, respectively. Also, the host interface circuit 210 transfers data in the buffer memory 240 to the host device 300, according to instructions by the processor 230.

The processor 230 takes total control over the operations of the controller 200. For example, the processor 230 issues a write command for the NAND interface circuit 250, upon receipt of a write instruction from the host device 300. Write and erase operations may also proceed in this manner. The processor 230 also performs a variety of processing, such as wear leveling, for managing the NAND flash memory 100. Note that the following operations of the controller 200 may be implemented by the processor 230 executing software (firmware), or may be implemented by hardware.

The NAND interface circuit 250 is connected to the NAND flash memory 100 via the NAND bus, and controls communications with the NAND flash memory 100. The NAND interface circuit 250 transmits various signals to the NAND flash memory 100 and receive various signals from the NAND flash memory 100, based on the commands from the processor 230.

The buffer memory 240 temporarily holds write data and read data.

The embedded memory 220 may be, for example, a semiconductor memory such as a DRAM or an SRAM, provided for use as a workspace for the processor 230. The memory 220 stores firmware, various management tables, etc., for managing the NAND flash memory 100.

The ECC circuit 260 performs error detection and correction processes for data stored in the NAND flash memory 100. That is, the ECC circuit 260 generates an error-correcting code and applies the generated code to the write data at the write operation, and decodes the error-correcting code at the read operation.

1.1.3 Configuration of NAND Flash Memory 100

1.1.3.1 Overall Configuration of NAND Flash Memory 100

Next, the configuration of the NAND flash memory 100 will be described. As shown in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes blocks BLKs each including a plurality of nonvolatile memory cells associated with rows and columns. The memory cell array 110 stores data from the controller 200.

The row decoder 120 selects any of the blocks BLKs, and further selects one or more rows in the selected block BLK.

The driver circuit 130 supplies voltage to the selected block BLK via the row decoder 120.

The sense amplifier 140, during data reading and read verifying, senses data read from the memory cell array 110, executes the necessary operations for the read data, and outputs the data DAT to the controller 200. In data writing, the sense amplifier 140 transfers write data DAT received from the controller 200 to the memory cell array 110.

The address register 150 holds an address ADD received from the controller 200. The command register 160 holds a command CMD received from the controller 200.

The sequencer 170 controls the operation of the entire NAND flash memory 100 based on the command CMD held in the command registers 150 and 160.

1.1.3.2 Configuration of Memory Cell Array 110

Next, the configuration of the memory cell array 110 according to the present embodiment will be described.

<Circuit Configuration>

First, the circuit configuration of the memory cell array 110 will be explained with reference to FIG. 2. FIG. 2 shows an equivalent circuit of one of the blocks BLK. As illustrated in FIG. 2, the block BLK includes a plurality of string units SU (SU0, SU1, SU2, . . . ), and each string unit SU includes a plurality of NAND strings 50.

Hereinafter, to differentiate the NAND strings of the string units with even numbers (even string units) SUe (SU0, SU2, SU4, ...) from the NAND strings of the string units with odd numbers (odd string units) SUo (SU1, SU3, SU5, ...), they will be collectively referred to as NAND strings 50e and NAND strings 50o, respectively.

Each of the NAND strings 50 may include eight memory cell transistors MT (MT0 to MT7) and selection transistors ST1 and ST2. Each memory cell transistor MT includes a control gate and a charge accumulation layer, and holds data in a non-volatile manner. The eight memory cell transistors MT are coupled in series between the source of the selection transistor ST1 and the drain of the selection transistor ST2.

The gates of the selection transistors ST1 in each string unit SU are coupled to a single selection gate line SGD (SGD0, SGD1, ...). Each of the selection gate lines SGD is independently controlled by the row decoder 120. The gates of the selection transistors ST2 in each of the even string units SUe (SU0, SU2, ...) may be commonly coupled to the selection gate line SGSe, and the gates of the selection transistors ST2 in each of the odd string units SUo (SU1, SU3, ...) may be commonly coupled to the selection gate line SGSo. The selection gate lines SGSe and SGSo may be controlled either commonly or independently.

The control gates of the memory cell transistors MT (MT0 to MT7) included in the even string units SUe of the same block BLK are commonly coupled to the corresponding word lines WLe (WLe0 to WLe7), respectively. The control gates of the memory cell transistors MT (MT0 to MT7) included in the odd string unit SUo are commonly coupled to the corresponding word lines WLo (WLo0 to WLo7), respectively. The word lines WLe and the word lines WLo are independently controlled by the row decoder 120.

A block BLK may be a minimum size unit for data erasing. In other words, the data stored in all the memory cell transistors MT in the same block BLK is erased at a time. However, the data may be erased in every string unit SU, or in units smaller than a string unit SU.

In the memory cell array 110, the drains of the selection transistors ST1 of the NAND strings 50 in the same column are commonly coupled to the same bit line BL (BL0 to BL(L−1), where L is a natural number larger than or equal to 2). That is, a bit line BL is commonly coupled to the NAND strings 50e and 50o in the same column across different string units SU. The sources of a plurality of the selection transistors ST2 are commonly coupled to a source line SL.

As such, each string unit SU includes a plurality of NAND strings 50 that are coupled to their respective bit lines BL and to the same selection gate line SGD. Each block BLK includes a plurality of string units SU that share the word lines WL. A memory cell array 110 includes a plurality of blocks BLK that share bit lines BL. In the memory cell array 110, the memory cell transistors MT and the selection transistors ST1 and ST2 are three-dimensionally stacked by forming the selection gate line SGS, the word lines WL, and the selection gate line SGD in layers above the semiconductor substrate.

<Planar Layout of Memory Cell Array>

Figure 3:
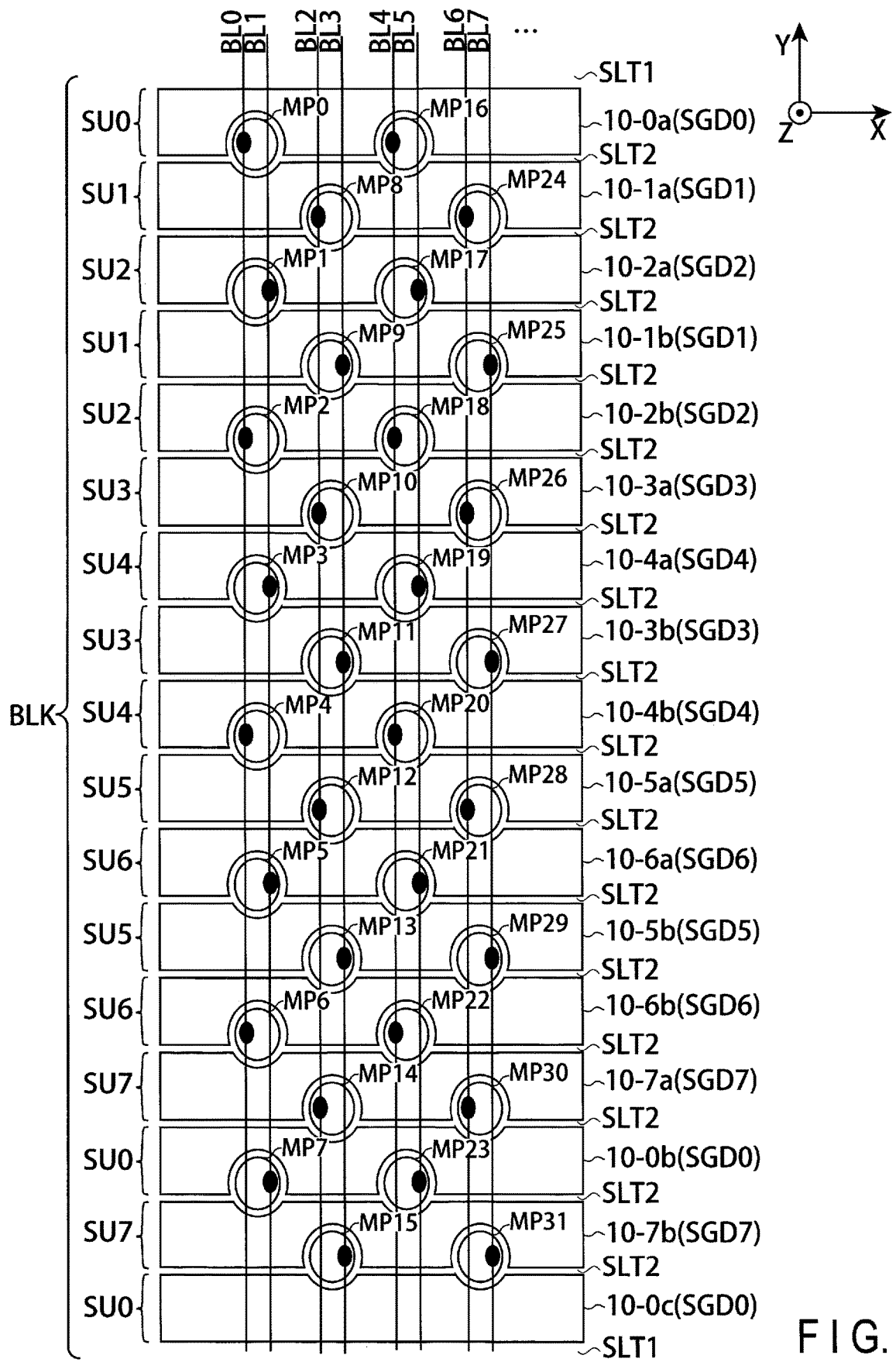
FIG. 3 is a planar layout of selection gate lines according to the first embodiment.

Next, the planar layout of the memory cell array 110 is described. FIG. 3 shows a planar layout of the selection gate lines SGD of a certain block BLK along the plane of the semiconductor substrate (referred to as an "X-Y plane") In this example, one block BLK includes eight selection gate lines SGD (SDG0 to SGD7).

As illustrated in FIG. 3, 17 interconnect layers (conductive layers) 10 (10-0a to 10-7a, 10-0b to 10-7b, and 10-0c) extending along the X direction are arranged in the Y direction orthogonal to the X direction. Each interconnect layers 10 functions as the selection gate line SGD. In the example of FIG. 3, the interconnect layers 10-0a, 10-1a, 10-2a, 10-1b, 10-2b, 10-3a, 10-4a, 10-3b, 10-4b, 10-5a, 10-6a, 10-5b, 10-6b, 10-7a, 10-0b, 10-7b, and 10-0c are arranged in the Y direction. The two interconnect layers 10-0a and 10-0c positioned at the opposite ends of the block BLK in the Y direction, and the interconnect layer 10-0b positioned between the interconnect layers 10-7a and 10-7b are electrically coupled to each other to function as the selection gate line SGD0. Furthermore, the interconnect layers 10-1a and 10-1b are electrically coupled to each other to function as the selection gate line SGD1. The interconnect layers 10-2a and 10-2b are electrically coupled to each other to function as the selection gate line SGD2, and the interconnect layers 10-3a and 10-3b are electrically coupled to each other to function as the selection gate line SGD3. The same arrangement is applied to other interconnect layers for the other selection gate lines SGD4 to SGD7. The interconnect layers 10-4a and 10-4b are electrically coupled to each other to function as the selection gate line SGD4; the interconnect layers 10-5a and 10-5b are electrically coupled to each other to function as the selection gate line SGD5; the interconnect layers 10-6a and 10-6b are electrically coupled to each other to function as the selection gate line SGD6; and the interconnect layers 10-7a and 10-7b are electrically coupled to each other to function as the selection gate line SGD7.

In the block BLK, the interconnect layers 10 that are adjacent to each other in the Y direction are separated by an insulating layer (not shown). The regions in which the insulating layers are located are referred to as slits SLT2. In each slit SLT2, the insulating layer is buried from the surface of the semiconductor substrate to at least the layer where the interconnect layers 10 are arranged. Furthermore, in the memory cell array 110, a plurality of blocks BLK as illustrated in FIG. 3 are arranged in the Y direction. The blocks BLK that are adjacent to each other in the Y direction are also separated by an insulating layer (not shown). The regions in which these insulating layers are located are referred to as slits SLT1.

A plurality of pillars MP (MP0 to MP31) extending along the Z direction are arranged between the interconnect layers 10 that are adjacent to each other in the Y direction. The plurality of pillars are referred to as memory pillars. The Z direction is orthogonal to the X-Y plane, or in other words, vertical to the surface of the semiconductor substrate.

More specifically, there are the memory pillars MP0 and MP16 between the interconnect layers 10-0a and 10-1a, the memory pillars MP8 and MP24 between the interconnect layers 10-1a and 10-2a, the memory pillars MP1 and MP17 between the interconnect layers 10-2a and 10-1b, and the memory pillars MP9 and MP25 between the interconnect layers 10-1b and 10-2b. Also, there are the memory pillars MP2 and MP18 between the interconnect layers 10-2b and 10-3a, the memory pillars MP10 and MP26 between the interconnect layers 10-3a and 10-4a, the memory pillars MP3 and MP19 between the interconnect layers 10-4a and 10-3b, and the memory pillars MP11 and MP27 between the interconnect layers 10-3b and 10-4b. There are the memory pillars MP4 and MP20 between the interconnect layers 10-4b and 10-5a, the memory pillars MP12 and MP28 between the interconnect layers 10-5a and 10-6a, the memory pillars MP5 and MP21 between the interconnect layers 10-6a and 10-5b, and the memory pillars MP13 and MP29 between the interconnect layers 10-5b and 10-6b.

Further, there are the memory pillars MP6 and MP22 between the interconnect layers 10-6b and 10-7a, the memory pillars MP14 and MP30 between the interconnect layers 10-7a and 10-0b, the memory pillars MP7 and MP23 between the interconnect layers 10-0b and 10-7b, and the memory pillars MP15 and MP31 between the interconnect layers 10-7b and 10-0c. Each of the memory pillars MPs is a structure to form the selection transistor ST1, the memory cell transistors MTs, and the selection transistor ST2, which will be discussed in more detail later.

The memory pillars MP0 to MP7 are located along the Y direction. The memory pillars MP16 to MP23 are located along the Y direction side by side with the memory pillars MP0 to MP7 in the X direction. That is, the alignment of the memory pillars MP0 to MP7 is parallel to the alignment of the memory pillars MP16 to MP23.

Similarly, the memory pillars MP8 to MP15 are located along the Y direction, and the memory pillars MP24 to MP31 are also located along the Y direction. The alignment of the memory pillars MP8 to MP15 is positioned between the alignment of the memory pillars MP0 to MP7 and the alignment of the memory pillars MP16 to MP23 with respect to the X direction. The alignment of the memory pillars MP24 to MP31 is positioned in such a manner that the alignment of the memory pillars MP16 to MP23 is interposed between the alignment of the memory pillars MP24 to MP31 and the alignment of the memory pillars MP8 to MP15, with respect to the X direction. The alignment of the memory pillars MP8 to MP15 is positioned parallel to the alignment of the memory pillars MP24 to MP31.

The memory pillars MP0 to MP7 and the memory pillars MP16 to MP23 are arranged to form a staggered pattern together with the memory pillars MP8 to MP15 and the memory pillars MP24 to MP31. In particular, the former memory pillars MP0 to MP7 and MP16 to MP23 are shifted from the latter memory pillars MP8 to MP15 and MP24 to MP31 by one slit interval of the slits SLT2 in the Y direction. In other words, each memory pillar MP is buried between two adjacent conductive layers 10 in the Y direction and in part of the corresponding slit SLT2. Thus, one slit SLT2 is present between any two memory pillars MP that are adjacent to each other in the Y direction. For two adjacent blocks BLK, no memory pillar MP is provided between the conductive layer 10-0a of one block and the conductive layer 10-0c of the other block that face each other across the slit SLT1.

Two bit lines BL are arranged above a certain memory pillar MP. Of the two bit lines BL, only one bit line BL is electrically coupled to that memory pillar MP.

For example, two bit lines BL0 and BL1 are arranged above the memory pillars MP0 to MP7. The bit line BL0 is commonly coupled to the memory pillars MP0, MP2, MP4, and MP6, while the bit line BL1 is commonly coupled to the memory pillars MP1, MP3, MP5, and MP7. Two bit lines BL2 and BL3 are arranged above the memory pillars MP8 to MP15. The bit line BL2 is commonly coupled to the memory pillars MP8, MP10, MP12, and MP14, while the bit line BL3 is commonly coupled to the memory pillars MP9, MP11, MP13, and MP15. Two bit lines BL4 and BL5 are arranged above the memory pillars MP16 to MP23. The bit line BL4 is commonly coupled to the memory pillars MP16, MP18, MP20, and MP22, while the bit line BL5 is commonly coupled to the memory pillars MP17, MP19, MP21, and MP23. Two bit lines BL6 and BL7 are arranged above the memory pillars MP24 to MP31. The bit line BL6 is commonly coupled to the memory pillars MP24, MP26, MP28, and MP30, while the bit line BL7 is commonly coupled to the memory pillars MP25, MP27, MP29, and MP31.

Figure 4:
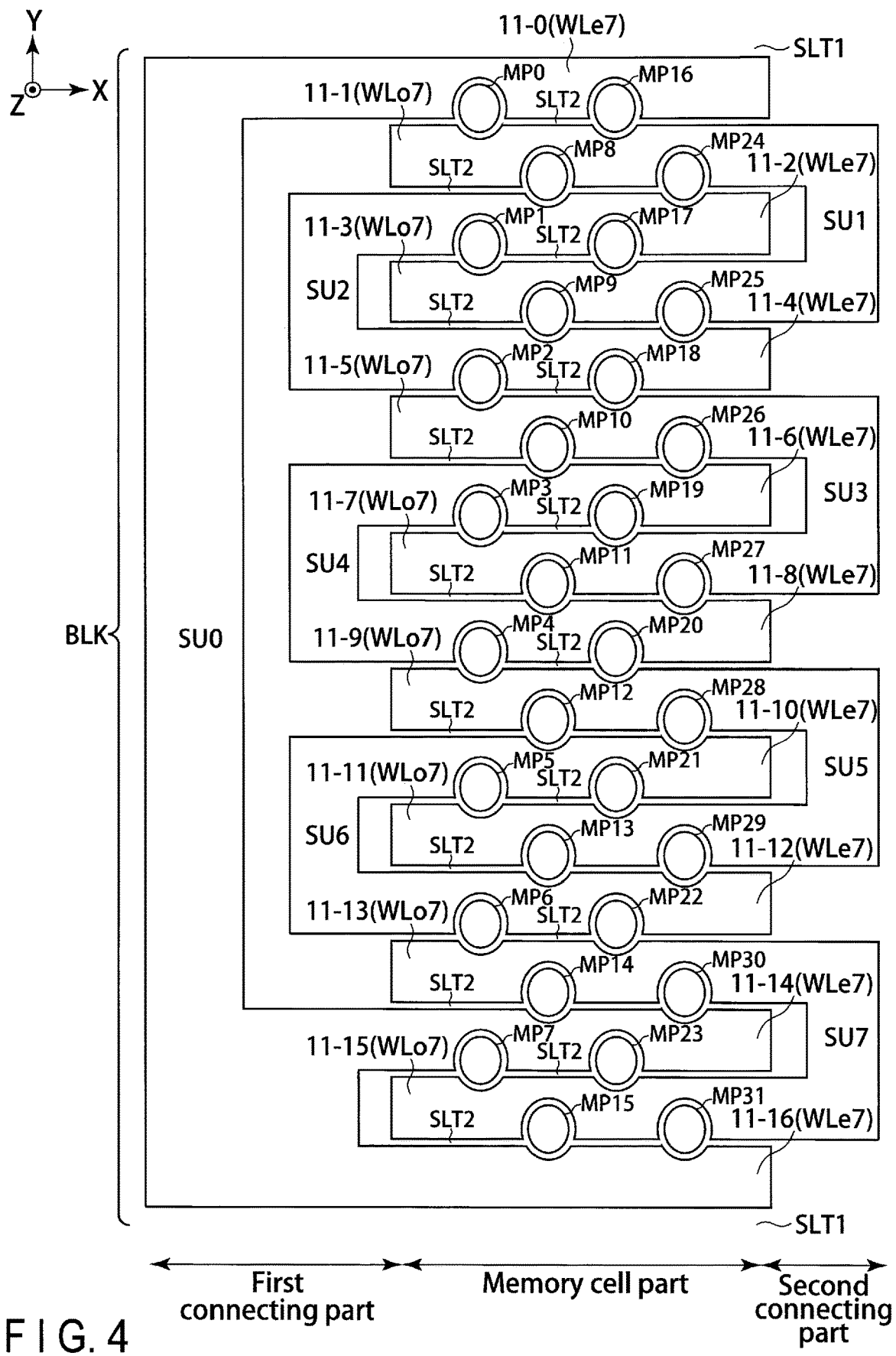
FIG. 4 is a planar layout of word lines according to the first embodiment.

Like FIG. 3, FIG. 4 shows a planar layout of the word lines WL on the X-Y plane. The layout of FIG. 4 corresponds to the one block illustrated in FIG. 3, showing interconnect layers 11 which is arranged below the interconnect layers 10 shown in FIG. 3.

As illustrated in FIG. 4, 17 interconnect layers 11 (11-0 to 11-16) extending along the X direction are arranged in the Y direction. The interconnect layers 11-0 to 11-16 are positioned immediately below the conductive layers 10-0a, 10-1a, 10-2a, 10-1b, 10-2b, 10-3a, 10-4a, 10-3b, 10-4b, 10-5a, 10-6a, 10-5b, 10-6b, 10-7a, 10-0b, 10-7b, and 10-0c, with an insulating layer interposed therebetween. Each of the interconnect layers 11 functions as the word line WL7. The other word lines WL0 to WL6 are configured in a similar manner.

In the example of FIG. 4, the interconnect layers 11-0, 11-2, 11-4, 11-6, 11-8, 11-10, 11-12, 11-14, and 11-16 extend to their respective ends in a first direction along the X direction (referred to as first connection ends). The interconnect layers 11-0, 11-14, and 11-16 are coupled together, the interconnect layers 11-2 and 11-4 are coupled together, the interconnect layers 11-6 and 11-8 are coupled together, and the interconnect layers 11-10 and 11-12 are coupled together. Each of the interconnect layers 11-0, 11-2, 11-4, 11-6, 11-8, 11-10, 11-12, 11-14, and 11-16 functions as the word line WLe7.

The interconnect layers 11-1, 11-3, 11-5, 11-7, 11-9, 11-11, 11-13, and 11-15 extend to their respective ends (referred to as second connection ends) in a second direction opposite to the first direction along the X direction. The interconnect layers 11-1 and 11-3 are coupled together, the interconnect layers 11-5 and 11-7 are coupled together, the interconnect layers 11-9 and 11-11 are coupled together, and the interconnect layers 11-13 and 11-15 are coupled together, each of which functions as the word line WLo7.

The memory cell region is provided between the first connection region and the second connection region. In the memory cell region, the interconnect layers 11 which are adjacent to each other in the Y direction are separated by the slits SLT2 described by referring to FIG. 3. Similarly, between the blocks BLK which are adjacent to each other in the Y direction, the interconnect layer 11 of one block BLK and the interconnect layer of the other block BLK which are adjacent to each other in the Y direction are separated by the slits SLT1. Furthermore, the memory pillars MP0 to MP31 are located in the memory cell regions as explained with reference to FIG. 3.

The layers in which the other word lines WL and the selection gate lines SGS are configured similarly to the configuration of the above-described layer.

<Sectional Structure of Memory Cell Array>

Figure 5:
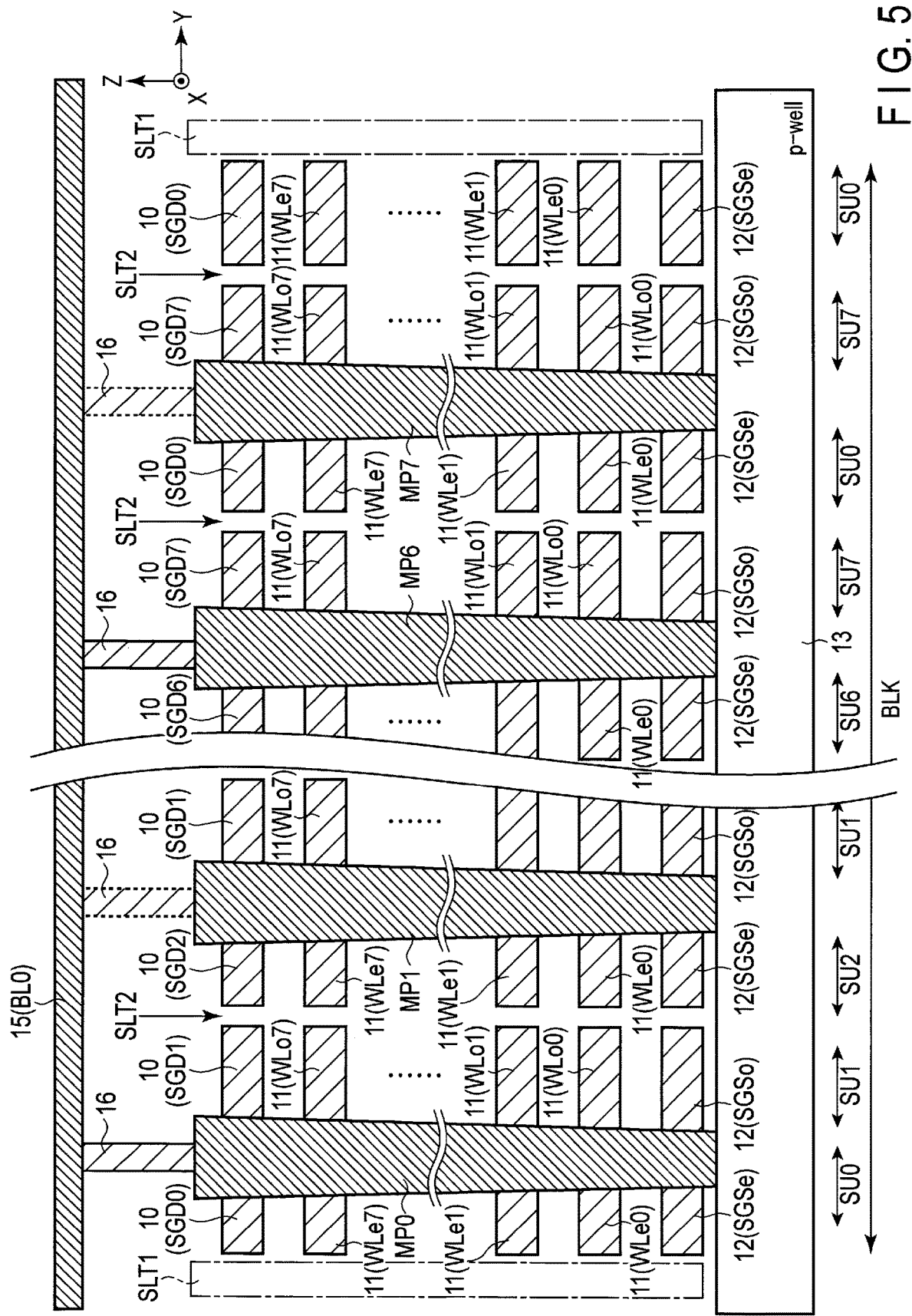
FIG. 5 is a cross section of a block according to the first embodiment.

The cross-sectional structure of the memory cell array 110 is now discussed. FIG. 5 shows a vertical section of the block BLK, taken along the Y direction. By way of example, FIG. 5 illustrates a vertical section of a region taken along the bit line BL0 shown in FIG. 3.

As illustrated in FIG. 5, the interconnect layers 12 functioning as the selection gate lines SGS is located above the semiconductor substrate (e.g., p-type well region) 13. Eight interconnect layers 11 functioning as the word lines WL0 to WL7 are stacked in the Z direction above the selection gate lines SGS. The layout views of these interconnect layers 11 and 12 are presented in FIG. 4. The interconnect layers 10 functioning as the selection gate lines SGD is arranged above the word lines 11. As for the layer for the SGD, its layout view has already been discussed with reference to FIG. 3.

The slits SLT2 and the memory pillars MP are arranged alternately along the Y direction to each extend through the interconnect layer 10 to the semiconductor substrate 13. As discussed above, the slits SLT2 are formed of insulating layers. The insulation films of the slit SLT2 may include contact plugs to apply a voltage to a region of the semiconductor substrate 13. For example, contact plugs may be provided to couple the sources of the selection transistors ST2 to a source line that is not shown.

The interconnect layers 12 includes the selection gate lines SGSe and the selection gate lines SGSo which are alternately arranged with slits SLT2 or memory pillars MP interposed in-between. Similarly, the interconnect layers 11 includes the word lines WLo and the word lines WLe which are alternately arranged with slits SLT2 or memory pillars MP interposed therebetween.

The slits SLT1 are arranged between the blocks BLK which are adjacent to each other in the Y direction. As mentioned above, the slits SLT1 are formed of an insulating layer. The insulating layers of the slits SLT1 may include contact plugs to apply a voltage to a region of the semiconductor substrate 13. For example, contact plugs may be provided to couple the sources of the selection transistors ST2 to the source line. The width of the slit SLT1 in the Y direction is greater than the width of the slit SLT2 in the Y direction.

A contact plug 16 is arranged on each of the memory pillars MP. The interconnect layers 15 functioning as the bit lines BL is arranged along the Y direction in a manner so that the bit lines BL are commonly coupled to the corresponding contact plugs 16.

<Structures of Memory Pillar and Memory Cell Transistors>

The structure of each memory pillar MP and each memory cell transistor MT will be explained. FIG. 6 is a cross section of the memory pillar MP taken along the X-Y plane, and FIG. 7 is a vertical section of the same taken along the Y-Z plane. Particularly, FIG. 6 and FIG. 7 illustrate the area in which two memory cell transistors MT are formed.

As illustrated in FIG. 6 and FIG. 7, the memory pillar MP includes an insulating layer 30, a semiconductor layer 31, and insulating layers 32 to 34 which are coaxially arranged along the Z direction. The insulating layer 30 may be a silicon dioxide film. The semiconductor layer 31 is arranged to surround the insulating layer 30, and provides a region in which the channels of the memory cell transistors MT are formed. The semiconductor layer 31 may be formed of polycrystalline silicon. The insulating layer 32 is arranged to surround the semiconductor layer 31, and to function as a gate insulating layer of the memory cell transistor MT. The insulating layer 32 may have a stacked structure including a silicon dioxide film and a silicon nitride film. The insulating layer 33 is arranged to surround the semiconductor layer 31, and functions as a charge accumulation layer of the memory cell transistor MT. The insulating layer 33 may be a silicon nitride film. The insulating layer 34 is arranged to surround the insulating layer 33, and functions as a block insulating layer of the memory cell transistor MT. The insulating layer 34 may be a silicon dioxide film. Outside the memory pillar MP, an insulating layer 37 is buried in the slit SLT2. The insulating layer 37 may be a silicon dioxide film.

An aluminum oxide (AlO) layer 35 may be arranged around the above-described memory pillar MP. A barrier metal layer (e.g., a titanium nitride (TiN) film) 36 may be formed around the AlO layer 35. The conductive layers 11 that function as the word lines WL are arranged around the barrier metal layer 36. The conductive layers 11 may be formed of tungsten.

With the above-described configuration, two memory cell transistors MT are formed along the Y direction in one memory pillar MP. The selection transistors ST1 and ST2 are similarly formed.

FIG. 8 shows an equivalent circuit of the above-described memory pillar MP. As illustrated in FIG. 8, two NAND strings 50o and 50e are formed in one memory pillar MP. In other words, a pair of selection transistors ST1 arranged in the one memory pillar MP are coupled to different selection gate lines SGD. The pair of memory cell transistors MT0 to MT7 are respectively coupled to different word lines WLo and WLe. Furthermore, the pair of selection transistors ST2 are coupled to different selection gate lines SGSo and SGSe. The two NAND strings 50o and 50e in the same memory pillar MP are coupled to the same bit line BL, and to the same source line SL. The two NAND strings 50o and 50e formed in the same memory pillar MP share a back gate (semiconductor layer 31).

<Threshold Distributions of Memory Cell Transistors>

In an example introduced here, a single memory cell transistor MT may be configured to hold 2-bit data. The bits of this 2-bit data will be referred to, from the least significant bit, as a lower bit and upper bit. In the memory cell transistors that are coupled to the same word line, a set of lower bits held in those memory cell transistors is denoted as a lower page, and a set of upper bits held in the those memory cells transistors is denoted as an upper page. That is, two pages are assigned to one word line WL, which means that one string unit SU coupled to eight word lines WL has a capacity of 16 pages. In other words, a "page" can be defined as a portion of the memory space that is formed by the memory cell transistors coupled to the same word line. The data writing and reading may be performed for every page.

FIG. 9 shows the possible bit values to be stored in each memory cell transistor MT, threshold voltage distribution, and read voltages used for reading data.

As shown in FIG. 9, one memory cell transistor MT may be set in one of four possible states in accordance with the threshold voltage states. These four states are referred to as "Er" state, "A" state, "B" state, and "C" state from the lowest threshold voltage.

In the "Er" state, the memory cell transistor MT has a threshold voltage higher than a voltage Vcut1 (e.g., negative voltage) and lower than a voltage VA, and corresponds to a state with erased data. The voltage VA is, for example, 0V, and the memory cell transistor MT in the "Er" state has a negative threshold. In the "A" state, the memory cell transistor MT has a threshold voltage equal to or higher than the voltage VA and lower than a voltage VB (>VA). In the "B" state, the memory cell transistor MT has a threshold voltage equal to or higher than the voltage VB and lower than a voltage VREAD. Of the four states distributed in such a profile, the "C" state shows the highest threshold voltage. Note that the voltage VREAD is intended for application to non-selected word lines in the read operations, and it turns on the memory cell transistors MTs irrespective of the stored data.

The above-described threshold voltage distribution states are realized by writing a 2-bit (2-page) value including the lower bit and upper bit in the corresponding memory cell transistor. The four threshold voltage distribution states establish the following relationship with the lower bit and upper bit values.
"Er" state: "11" (in the order of "upper/lower")
"A" state: "01"
"B" state: "00"
"C" state: "10"

In the above threshold voltage distribution states, the bit values of any adjacent two states have a difference in only one of the two bits.

The data read operation may be performed for each page, for example. More specifically, the lower page is read using, for example, the voltage VA and the voltage VC as read voltages. Data read processes using the voltage VA and the voltage VC will be referred to as a read operation AR and a read operation CR, respectively. The read operation AR allows specifying whether the memory cell transistor MT is in the "Er" state or in one of the "A" to "C" states. Further, the read operation CR allows specifying whether the memory cell transistor MT is in the "C" state or one of the "Er" to "B" states. The upper page may be read using the voltage VB. This read process will be referred to as a read operation BR. The read process BR allows specifying whether the memory cell transistor MT is in one of the "Er" to "A" states, or in one of the "B" to "C" states.

1.2 Order of Data Writing

The order of data writing in the NAND flash memory configured as above will be described. The data program method according to this embodiment proceeds with the receipt of data for two pages as referred to FIG. 9, and the execution of programming based on the received data, so that the state of each memory cell transistor MT according to its threshold directly transitions from the "Er" state to a state according to the intended threshold. This method will be referred to as a full sequence programming. FIG. 10 is a diagram showing the order of selecting the string units SU0 to SU7 and the word lines WL0 to WL7 for writing data in a given block BLK, where the numbers "0" to "63" in the respective table entries at the intersections between the columns for the string units SU0 to SU7 and the rows for the word lines WL0 to WL7 indicate the sequence of selections.

In the example of FIG. 10, a higher priority is assigned to the selection of a word line WL than the selection of a string unit SU. That is, the word line WL0 of the string unit SU0 is first selected, then the word line WL0 of the string unit SU1 is selected, and thereafter the word lines WL0 of the string unit SU2 to SU7 are selected in the same manner. After the word line WL0 of the last string unit SU7 is selected, the selection proceeds to the word line WL1. Then, the word lines WL1 of the string units SU0 to SU7 are sequentially selected. In this manner, for the word lines WL2 to WL7 in turn, the selection are performed in the same manner, and finally the word line WL7 of the string unit SU7 is selected.

1.3 Data Read Method

Figure 11:
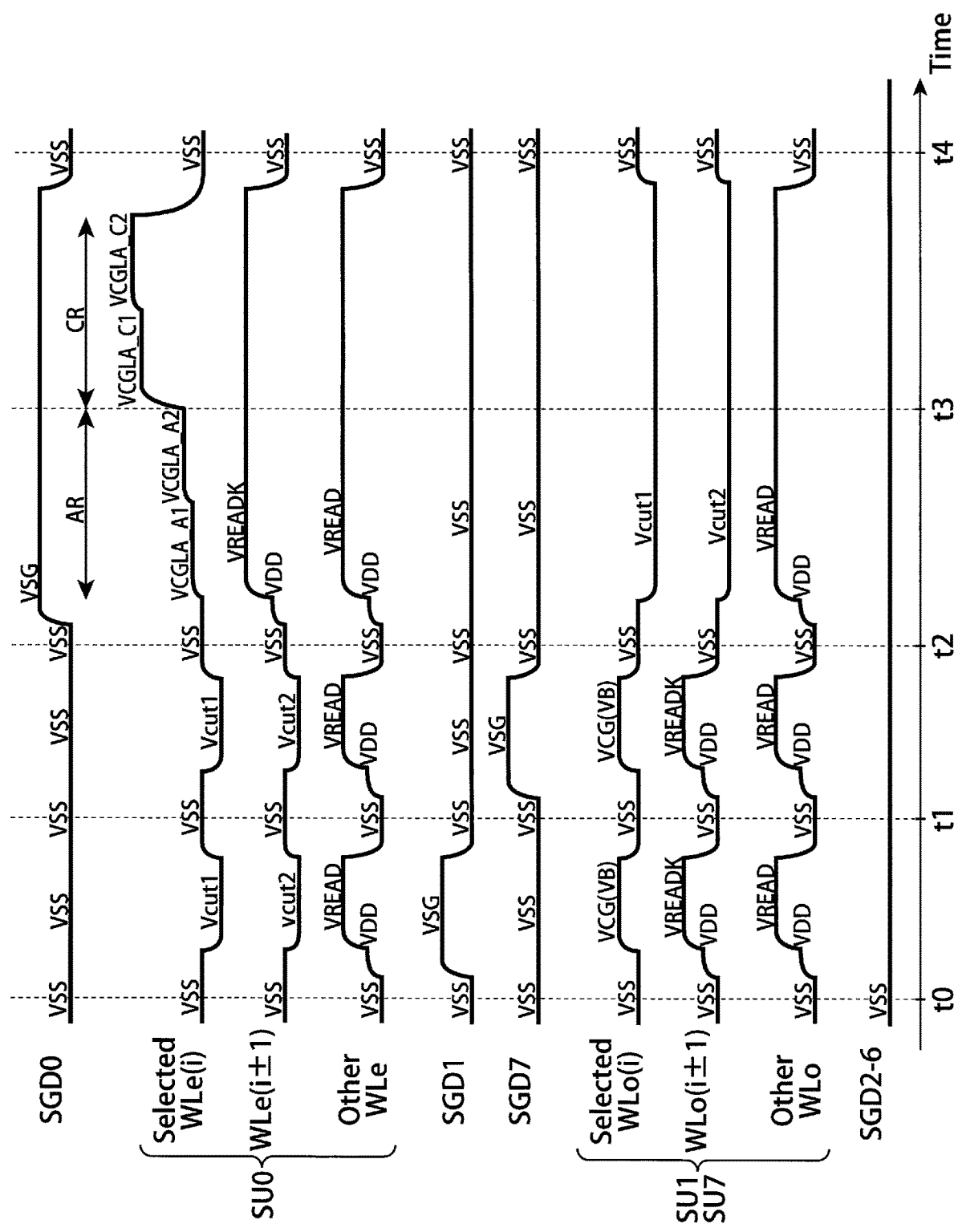

Now, the data read method according to the present embodiment will be described. FIG. 11 shows, by way of example, changes in voltage on respective interconnects in reading data from the memory cell transistors MTi (i being one of integers 0 to 7) in the string unit SU0.

The data read method according to this embodiment includes, in general terms, a "prior-read operation (or "prior-reading")" and a "main read operation (or "main-reading")".

The prior-read operation is a process which is performed in relation to reading data from, for example, memory cell transistors MTi in a given string unit SU, and by which data is read from memory cell transistors MTi in each neighboring string unit SU. The main read operation is executed after the prior-read operation. The main read operation reads data from the memory cell transistors MTi in the given string unit SU as the original read target. Here, the voltage applied to the selected word line WLi in the main read operation is changed according to the result of the prior-read operation.

Detailed explanations will be given with reference to FIG. 11. The prior-read operation is performed during the period from time t0 to time t2. The explanations will assume an exemplary case, where the string unit SU0 is the original read target, and two string units SU1 and SU7 are adjacent to the string unit SU0 as shown in FIG. 3 and FIG. 4. Accordingly, data is first read from the memory cell transistors MTi in the string unit SU1 during the period from time t0 to time t1. The prior-read operation in this example uses the voltage VB to check whether the memory cell transistors MTi are in one of the "Er" to "A" states, or in one of the "B" to "C" states. Note that it is also possible to instead use the voltages VA, VB, and VC to identify the "Er", "A", "B", and "C" states.

As shown in FIG. 11, the row decoder 120 applies a voltage VSG to the selection gate line SGD1 (and the selection gate line SGSo) corresponding to the string unit SU1. The voltage VSG is a voltage to turn on the selection transistors ST1 and ST2. The row decoder 120 further selects a word line WLi (i.e., word line WLoi, as the string unit SU1 being the read target here), and applies a read voltage VCG (i.e., voltage VB in this example) to the word line WLoi. Also, the row decoder 120 applies a voltage VREADK to each word line WLo(i±1) arranged next to the word line WLoi, and applies a voltage VREAD to the other non-selected word lines WLo. The voltage VREAD and the voltage VREADK turn on the memory cell transistors MTs irrespective of the retained data, and they may be in the relationship of, for example, VREAD VREADK.

Meanwhile, the row decoder 120 applies a voltage VSS to the selection gate line SGD0 (and the selection gate line SGSe) corresponding to the string unit SU0. The voltage VSS is a voltage to turn the selection transistors ST1 and ST2 off, and has a value of, for example, 0V. The row decoder 120 further selects a word line WLi (i.e., word line WLei in this example), and applies a voltage Vcut1 to the word line WLei. Also, the row decoder 120 applies a voltage Vcut2 to each word line WLe(i±1) arranged next to the word line WLei, and applies a voltage VREAD to the other non-selected word lines WLe. The voltage Vcut2 may be a negative voltage as well, and the voltage Vcut1 and the voltage Vcut2 are in the relationship of, for example, $|Vcut1| \geq |Vcut2|$. The sense amplifier 140 precharges the bit lines BL (BL0 to BL(L−1)). If the memory cell transistors MTi in the string unit SU1 turns on, a cell current flows through each applicable bit line BL to the source line SL. The cell current is sensed by the sense amplifier 140. The flowing of the cell current indicates that the state of memory cell transistor MTi coupled to the word line WLi in the string unit SU1 is either the "Er" state or the "A" state. On the other hand, the no cell current flow indicates the state is either the "B" state or the "C" state.

Subsequently, similar steps are followed during the period from time t1 to time t2 to perform the prior-read operation with the string unit SU7. The row decoder 120 applies the voltage VSS to the selection gate line SGD1, and the voltage VSG to the selection gate line SGD7. Other than this, the voltages applied to the word lines WL are the same as those adopted in the prior-read operation with the string unit SU1.

Note that, in the string unit SU0 as shown in FIG. 3, the memory cell transistors MT arranged next to the string unit SU1 are formed in the respective memory pillars MT0 and MT16, and the memory cell transistors MT arranged next to the string unit SU7 are formed in the respective memory pillars MP7, MP14, MP15, MP23, MP30, and MP31. As such, the sense amplifier 140 may sense only the bit lines BL(4j) and does not need to sense the bit line BL(4j+1), BL(4j+2), or BL(4j+3), in the prior-read operation with the string unit SU1. Conversely, the sense amplifier 140 may sense only the bit lines BL(4j+1), BL(4j+2), and BL(4j+3) and does not need to sense any bit line BL(4j), in the prior-read operation with the string unit SU7. Note that j is one of integers 0 to 3. The sense amplifier 140 assumes such bit lines BLs, not required for sensing, to have turned on the corresponding memory cell transistors MTi. That is, in the context of FIG. 11, the sense amplifier 140 determines, upon the prior-read operation with the string unit SU1, that the threshold state of each memory cell transistor MTi corresponding to the bit line BL(4j+1), BL(4j+2), or BL(4j+3) is either the "Er" state or the "A" state, and let a latch circuit hold the data indicative of this determination. On the other hand, upon the prior-read operation with the string unit SU7, the sense amplifier determines that the threshold state of each memory cell transistor MTi corresponding to the bit line BL(4j) is either the "Er" state or the "A" state, and let the latch circuit hold the data indicative of this determination.

Thereafter, the main read operation is performed during the period from time t2 to time t4. Among this period, the read process AR is performed between time t2 to time t3, and the read process CR is performed between the time t3 to time t4.

The read process AR will be explained. The row decoder 120 applies the voltage VSG to the selection gate line SGD0 (and the selection gate line SGSe) corresponding to the string unit SU0. This turns on the selection transistors ST1 and ST2 in the string unit SU0. The row decoder 120 selects one word line WLei and applies a read voltage to the word line WLei. In the present example, this read voltage sequentially adopts a voltage VCGLA_A1 and a voltage VCGLA_A2, which are in the relationship of, for example, VCGLA_A1<VCGLA_A2.

The row decoder 120 applies the voltage VREADK to each non-selected word line WLe(i±1), and the voltage VREAD to the other non-selected word lines WLe.

Meanwhile, the row decoder 120 applies the voltage VSS to the selection gate lines SGD1 and SGD7 (and the selection gate line SGSo) corresponding to the string units SU1 and SU7. The row decoder 120 further selects one word line WLoi and applies the voltage Vcut1 to the word line WLoi. Also, the row decoder 120 applies the voltage Vcut2 to each word line WLo(i±1) and the voltage VREAD to the other non-selected word lines WLo.

The sense amplifier 140 precharges the bit lines BLs (BL0 to BL(L−1)), and senses the cell current flowing through the bit lines BLs. At this time, for the selection-subject memory cell transistors (which may be simply called "selected cells") sharing the respective memory pillars MPs with the memory cell transistors MT (which may be simply called "backside cells") having been determined to be in the "Er" state or the "A" state upon the preceding prior-read operation, the sensing is performed while the voltage VCGLA_A1 is applied to the selected word line WLei, and the data is strobed. On the other hand, for the selected cells sharing the respective memory pillars MPs with the backside cells having been determined to be in the "B" state or the "C" state upon the prior-read operation, the sensing is performed while the voltage VCGLA_A2 is applied to the selected word line WLei, and the data is strobed.

Next, the read process CR will be explained. In the read process CR following the read process AR above, the row decoder 120 sequentially applies a read voltage VCGLA_C1 and a read voltage VCGLA_C2 to the word line WLei. For example, CGLA_C1<VCGLA_C2. The remaining aspects are the same as the read process AR.

For the selected cells sharing the respective memory pillars MP with the backside cells having been determined to be in the "Er" state or the "A" state upon the prior-read operation, the sense amplifier 140 senses data while the voltage VCGLA_C1 is applied to the selected word line WLei, and strobes the data. On the other hand, for the selected cells sharing the respective memory pillars MPs with the backside cells having been determined to be in the "B" state or the "C" state upon the prior-read operation, data is sensed while the voltage VCGLA_C2 is applied to the selected word line WLei, and the data is strobed.

FIG. 12 will be referred to for explaining another example of the data read method according to the embodiment. The example shown in FIG. 12 shows the voltage on respective interconnects in reading data from the memory cell transistors MTi in the string unit SU2.

As shown, the prior-read operation is first performed in a manner similar to the case shown in FIG. 11, during the period from time t0 to time t1. The string unit SU2 is the original reading target in this example, and two string units SU1 and SU3 is adjacent to the string unit SU2 as shown in FIG. 3 and FIG. 4.

Note, however, that according to the data writing order in the present embodiment as discussed with reference to FIG. 10, the data writing to the string unit SU1 was already done before writing data in the string unit SU2 for each word line WL. As such, an influence or interference due to the data writing with the string unit SU1 is substantially unlikely (as will be described in more detail later). Therefore, the prior-read operation with the string unit SU1 is omitted, and the prior-read operation with the string unit SU3 is performed.

Subsequently, the main read operation including the read operations AR and CR is performed during the period from time t1 to time t3. As in the foregoing example, the read operation AR uses the voltages VCGLA_A1 and VCGLA_A2. In the present example, for the selected cells sharing the respective memory pillars MP with the backside cells (i.e., memory cell transistors MTs for the string unit SU2) having been determined to be, for example, in the "Er" state or the "A" state upon the prior-read operation, the sensing is performed while the voltage VCGLA_A1 is applied to the selected word line WLei, and the data is strobed. On the other hand, for the selected cells sharing the respective memory pillars MP with the backside cells (i.e., memory cell transistors MTs for the string unit SU2, as well) having been determined to be in the "B" state or the "C" state upon the prior-read operation, the sensing is performed while the voltage VCGLA_A2 is applied to the selected word line WLei, and the data is strobed. The read process CR proceeds in the similar manner.

The data read operation is thus performed. As appreciated from the description above, the string unit or units SUs targeted for the prior-read operation, and the bits (bit lines BLs) to be subjected to the data sensing in such targeted string units SUs are dependent on the string unit SU originally intended for data reading. FIG. 13 may be referred to for particulars. FIG. 13 shows the string units SUs targeted for the prior-read operation and the subject bit lines, for the cases of reading data from the respective string units SU0 to SU7.

As explained with reference to the example of FIG. 11, the string units SU1 and SU7 are targeted for the prior-read operation for the case of reading data from the string unit SU0. Here, the subjects of sensing in the string unit SU1 are the bit lines BL(4$j$), and the subjects of sensing in the string unit SU7 are the bit lines BL(4$j$+1), BL(4$j$+2), and BL(4$j$+3).

For the case of reading data from the string unit SU1, the string unit SU2 is targeted for the prior-read operation. While the string unit SU1 is arranged next to not only the string unit SU2 but also to the string unit SU0, the data writing to the string unit SU0 was already finished when data was written in the string unit SU1. As such, the prior-read operation with the string unit SU0 is not required. Also, the bit lines BLs as the sensing subjects are the bit lines BL(4$j$+1), BL(4$j$+2), and BL(4$j$+3) coupled to the respective memory pillars MP shared by the string units SU1 and SU2, including the memory pillars MP1, MP8, MP9, MP17, MP24, and MP25 as shown in FIG. 3 and FIG. 4.

For the case of reading data from the string unit SU2, the string unit SU3 is targeted for the prior-read operation as explained with reference to FIG. 12, and the prior-read operation is not performed with the string unit SU. The bit lines BL(4$j$) are the subjects of sensing.

The cases of reading data from the succeeding string units SU3 to SU6 may be likewise comprehended. Besides, the string unit SU7 is the string unit for which the data writing is lastly performed for each selected word line WL$i$. As such, the prior-read operation with other string unit is not required for the case of reading data from the string unit SU7, and the read voltage VCG adopts the voltages VA, VB, and VC as explained with reference to FIG. 9.

1.4 Effects of First Embodiment

The data read method according to the present embodiment realizes NAND flash memory with enhanced operational reliability. This effect will be described in more detail.

According to the structure described with reference to FIG. 6 and FIG. 7, two memory cell transistors MTs are formed for one memory pillar MP in such an arrangement that the memory cell transistors MT are opposed to each other. These memory cell transistors MT belong to the respective, different string units SU, and are independently controlled by the corresponding even-numbered word line WLe and odd-numbered word line WLo. In other words, these two opposed memory cell transistors MTs are subjected to different-timing data write operations. This leads to the circumstance where the threshold of one memory cell transistor MT, having been subjected to data writing first, is exposed to the influence of later data writing in the other memory cell transistor MT sharing the same memory pillar MP (this influence will be called an "inter-cell interference effect"). The inter-cell interference effect, for example, may cause the threshold of the memory cell transistor MT already data-written to rise or decrease. The inter-cell interference effect is significant when the threshold of the memory cell transistor MT subjected to the later data writing has been moved to a large extent, and the inter-cell interference effect is also significant when the memory cell transistor MT subjected to the prior data writing has a low threshold.

According to the present embodiment, therefore, the controller 200 reads data from the non-selected string unit SU located next to the string unit SU as a read target (i.e., prior-read operation). More specifically, data is read from the memory cell transistor MT ("backside cell") that shares the same memory pillar MP with the memory cell transistor MT ("selected cell") in the selected string unit SU and that constitutes the non-selected string unit SU having been subjected to the data writing after the selected string unit SU. Data is subsequently read from the selected string unit SU (i.e., main read operation). In the main read operation, the read voltage VCG is changed based on the data about the backside cell. That is, the voltages of values that take into account the inter-cell interference effect are employed, instead of the voltages explained with reference to FIG. 9, namely, VA, VB, and VC, as they are. For example, if the backside cell is found to be in the "C" state, the inter-cell interference effect due to the data writing with the backside cell might have raised the threshold of the selected cell. In more concrete terms, supposing that the selected cell was in the "Er" state, the imposed inter-cell interference effect might have caused the threshold of the selected cell to shift upward, resulting in that the threshold distribution involving the selected cell can now have an upper limit higher than the voltage VA for the "Er" state. To address the case with such a likelihood, the main read operation uses, as the voltage VCGLA_A1, a voltage having a higher value than the voltage VA. Consequently, erroneous data reading that would occur due to the threshold variation caused by the inter-cell interference effect is suppressed, and NAND flash memory adopting the present embodiment can have enhanced operational reliability.

2. Second Embodiment

A semiconductor memory device according to the second embodiment will be described. This embodiment employs a data write method different from that of the first embodiment, thereby reducing the number of string units requiring the prior-read operation. The description will in principle concentrate to the point different from the first embodiment.

2.1 Order of Data Writing

Figure 14:
FIG. 14 is a diagram showing an order of data writing according to a second embodiment.

FIG. 14 is a diagram showing the order of selecting the string units SU0 to SU7 and the word lines WL0 to WL7 for writing data in a given block BLK.

As shown in the figure, the selections according to this embodiment prioritize the word lines WL over the string units SUs, as in the case shown in FIG. 10 for the first embodiment. Note that the selections here differ from the case shown in FIG. 10 in that the even-numbered string units SU are prioritized over the odd-numbered string units SU.

First, the word line WL0 in the string unit SU0 is selected, then the word line WL0 in the string unit SU2 is selected, and subsequently, the word line WL0 in each of the string units SU4 and SU6 is likewise selected. The odd-numbered string units SUs are selected next. That is, the word line WL0 in the string unit SU1 is selected, then the word line WL0 in the string unit SU3 is selected, and subsequently, the word line WL0 in each of the string units SU5 and SU7 is likewise selected. The word line WL1 is then subjected to the selections. For the word line WL1, the selections are similarly made in the order of the string units SU0, SU2, SU4, SU6, SU1, SU3, SU5, and SU7. Then, the selections likewise continue for the word lines WL2 to WL7, with the word line WL7 in the string unit SU7 selected at the end.

2.2 Data Read Method

FIG. 15 shows the string units SU targeted for the prior-read operation and the subject bit lines, for the cases of reading data from the respective string units SU0 to SU7 in the read method according to the present embodiment.

As shown, the prior-read operation is performed on condition that the string unit SU as a read target is any of the even-numbered string units SU0, SU2, SU4, and SU6, and the prior-read operation is omitted when the read target string unit SU is the odd-numbered string unit SU1, SU3, SU5, or SU7. Note that what is shown in FIG. 15 for the case of selecting the string unit SU0 is the same as shown in FIG. 13, but with the string unit SU2 selected, the bit lines BL(4j+1), BL(4j+2), and BL(4j+3) in the string unit SU1 are sensed, and the bit lines BL(4j) in the string unit SU3 are sensed. Also, when the string units SU4 is selected, the bit lines BL(4j+1), BL(4j+2), and BL(4j+3) in the string unit SU3 and the bit lines BL(4j) in the string unit SU5 are sensed. Moreover, when the string unit SU6 selected, the bit lines BL(4j+1), BL(4j+2), and BL(4j+3) in the string unit SU5 and the bit lines BL(4j) in the string unit SU7 are sensed.

Figure 16:
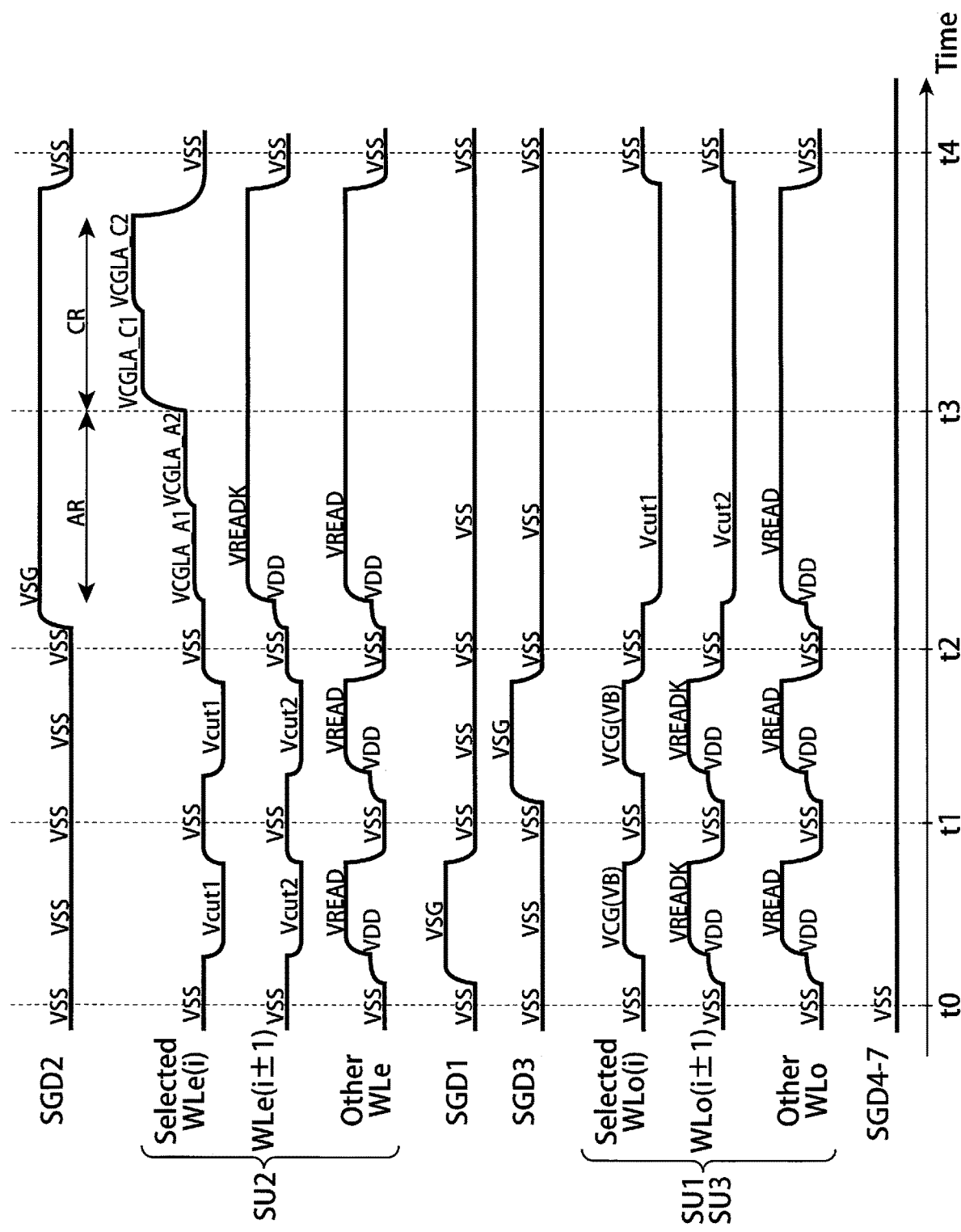
FIG. 16 is a timing chart showing changes in voltage on respective interconnects in the read operation according to the second embodiment.

FIG. 16 shows, as one example, the voltage on respective interconnects in reading data from the memory cell transistors MTi in the string unit SU2. As shown in the figure, the prior-read operation in this example is performed with the string units SU1 and SU3.

On the other hand, for reading data from the odd-numbered string unit SU, no operation is performed during the period from time t0 to time t2, and the subsequent read operation AR uses the voltage VA as the read voltage and the read operation CR uses the voltage VC as the read voltage.

2.3 Effects of Second Embodiment

The present embodiment adopts an altered order of data writing so that the prior-read operation can be targeted for only the even-numbered string units or only the odd-numbered string units. This realizes an accelerated read operation.

Figure 17:
FIG. 17 is a diagram showing an order of data writing according to a modification of the second embodiment.

Note that the writing order is not limited to the one shown in FIG. 14, but may be as shown in FIG. 17, for example. As shown, data may be first written in the even-numbered string units SU0, SU2, SU4, and SU6 for each of the word lines from WL0 up to WL7, and thereafter written in the odd-numbered string units SU1, SU3, SU5, and SU7 for each of the word lines from WL0 up to WL7. Such a data writing order may also provide the same effects.

3. Third Embodiment

A semiconductor memory device according to the third embodiment will be described. The third embodiment further takes into account the influence from the word line WL(i+1) in the first embodiment or the second embodiment. The description will in principle concentrate to the point different from the first and the second embodiments.

3.1 Data Read Method

Figure 18A:
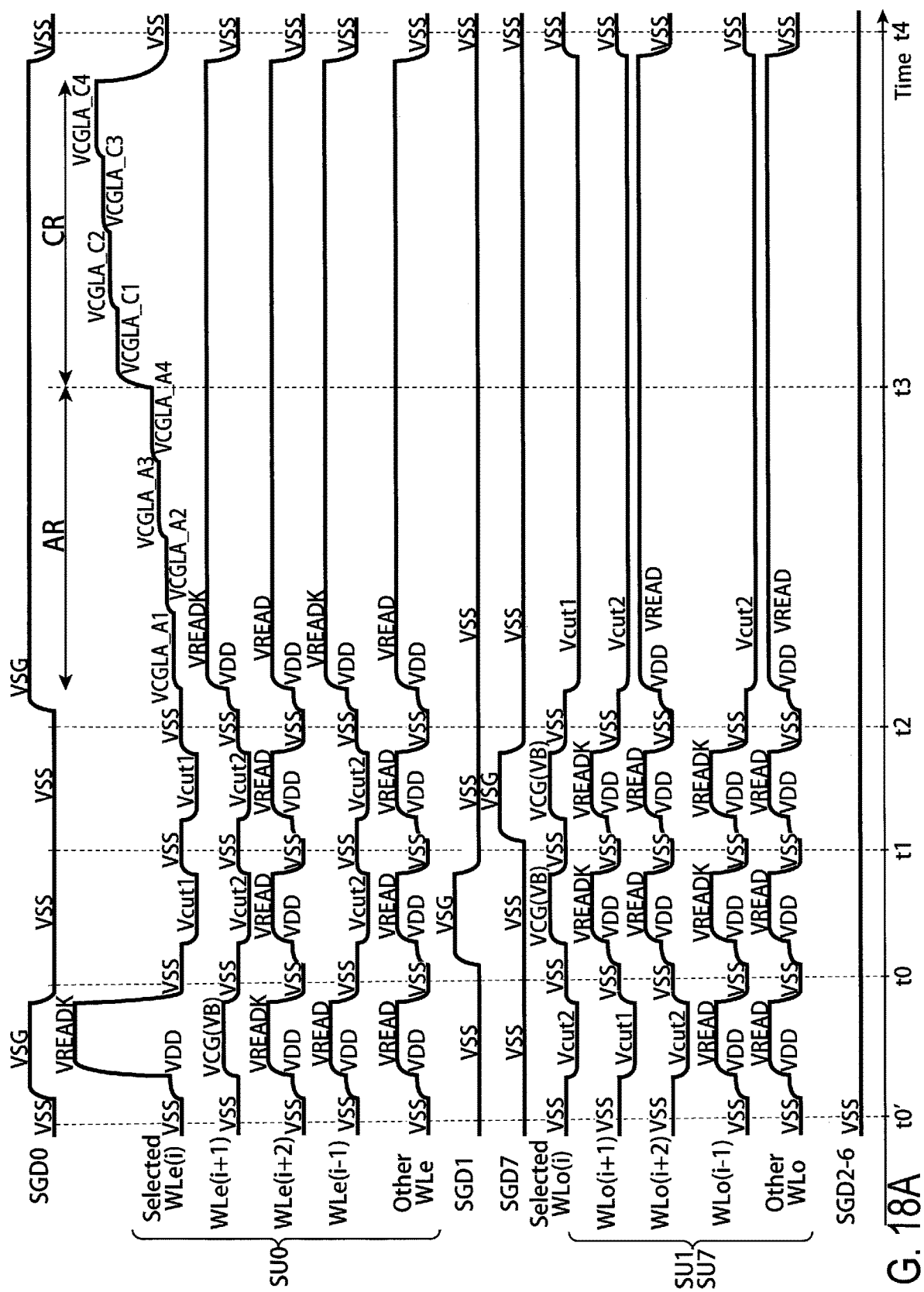
FIG. 18A is a timing chart showing changes in voltage on respective interconnects in a read operation according to a third embodiment.

FIG. 18A is related to the read method according to this embodiment, and corresponds to FIG. 11 referred to for the first embodiment.

The differences from FIG. 11 are as follows.

(1) The prior-read operation is performed with the string unit SU0, which is also a read target, for the word line WL(i+1). In FIG. 18A, the prior-reading to the string unit SU0 is performed in the period from time t0' to time t0.

As shown, during the period from time t0' to time t0, the row decoder 120 applies the voltage VSG to the selection gate line SGD0 (and the selection gate line SGSe), the read voltage VCG (i.e., voltage VB in this example) to the word line WLe(i+1), the voltage VREADK to each of the word lines WLei and WLe(i+2), and the voltage VREAD to the other non-selected word lines WLe.

The row decoder 120 also applies the voltage VSS to each of the selection gate lines SGD1 to SGD7, the voltage Vcut1 to the word line WLo(i+1), the voltage Vcut2 to each of the word lines WLoi and WLo(i+2), and the voltage VREAD to the other non-selection word lines WLo.

The sense amplifier 140 precharges all the bit lines, and senses and strobes the data. In this manner, it is found out whether the memory cell transistor MT(i+1) coupled to the word line WL(i+1) in the string unit SU0 is in "Er" to "A" states or "B" to "C" states. Subsequently, the prior-read operation is performed with each of the string units SU1 and SU7 arranged next to the string unit SU0, as in the first embodiment.

(2) In the main read operation, the read voltage VCG is determined in consideration of the prior-reading result of the word line WL(i+1). The main read operation is shown in the period from time t2 to time t4 of FIG. 18A.

More specifically, in the read operation AR, the row decoder 120 sequentially applies the read voltages VCGLA_A1, VCGLA_A2, VCGLA_A3, and VCGLA_A4 to the selected word line WLi. In the read operation CR, the row decoder 120 sequentially applies the read voltages VCGLA_C1, VCGLA_C2, VCGLA_C3, and VCGLA_C4 to the selected word line WLi. Note that in this example, the read voltages are in the relationship of VCGLA_A1<VCGLA_A2<VCGLA_A3<VCGLA_A4, and the relationship of VCGLA_C1<VCGLA_C2<VCGLA_C3<VCGLA_C4.

Reference may be made to FIG. 18B for the use of the read voltages in relation to the selected cell for which the data is to be sensed. FIG. 18B shows the possible results of the prior-read operation for the word line WL(i+1) and the possible results of the prior-read operation with the backside cell, and lists the read voltages for use in each instance of the combinations of the prior-reading results. The degree of the inter-cell interference effect in each instance is also shown.

As shown in FIG. 18B, the selected cell MTi has been exposed to the small inter-cell interference effect when the result about the neighboring cell coupled to the word line WL(i+1) and the result about the backside cell both indicate "Er" to "A" states. Accordingly, the read voltages VCGLA_A1 and VCGLA_C1 are used for such a selected cell MTi, and data is sensed and strobed when the read voltages VCGLA_A1 and VCGLA_C1 are applied to the selected word line WLi. The voltages VCGLA_A1 and VCGLA_C1, for example, may be equal to the respective voltages VA and VC.

On the other hand, the selected cell MTi has been exposed to the large inter-cell interference effect when the result about the neighboring cell coupled to the word line WL(i+1) and the result about the backside cell both indicate "B" to "C" states. Accordingly, the read voltages VCGLA_A4 and VCGLA_C4 are used for such a selected cell MTi, and data is sensed and strobed when the read voltages VCGLA_A4 and VCGLA_C4 are applied to the selected word line WLi.

When the result about the neighboring cell coupled to the word line WL(i+1) and the result about the backside cell are different, i.e., one being "Er" to "A" states and the other being "B" to "C" states, a medium degree of the inter-cell interference effect has been imposed. Accordingly, a set of the read voltages VCGLA_A2 and VCGLA_C2, or a set of the read voltages VCGLA_A3 and VCGLA_C3, is used for such a selected cell MTi. Which voltage set should be used depends on the degree of the inter-cell interference effect. While FIGS. 18A and 18B assume an instance where the influence from the backside cell was larger, the embodiment can also address the reverse situation.

3.2 Effects of Third Embodiment

According to the present embodiment as above, the prior-read operation is performed with also the memory cell transistor MT(i+1) coupled to the word line WL(i+1). The embodiment can therefore remedy not only the inter-cell interference effect from the neighboring string unit SU in the X-Y plane, but also the inter-cell interference effect from the memory cell transistor located next in the Z direction. Consequently, the operational reliability for data read can be further enhanced.

4. Fourth Embodiment

Next, a semiconductor memory device according to the fourth embodiment will be described. In the fourth embodiment, the first to third embodiments are applied to the data write method by two different stages. This write method will be referred to as a 2-stage program. The description will in principle concentrate to the point different from the first to the third embodiments.

4.1 Threshold Distributions of Memory Cell Transistors

The description will be given of exemplary cases, where one memory cell transistor MT stores, for example, three-bit data. The respective bits in the three-bit data will be referred to as a lower bit, a middle bit, and an upper bit. A plurality of the memory cells coupled to the same word line store together a group of lower bits, which will be referred to as a lower page, a group of middle bits, which will be referred to as a middle page, and a group of upper bits, which will be referred to as an upper page. Accordingly, one word line WL is assigned with three pages, and one string unit SU involving eight word lines WL has a capacity of twenty-four pages.

Figure 19:
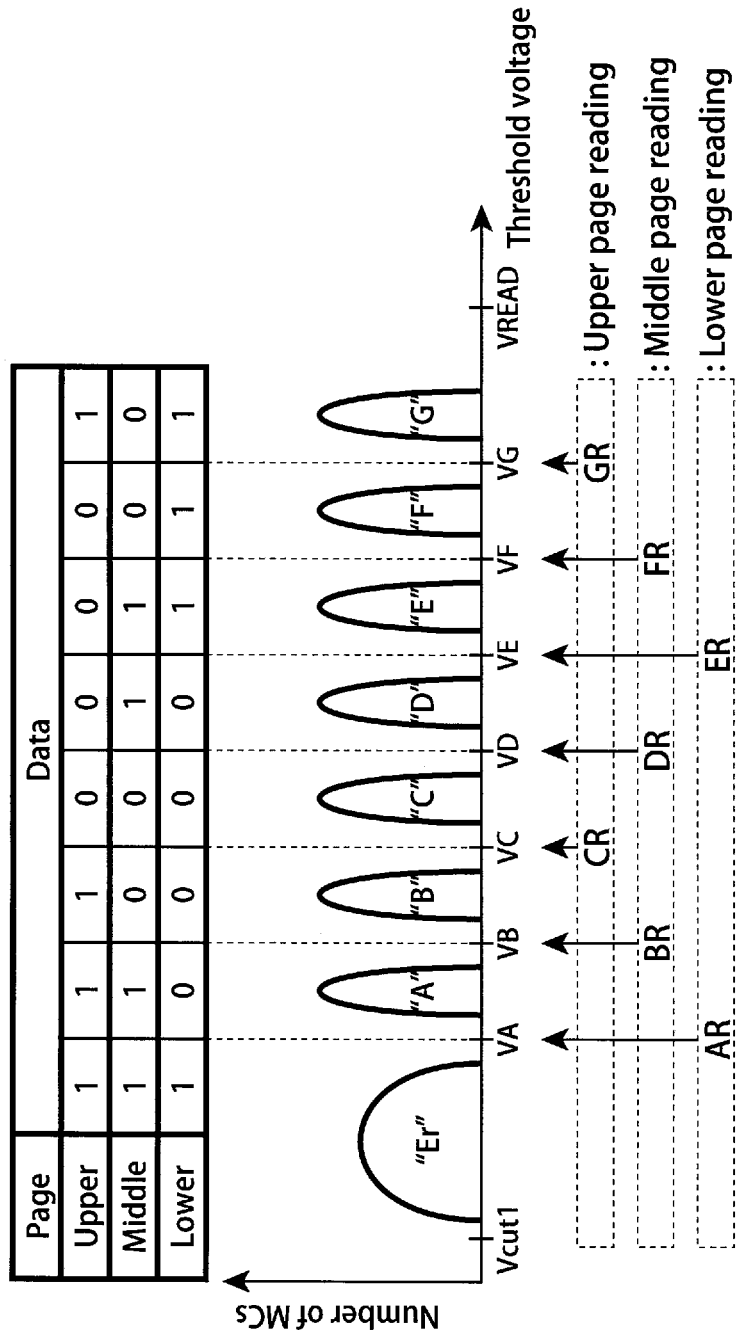
FIG. 19 is a conceptual diagram showing data in a memory cell and threshold distributions according to a fourth embodiment.

FIG. 19 shows the possible bit values to be stored in each memory cell transistor MT, threshold voltage distribution, and read voltages used for reading data.

As illustrated here, one memory cell transistor MT may transition among eight states according to threshold voltages. Such eight states will be referred to as "Er" state, "A" state, "B" state, "C" state, . . . and "G" state, in the order from the lowest threshold voltage.

The "Er" to "B" states are as described in relation to the first embodiment. In the "C" state, the memory cell transistor MT has a threshold voltage equal to or higher than the voltage VC and lower than a voltage VD (>VC). In the "D" state, the memory cell transistor MT has a threshold voltage equal to or higher than the voltage VD and lower than a voltage VE (>VD). In the "E" state, the memory cell transistor MT has a threshold voltage equal to or higher than the voltage VE and lower than a voltage VF (>VE). In the "F" state, the memory cell transistor MT has a threshold voltage equal to or higher than the voltage VF and lower than a voltage VG (>VF). In the "G" state, the memory cell transistor MT has a threshold voltage equal to or higher than the voltage VG and lower than the voltage VREAD. Of the eight states distributed in such a profile, the "G" state shows the highest threshold voltage.

The states according to the respective threshold distributions are realized by writing the aforementioned three-bit (three-page) data including the lower bit, the middle bit, and the upper bit. Specifically, the eight states relate to the values of the lower, the middle, and the upper bits as follows.
"Er" state: "111" (upper/middle/lower bits)
"A" state: "110"
"B" state: "100"
"C" state: "000"
"D" state: "010"
"E" state: "011"
"F" state: "001"
"G" state: "101"

As described previously, the data read operation may be performed for each page. The lower page is read using, for example, the voltage VA and the voltage VE as read voltages, each of which is referred to as a read operation AR and a read operation ER. The middle page is read using, for example, the voltage VB, the voltage VD, and the voltage VF as read voltages, each of which is referred to as a read operation BR, a read operation DR, and a read operation FR. Further, the upper page is read using, for example, the voltage VC and the voltage VG as read voltages, each of which is referred to as a read operation CR and a read operation GR.

4.2 2-Stage Program

The 2-stage program according to the present embodiment will be described, using two examples.

First Example

FIG. 20 is graphs showing threshold distributions of the memory cell transistor coupled to the word lines WLi and WL(i+1) and shows the steps executed in the data write operation according to the first example of the 2-stage program.

At first, the memory cell transistors coupled to the word lines WLi and WL(i+1) in step 1 are both in the "Er" state as shown in the figure. Under this condition, the word line WLi is selected so that the program operation is executed to the memory cell transistor MT which is to be written to the "D" to "G" state. In this program operation, a middle level voltage Vfy_LM is used as a verify voltage, which is lower than the threshold voltage as a target value. As a result, a distribution at the middle level, as illustrated in step 2 is generated. The state according to this threshold distribution will be referred to as "LM" state. The distribution for the "LM" state may range from, for example, the "B" state to the "E" state. Also, and the program operation for the "LM" state will be referred to as a first stage program.

Then, the word line WL(i+1), arranged next to the word line WLi on the drain side, is selected so that the first stage program is likewise performed. As a result, the "LM" state is generated in regard to the memory cell transistors MT connected to the word line WL(i+1) as shown in step 3. This first stage program for the word line WL(i+1) exerts a strong inter-cell interference effect on the memory cell transistor MT coupled to the word line WLi, causing its threshold distribution to shift in the direction of positive voltage (not illustrated).

Subsequently, the word line WLi is selected, and data is written. The verify level here adopts each target verify level. That is, more specifically, a program operation is performed so that transition to any of the "A" state, the "B" state, and the "C" state is done from the "Er" state, and transition to any of the "D" state, the "E" state, the "F" state, and the "G" state is done from the "LM" state. This program operation will be referred to as a second stage program. As a result, the threshold distribution as shown in step 4 is obtained. The second stage program can generally keep the amount of the threshold transition of the write target memory cell coupled to the word line WLi, smaller than that of the write target memory cell in the case of the full sequence technique. Accordingly, the threshold voltage of the write target memory cell coupled to the word line WLi can be set in the intended threshold range, while the threshold transition amount is reduced.

Next, the word line WL(i+1) is selected so that the second stage program is likewise performed, thereby the threshold distribution as shown in step 5 is obtained. Note that, by the time the second stage program is performed for the word line WL(i+1), the first stage program for the word line WL(i+2) is already finished.

Consequently, the inter-cell interference effect can be reduced at the data writing.

Second Example

Next, the second example of the 2-stage program will be described. In relation to the 2-stage program of the second example, FIG. 21 is graphs showing threshold distributions of the memory cell transistor coupled to the word lines WLi and WL(i+1) and shows the steps executed in the data write operation according to the second example of the 2-stage program.

At first, the memory cell transistors coupled to the word lines WLi and WL(i+1) in step 1 are both in the "Er" state as shown in the figure. Under this condition, the word line WLi is selected, and data is written. The verify voltages adopted here are VfyA', VfyB', VfyC', and so on, which are values lower than the respective target verify voltages VfyA, VfyB, VfyC, and so on. This write operation produces rough distributions corresponding to the "A" state, the "B" state, the "C" state, etc., for the word line WLi, as illustrated in step 2. The operation is the first stage program in the second example.

Next, the word line WL(i+1) is selected so that the first stage program is likewise performed. As a result, the data is roughly written into the memory cell transistors MT connected to the word line WL(i+1) as shown in step 3. This first stage program for the word line WL(i+1) exerts a strong inter-cell interference effect on the memory cell transistor MT coupled to the word line WLi, causing its threshold distribution to shift in the direction of positive voltage (not illustrated).

Subsequently, the word line WLi is selected, and data is written. The verify voltages adopted here are values of target verify voltage VfyA, VfyB, VfyC, etc. At this point, rough-writing for the "A" state, the "B" state, the "C" state, etc. is already done, so the amount of threshold transition of the write target memory cell is subtle. This is the second stage program in the second example. As a result, the threshold distribution is shown in step 4.

Next, the word line WL(i+1) is selected so that the second stage program is likewise performed, thereby the threshold distribution as shown in step 5 is obtained. In also this second example, the first stage program for the word line WL(i+2) is already finished by the time the second stage program is performed for the word line WL(i+1).

Therefore, the inter-cell interference effect can be reduced at the data writing.

4.3 Order of Data Writing

FIG. 22 is a diagram showing the order of selecting the string units SU0 to SU7 and the word lines WL0 to WL7 for writing data in a given block BLK. The figure shows "1st" and "2nd" to indicate, respectively, the turn of each first stage program and the turn of each second stage program.

As shown in the figure, the selections according to this embodiment prioritize the word lines WL over the string units SUs, as in the case shown in FIG. 10 for the first embodiment. Note that the selections here differ from the case shown in FIG. 10 in that the first stage program is first performed for the word line WL0 in each of the string units SU0 to SU7, then the first stage program is also performed for the word line WL1 in each of the string units SU0 to SU7, and thereafter the second stage program is performed for the word line WL0 in each of the string units SU0 to SU7.

That is, upon selecting a given word line WL, the string units SU0 to SU7 are selected one by one with the selected word line WL maintained. However, the second stage program for the word line WLi in a given string unit SU is not performed until the first stage program for the word line WL(i+1) in this string unit SU is finished. This manner of ordering is common to the 2-stage programs described herein, including various read orders as will be described.

4.4 Data Read Method

Figure 23:
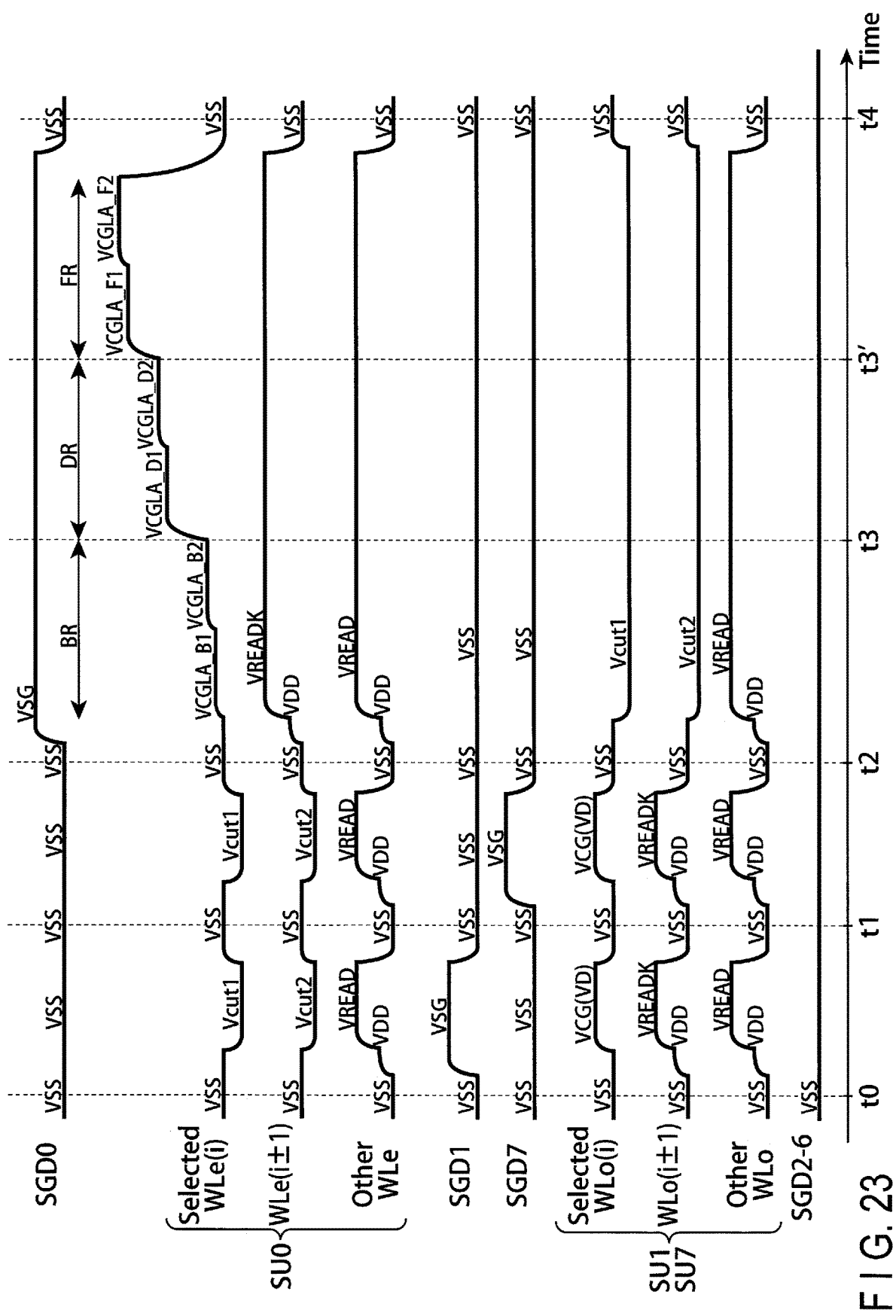
FIG. 23 is a timing chart showing changes in voltage on respective interconnects in a read operation according to the fourth embodiment.

The data read method according to the present embodiment will be described. FIG. 23 shows, by way of example, voltage on respective interconnects in data reading of the middle page data from the memory cell transistors MTi (i being one of integers 0 to 7) in the string unit SU0.

As shown in FIG. 23, the read operation is roughly similar to FIG. 11 described in the first embodiment. Note, however, that this example applies the voltage VD to the word line WLoi, as illustrated in the period from time t0 to time t2. In other words, the prior-read operation detects whether the backside cell is in "Er" to "C" states or in "D" to "G" states. The main read operation is then performed during the period from time t2 to time t4, based on the results of the prior-read operation.

More specifically, the read operation BR is performed during the period from time t2 to time t3. The row decoder 120 applies a voltage VCGLA_B1 and a voltage VCGLA_B2 to the selected word line WLei, so that data is read from the selected cells whose corresponding backside cells are in "Er" to "C" states and from the selected cells whose corresponding backside cells are in "D" to "G" states, while applications of the respective voltages.

Then, the read operation DR is performed during the period from time t3 to time t3'. Here, the row decoder 120 applies a voltage VCGLA_D1 and a voltage VCGLA_D2 to the selected word line WLei, so that data is read from the selected cells whose corresponding backside cells are in "Er" to "C" states and from the selected cells whose corresponding backside cells are in "D" to "G" states, while applications of the respective voltages.

Furthermore, the read operation FR is performed during the period from time t3' to time t4. The row decoder 120 applies a voltage VCGLA_F1 and a voltage VCGLA_F2 to the selected word line WLei, so that data is read from the selected cells whose corresponding backside cells are in "Er" to "C" states and from the selected cells whose corresponding backside cells are in "D" to "G" states, while applications of the respective voltages.

Note that, in the present embodiment, the string units SUs targeted for the prior-read operation and the bit lines BL to be sensed may be the same as those shown in FIG. 13 for the first embodiment.

4.5 Effects of Fourth Embodiment

As described above, the write method as described with reference to the first embodiment may be applied to the 2-stage program. Any of the second to third embodiment is of course applicable, as well.

5. Fifth Embodiment

Next, a semiconductor memory device according to the fifth embodiment will be described. This embodiment relates to modifications of the write order described for the fourth embodiment above. The description will in principle concentrate on the point different from the fourth embodiment.

5.1 First Example

FIG. 24 is a diagram showing the order of selecting the string units SU0 to SU7 and the word lines WL0 to WL7 according to this first example.

The selecting order according to this example prioritizes the word lines WL as in the case of the fourth embodiment, and further prioritizes the even-numbered string units SUs over the odd-numbered string units SUs.

More specifically, the string units SU0, SU2, SU4, and SU6 for the word line WL0 are each selected to execute the first stage program, and then the string units SU1, SU3, SU5, and SU7 for the same word line WL0 are each selected to execute the first stage program. Then, for the word line WL1, the string units SU0, SU2, SU4, and SU6 are each selected to execute the first stage program, and the string units SU1, SU3, SU5, and SU7 are each selected to execute the first stage program. Thereafter, the string units SU0, SU2, SU4, and SU6 for the word line WL0 are each selected to execute the second stage program, and the string units SU1, SU3, SU5, and SU7 for the word line WL0 are each selected to execute the second stage program. The data writing proceeds in the similar manner.

For the read operation performed in connection with the selecting order according to this example, the string units SUs targeted for the prior-read operation and the bit lines BL to be sensed may be the same as those shown in FIG. 15 for the second embodiment.

5.2 Second Example

FIG. 25 is a diagram showing the order of selecting the string units SU0 to SU7 and the word lines WL0 to WL7 according to the second example.

With the selecting order according to this example, the first stage program and the second stage program for each of the even-numbered string units SU are performed, and after finishing these, the first stage program and the second stage program for each of the odd-numbered string units SU are performed.

More specifically, the string units SU0, SU2, SU4, and SU6 for the word line WL0 are each selected to execute the first stage program, and then the string units SU0, SU2, SU4, and SU6 for the word line WL1 are each selected to execute the first stage program. Next, the string units SU0, SU2, SU4, and SU6 for the word line WL0 are each selected to execute the second stage program, followed by the string units SU0, SU2, SU4, and SU6 for the word line WL2 each selected to execute the first stage program. When the second stage program for the word line WL7 in the string unit SU6 is completed, the program starts with the odd-numbered string units SUs and proceeds in the similar manner.

For the read operation performed in connection with the selecting order according to this example, the string units SUs targeted for the prior-read operation and the bit lines BL to be sensed may be the same as those shown in FIG. 15 for the second embodiment.

5.3 Third Example

FIG. 26 is a diagram showing the order of selecting the string units SU0 to SU7 and the word lines WL0 to WL7 according to the third example.

With the selecting order according to this example, the word lines WL0 and WL1 in the string unit SU0 are sequentially subjected to the first stage program, and then the word lines WL0 and WL1 in the string unit SU1 are sequentially subjected to the first stage program. Subsequently, the word lines WL0 and WL1 in each of the string units SU2 to SU7 are sequentially subjected to the first stage program in the similar manner.

Thereafter, the word line WL0 in the string unit SU0 is subjected to the second stage program, followed by the word line WL2 in the string unit SU0 subjected to the first stage program. Subsequently, the word line WL0 in the string unit SU1 is subjected to the second stage program, followed by the word line WL2 in the string unit SU1 subjected to the first stage program. The data writing proceeds in the similar manner.

For the read operation performed in connection with the selecting order according to this example, the string units SU targeted for the prior-read operation and the bit lines BL to be sensed may be the same as those shown in FIG. 13 for the first embodiment.

5.4 Fourth Example

FIG. 27 is a diagram showing the order of selecting the string units SU0 to SU7 and the word lines WL0 to WL7 according to the fourth example.

This example may be regarded as the order of the third example explained with reference to FIG. 26 above, with further modification of prioritizing the even-numbered string units over the odd-numbered string units for programming.

More specifically, the word lines WL0 and WL1 in the string unit SU0 are sequentially subjected to the first stage program, and then the word lines WL0 and WL1 in the string unit SU2 are sequentially subjected to the first stage program. Subsequently, the word lines WL0 and WL1 in each of the string units SU4 and SU6 are sequentially subjected to the first stage program in the similar manner.

Then, the word lines WL0 and WL1 in each of the odd-numbered string units SU1, SU3, SU5, and SU7 are sequentially subjected to the first stage program in the similar manner.

Thereafter, the word line WL0 in the string unit SU0 is subjected to the second stage program, followed by the word line WL2 in the string unit SU0 subjected to the first stage program. Subsequently, the word line WL0 in the string unit SU2 is subjected to the second stage program, followed by the word line WL2 in the string unit SU2 subjected to the first stage program. The similar programming proceeds with the word lines WL0 and WL2 in each of the even-numbered string units SU4 and SU6, and then with the word lines WL0 and WL2 in each of the odd-numbered string units SU1, SU3, SU5, and SU7. Thereafter, the alternate programming of the applicable even-numbered string unit and odd-numbered string unit similarly proceeds.

For the read operation performed in connection with the selecting order according to this example, the string units SU targeted for the prior-read operation and the bit lines BL to be sensed may be the same as those shown in FIG. 15 for the second embodiment.

5.5 Fifth Example

FIG. 28 is a diagram showing the order of selecting the string units SU0 to SU7 and the word lines WL0 to WL7 according to the fifth example.

The selecting order according to this example prioritizes the even-numbered string units over the odd-numbered string units for programming, as the order of the fourth example explained with reference to FIG. 27.

More specifically, the word lines WL0 and WL1 in the string unit SU0 are sequentially subjected to the first stage program, and then the word lines WL0 and WL1 in the string unit SU2 are sequentially subjected to the first stage program. Subsequently, the word lines WL0 and WL1 in each of the string units SU4 and SU6 are sequentially subjected to the first stage program in the similar manner.

Thereafter, the word line WL0 in the string unit SU0 is subjected to the second stage program, followed by the word line WL2 in the string unit SU0 subjected to the first stage program. Subsequently, the word line WL0 in the string unit SU2 is subjected to the second stage program, followed by the word line WL2 in the string unit SU2 subjected to the first stage program. Then, the similar programming proceeds with the even-numbered string units SU4 and SU6, and further, the applicable, remaining word lines WL1 to WL7 in the even-numbered string units SU0, SU2, SU4, and SU6 are likewise subjected to the programming. Upon finishing the write with the even-numbered string units SU0, SU2, SU4, and SU6, the odd-numbered string units SU1, SU3, SU5, and SU7 are subjected to the first stage program and the second stage program.

For the read operation performed in connection with the selecting order according to this example, the string units SU targeted for the prior-read operation and the bit lines BL to be sensed may be the same as those shown in FIG. 15 for the second embodiment.

5.6 Sixth Example

FIG. 29 is a diagram showing the order of selecting the string units SU0 to SU7 and the word lines WL0 to WL7 according to the sixth example.

The selecting order according to this example basically subjects one word line WLk (k being one of integers 1 to 7) in the string unit SU0 to the first stage program, next subjects another word line WL(k−1) in the same string unit SU0 to the second stage program, and sequentially repeats this order for the string units SU1 to SU7.

For the read operation performed in connection with the selecting order according to this example, the string units SUs targeted for the prior-read operation and the bit lines BL to be sensed may be the same as those shown in FIG. 13 for the first embodiment.

5.7 Seventh Example

FIG. 30 is a diagram showing the order of selecting the string units SU0 to SU7 and the word lines WL0 to WL7 according to the seventh example.

This example may be regarded as the order of the sixth example explained with reference to FIG. 29, with further modification of subjecting one word line WLk (k being one of integers 1 to 7) in the string unit SU0 to the first stage program, next subjecting another word line WL(k−1) in the same string unit SU0 to the second stage program, and repeats this order for the even-numbered string units SU2, SU4, and SU6, first. The similar programming is then repeated for the odd-numbered string units SU1, SU3, SU5, and SU7.

For the read operation performed in connection with the selecting order according to this example, the string units SUs targeted for the prior-read operation and the bit lines BL to be sensed may be the same as those shown in FIG. 15 for the second embodiment.

5.8 Eighth Example

FIG. 31 is a diagram showing the order of selecting the string units SU0 to SU7 and the word lines WL0 to WL7 according to the eighth example.

With the selecting order according to this example, the even-numbered string units SU0, SU2, SU4, and SU6 are first subject to the data writing, following the rule in the seventh example explained with reference to FIG. 30.

Upon finishing the write with the even-numbered string units SU0, SU2, SU4, and SU6, the odd-numbered string units SU1, SU3, SU5, and SU7 are subjected to the data writing according to the similar rule.

For the read operation performed in connection with the selecting order according to this example, the string units SUs targeted for the prior-read operation and the bit lines BL to be sensed may be the same as those shown in FIG. 15 for the second embodiment.

5.9 Effects of Fifth Embodiment

As exemplified, the embodiment allows for various write orders for the 2-stage program. Adopting any of these write orders can reduce the inter-cell interference effect from backside cells and neighboring cells.

6. Sixth Embodiment

A semiconductor memory device according to the sixth embodiment will be described. Similar to the fifth embodiment, this sixth embodiment relates to modifications of the writing order described for the fourth embodiment above, and is applicable to the second write method example explained with reference to FIG. 21 for the fourth embodiment. The description will in principle concentrate to the point different from the fourth and the fifth embodiments.

6.1 First Example

FIG. 32 is a diagram showing the order of selecting the string units SU0 to SU7 and the word lines WL0 to WL7 according to the first example of this embodiment.

The write order according to this example is, for the word lines WL2 to WL7, the same as the order shown in FIG. 29 for the fifth embodiment. That is, according to the present example, the first stage program is performed for the word line WL0 in the order from the string units SU0 to SU7. Then, the first stage program for the word line WL1 and the second stage program for the word line WL0 are performed in each of the string units SU0 to SU7.

The remaining programming proceeds in the same manner as shown in FIG. 29.

For the read operation performed in connection with the selecting order according to this example, the string units SU targeted for the prior-read operation and the bit lines BL to be sensed may be the same as those shown in FIG. 13 for the first embodiment.

6.2 Second Example

FIG. 33 is a diagram showing the order of selecting the string units SU0 to SU7 and the word lines WL0 to WL7 according to the second example of this embodiment.

The write order according to this example is, for the word lines WL2 to WL7, the same as the order shown in FIG. 30 for the fifth embodiment. With regard to the word lines WL0 and WL1, the first stage program is first performed for the word line WL0 in each of the even-numbered string units SU0, SU2, SU4, and SU6, and then performed for the word line WL0 in each of the odd-numbered string units SU1, SU3, SU5, and SU7. Then, the first stage program for the word line WL1 and the second stage program for the word line WL0 are performed in each of the even-numbered string units SU0, SU2, SU4, and SU6. Thereafter, the similar programming is performed for each of the odd-numbered string units SU1, SU3, SU5, and SU7. The remaining programming proceeds in the same manner as shown in FIG. 30.

For the read operation performed in connection with the selecting order according to this example, the string units SUs targeted for the prior-read operation and the bit lines BL to be sensed may be the same as those shown in FIG. 15 for the second embodiment.

6.3 Third Example

FIG. 34 is a diagram showing the order of selecting the string units SU0 to SU7 and the word lines WL0 to WL7 according to the third example of this embodiment.

The write order according to this example is, for the word lines WL2 to WL7, the same as the order shown in FIG. 31 for the fifth embodiment. With regard to the word lines WL0 and WL1, the first stage program is first performed for the word line WL0 in each of the even-numbered string units SU0, SU2, SU4, and SU6, and then, the first stage program for the word line WL1 and the second stage program for the word line WL0 are performed in each of the even-numbered string units SU0, SU2, SU4, and SU6. The similar programming is performed for each of the odd-numbered string units SU1, SU3, SU5, and SU7, as well. The remaining programming proceeds in the same manner as shown in FIG. 31.

For the read operation performed in connection with the selecting order according to this example, the string units SUs targeted for the prior-read operation and the bit lines BL to be sensed may be the same as those shown in FIG. 15 for the second embodiment.

6.4 Effects of Sixth Embodiment

As exemplified, the embodiment allows for various write orders for the second write method example described for the fourth embodiment. Also, the write orders according to this sixth embodiment enable each second stage program to be undertaken more promptly than in the cases of, for example, writing data simply in the order of the string units SU as shown in FIG. 22. As such, the embodiment allows the controller 200 to shorten the period for holding write data, and can consequently reduce the capacity of the buffer memory in the controller 200.

7. Seventh Embodiment

A semiconductor memory device according to the seventh embodiment will be described. This embodiment relates to a data read method that is performed in connection with the first data writing example, i.e., the first example of the 2-stage program, explained for the fourth embodiment, and that takes into account the inter-cell interference effect from the word line WL(i+1) as explained with reference to the third embodiment. The description will be given with particular reference to the inter-cell interference effect from the word line WL(i+1).

7.1 For Memory Cells Storing Three-Bit Data

First, the description will assume instances where each memory cell stores three-bit data, as explained with reference to FIG. 19 for the fourth embodiment. FIG. 35 shows the second stage program in the 2-stage program described with reference to FIG. 20. According to the 2-stage program, the second stage program is performed after the first stage program for a drain-side neighboring memory cell is done. An inter-cell interference effect from the neighboring cell in the second stage program can be reduced.

However, even with this 2-stage program technique, completely eliminating the inter-cell interference effect is difficult. For example, it might be the case with the first data writing example in the fourth embodiment that an inter-cell interference effect caused by the second stage program is more than a negligible amount. FIG. 35 shows this situation. As discussed, the cell state is caused to transition from the "Er" state to one of the "A" state, the "B" state, and the "C" state, or from the "LM" state to one of the "D" state, the "E" state, the "F" state, and the "G" state in the second stage program. On this occasion, the inter-cell interference effect in the event of transition from the "Er" state to the higher state, e.g., the "B" state or the "C" state, or in the event of transition from the "LM" state to the higher state, e.g., the "F" state or the "G" state, might shift the threshold of the neighboring memory cell, which is arranged consecutively on the source side and for which the data writing has already been done.

Accordingly, the present embodiment utilizes the prior-read operations to specify the memory cells having been written and placed in such a high threshold state. Then, the embodiment uses, as in the third embodiment, compensating read voltages according also to the data stored in the corresponding backside cell. FIG. 36A and FIG. 36B each show the possible results of the prior-read operation for the word line WL(i+1) and the possible results of the prior-read operation with the backside cell, and lists the read voltages for use in each instance of the combinations of these prior-reading results. The degree of the inter-cell interference effect in each instance is also shown.

First, FIG. 36A will be explained. In FIG. 36A, as in FIG. 18B, the backside cell is categorized in either the group of lower thresholds (i.e., the "Er" state, the "A" state, the "B" state, and the "C" state), or in the group of higher thresholds (i.e., the "D" state, the "E" state, the "F" state, and the "G" state). Note that the neighboring cell coupled to the word line WL(i+1) is categorized in either the group of small threshold transitions (i.e., the "Er" state, the "A" state, the "D" state, and the "E" state), or in the group of large threshold transitions (i.e., the "B" state, the "C" state, the "F" state, and the "G" state), as explained with reference to FIG. 35.

As given in the figure, the selected cell MTi has been exposed to the small inter-cell interference effect when the backside cell is in one of the "Er" state, the "A" state, the "B" state, and the "C" state, and the neighboring cell coupled to the word line WL(i+1) is in one of the "Er" state, the "A" state, the "D" state, and the "E" state. Accordingly, the voltages VCGLA_A1, VCGLA_B1, VCGLA_C1, VCGLA_D1, VCGLA_E1, VCGLA_F1, and VCGLA_G1 are used as read voltages for such a selected cell MTi, and data is sensed and strobed while application of these voltages. These voltages may be equal to, for example, the respective voltages VA, VB, VC, VD, VE, VF, and VG.

On the other hand, the selected cell MTi has been exposed to the large inter-cell interference effect when the backside cell is in one of the "D" state, the "E" state, the "F" state, and the "G" state, and the neighboring cell coupled to the word line WL(i+1) is in one of the "B" state, the "C" state, the "F" state, and the "G" state. In this case, thus, the voltages VCGLA_A4, VCGLA_B4, VCGLA_C4, VCGLA_D4, VCGLA_E4, VCGLA_F4, and VCGLA_G4 are used as read voltages for such a selected cell MTi, and data is sensed and strobed while application of these voltages. The voltages are in the relationships of VCGLA_A4>VCGLA_A1,
VCGLA_B4>VCGLA_B1,
VCGLA_C4>VCGLA_C1,
VCGLA_D4>VCGLA_D1,
VCGLA_E4>VCGLA_E1,
VCGLA_F4>VCGLA_F1, and
VCGLA_G4>VCGLA_G1.

Also, when the backside cell is in one of the "Er" state, the "A" state, the "B" state, and the "C" state, and the neighboring cell coupled to the word line WL(i+1) is in one of the "B" state, the "C" state, the "F" state, and the "G" state, the selected cell MTi has been exposed to a medium degree of the inter-cell interference effect, which is intermediate between the degrees of the above two cases. Thus, in this case, the voltages VCGLA_A2, VCGLA_B2, VCGLA_C2, VCGLA_D2, VCGLA_E2, VCGLA_F2, and VCGLA_G2 are used as read voltages for such a selected cell MTi, and data is sensed and strobed while application of these voltages. The voltages are in the relationships of VCGLA_A4>VCGLA_A2>VCGLA_A1,
VCGLA_B4>VCGLA_B2>VCGLA_B1,
VCGLA_C4>VCGLA_C2>VCGLA_C1,
VCGLA_D4>VCGLA_D2>VCGLA_D1,
VCGLA_E4>VCGLA_E2>VCGLA_E1,
VCGLA_F4>VCGLA_F2>VCGLA_F1, and
VCGLA_G4>VCGLA_G2>VCGLA_G1.

When the backside cell is in one of the "D" state, the "E" state, the "F" state, and the "G" state, and the neighboring cell coupled to the word line WL(i+1) is in one of the "Er" state, the "A" state, the "D" state, and the "E" state, the selected cell MTi has likewise been exposed to the medium degree of the inter-cell interference effect, which is intermediate between the degrees of the two cases (the smallest and largest degrees). Thus, in this case, the voltages VCGLA_A3, VCGLA_B3, VCGLA_C3, VCGLA_D3, VCGLA_E3, VCGLA_F3, and VCGLA_G3 are used as read voltages for such a selected cell MTi, and data is sensed and strobed while application of these voltages. The voltages are in the relationships of VCGLA_A4>VCGLA_A3>VCGLA_A1,
VCGLA_B4>VCGLA_B3>VCGLA_B1,
VCGLA_C4>VCGLA_C3>VCGLA_C1,
VCGLA_D4>VCGLA_D3>VCGLA_D1,
VCGLA_E4>VCGLA_E3>VCGLA_E1,
VCGLA_F4>VCGLA_F3>VCGLA_F1, and
VCGLA_G4>VCGLA_G3>VCGLA_G1.

The voltages VCGLA_A3, VCGLA_B3, VCGLA_C3, VCGLA_D3, VCGLA_E3, VCGLA_F3, and VCGLA_G3 may be larger than, smaller than, or equal to the respective voltages VCGLA_A2, VCGLA_B2, VCGLA_C2, VCGLA_D2, VCGLA_E2, VCGLA_F2, and VCGLA_G2.

Next, FIG. 36B will be explained. In the example shown in FIG. 36B, the backside cell is also categorized in either the group of small threshold transitions (i.e., the "Er" state, the "A" state, the "D" state, and the "E" state), or in the group of large threshold transitions (i.e., the "B" state, the "C" state, the "F" state, and the "G" state), as the categorization for the neighboring cell.

Accordingly, as given in FIG. 36B, the selected cell MTi has been exposed to the small inter-cell interference effect when the backside cell and the neighboring cell coupled to the word line WL(i+1) are both in one of the "Er" state, the "A" state, the "D" state, and the "E" state. Thus, the voltages VCGLA_A1, VCGLA_B1, VCGLA_C1, VCGLA_D1, VCGLA_E1, VCGLA_F1, and VCGLA_G1 as discussed above are used as read voltages for such a selected cell MTi, and data is sensed and strobed while application of these voltages.

On the other hand, the selected cell MTi has been exposed to the large inter-cell interference effect when the backside cell and the neighboring cell coupled to the word line WL(i+1) are both in one of the "B" state, the "C" state, the "F" state, and the "G" state. In this case, accordingly, the voltages VCGLA_A4, VCGLA_B4, VCGLA_C4, VCGLA_D4, VCGLA_E4, VCGLA_F4, and VCGLA_G4 as discussed above are used as read voltages for such a selected cell MTi.

Also, when the backside cell is in one of the "Er" state, the "A" state, the "D" state, and the "E" state, and the neighboring cell coupled to the word line WL(i+1) is in one of the "B" state, the "C" state, the "F" state, and the "G" state, the selected cell MTi has been exposed to a medium degree of the inter-cell interference effect, which is intermediate between the degrees of the above two cases. Accordingly, the voltages VCGLA_A2, VCGLA_B2, VCGLA_C2, VCGLA_D2, VCGLA_E2, VCGLA_F2, and VCGLA_G2 as discussed above are used as read voltages for such a selected cell MTi.

When the backside cell is in one of the "B" state, the "C" state, the "F" state, and the "G" state, and the neighboring cell coupled to the word line WL(i+1) is in one of the "Er" state, the "A" state, the "D" state, and the "E" state, the selected cell MTi has likewise been exposed to the medium degree of the inter-cell interference effect, and the voltages VCGLA_A3, VCGLA_B3, VCGLA_C3, VCGLA_D3, VCGLA_E3, VCGLA_F3, and VCGLA_G3 as discussed above are used as read voltages for such a selected cell MTi.

Figure 37:
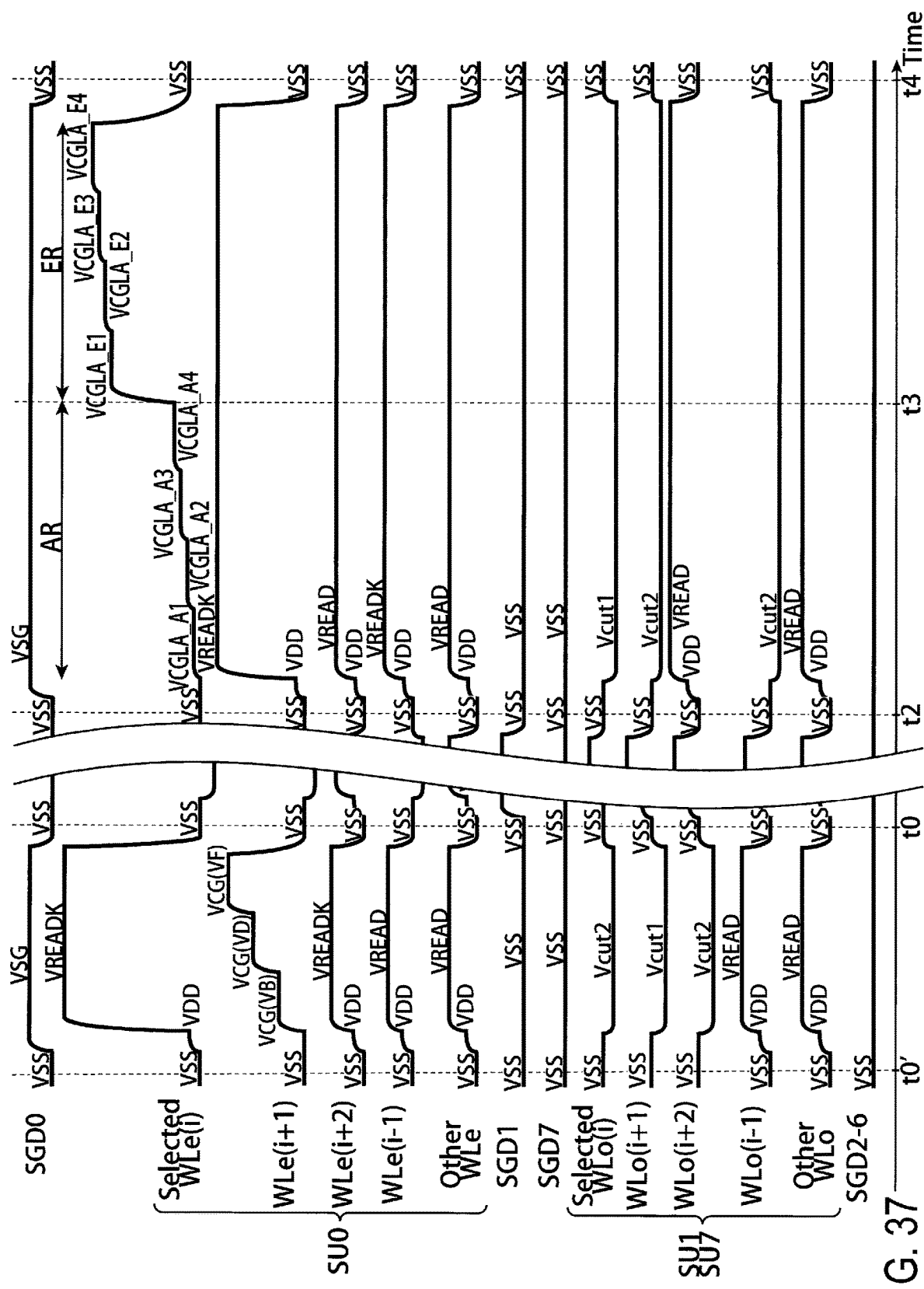
FIG. 37 is a timing chart showing changes in voltage on respective interconnects in a read operation according to the example of the seventh embodiment.

FIG. 37 is related to the read method according to this embodiment, and corresponds to FIG. 18A referred to for the third embodiment. As in FIG. 18A, the prior-read operation for the word line WL(i+1) is performed during the period from time t0' to time t0. Note, however, that FIG. 37 shows an example that assumes that the memory cells each store three-bit data and that the lower page data among them is the read target.

As illustrated in the figure, during the period from time t0' to time t0, the row decoder 120 selects the word line WL(i+1) in the string unit SU0 and applies the read voltage VCG to the word line WL(i+1). Thus, data is read from the memory cells coupled to the word line WL(i+1), as the prior-read operation. This example involves the read operations BR, DR, and FR, as shown in FIG. 35. Accordingly, the voltages VB, VD, and VF are used as the read voltage VCG. As in FIG. 37, the voltages VB, VD, and VF are sequentially applied to the word line WL(i+1). The remaining aspects are the same as shown in FIG. 18A.

As a result, it is found out that the memory cells having been turned off by the read operation BR and then turned on by the read operation DR, and the memory cells having been turned off by the read operation FR, are in one of the "B" state, the "C" state, the "F" state, and the "G" state.

Subsequently, data is read from the backside cells during the period from time t0 to time t2. If the categorization rule explained with reference to FIG. 36A is adopted, operations performed during the period from time t0 to time t2 are similar to those shown in FIG. 18A. Note, however, that the read voltage applied to each word line WLi is the voltage VD, instead of the voltage VB. If the categorization rule explained with reference to FIG. 36B is adopted, the word lines WLi in the respective string units SU1 and SU7 are each applied, during the respective periods from time t0 to time t1 and from time t1 to time t2, the voltages VB, VD, and VF as the read voltage VCG, as in the case of the word line WL(i+1) in the string unit SU0 during the period from time t0' to time to.

Thereafter, data is read from the memory cells coupled to the word line WLi in the string unit SU0, during the period from time t2 to time t4. More specifically, the read operation AR is performed during the period from time t2 to time t3 using the read voltages VCGLA_A1, VCGLA_A2, VCGLA_A3, and VCGLA_A4. The read operation ER is then performed during the period from time t3 to time t4 using the read voltages VCGLA_E1, VCGLA_E2, VCGLA_E3, and VCGLA_E4.

Additionally, FIG. 37, while showing the processes of reading data from the lower page, is also applicable to the processes of reading data from the middle page and the upper page, provided that the voltages applied to the selected word line WLi during the main read operation are different from FIG. 37. To read middle page data, the word line WLi is applied the voltages VCGLA_B1, VCGLA_B2, VCGLA_B3, and VCGLA_B4 for the read operation BR, then the voltages VCGLA_D1, VCGLA_D2, VCGLA_D3, and VCGLA_D4 for the read operation DR, and further the voltages VCGLA_F1, VCGLA_F2, VCGLA_F3, and VCGLA_F4 for the read operation FR. To read upper page data, the word line WLi is applied the voltages VCGLA_C1, VCGLA_C2, VCGLA_C3, and VCGLA_C4 for the read operation CR, and further the voltages VCGLA_G1, VCGLA_G2, VCGLA_G3, and VCGLA_G4 for the read operation GR.

7.2 For Memory Cells Storing Two-Bit Data

Figure 38:
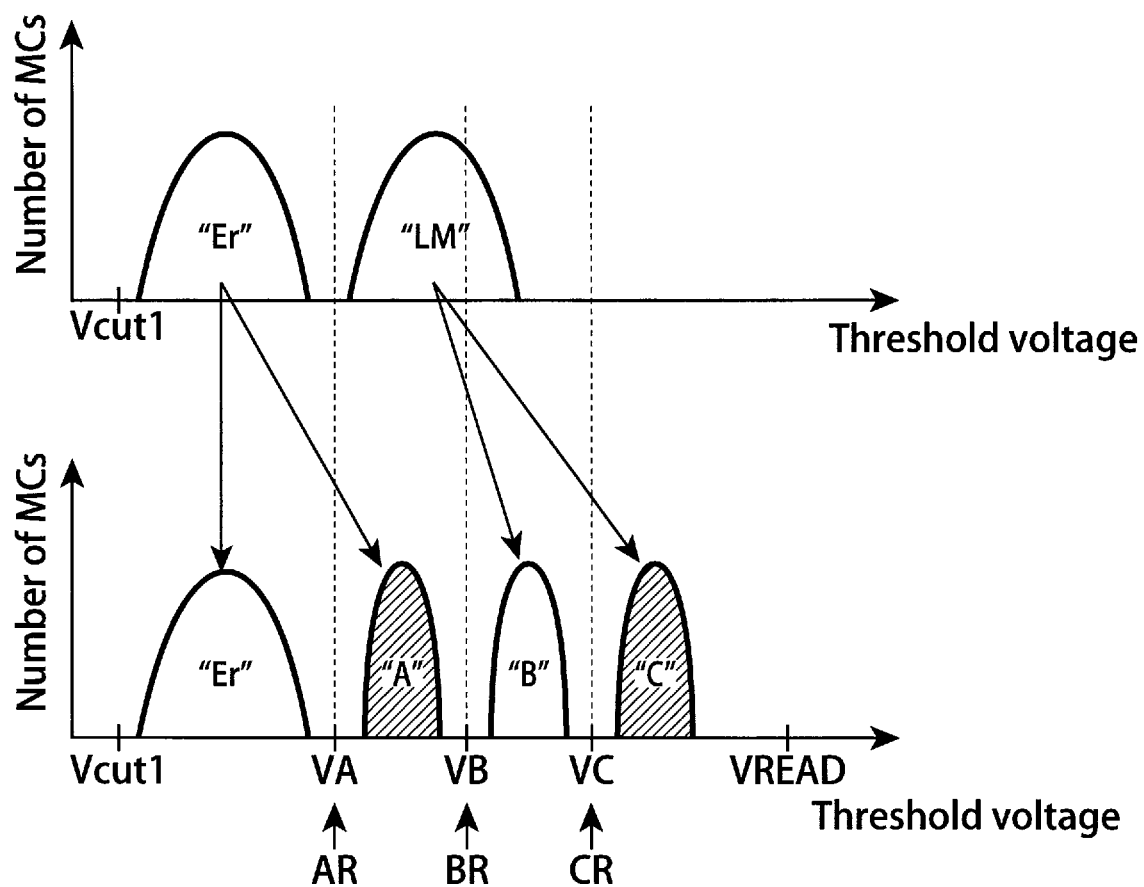
FIG. 38 includes graphs showing threshold transitions appearing in a data write method related to another example of the seventh embodiment.

Next, the description will assume instances where each memory cell stores two-bit data, as explained with reference to FIG. 9 for the first embodiment. FIG. 38 shows the second stage program in the 2-stage program, similar to what is shown in FIG. 35. Where memory cells each storing two-bit data are used, the inter-cell interference effect due to programming of causing the state of one memory cell to transition from the "Er" state to the "A" state, or from the "LM" state to the "C" state, might shift the threshold of the neighboring memory cell, which is arranged consecutively on the source side and for which the data writing has already been done.

FIG. 39A and FIG. 39B each show the possible results of the prior-read operation for the word line WL(i+1) and the possible results of the prior-read operation with the backside cell, and lists the read voltages for use in each instance of the combinations of the prior-reading results. The degree of the inter-cell interference effect in each instance is also shown.

First, FIG. 39A will be explained. In FIG. 39A, as in FIG. 36A, the backside cell is categorized in either the group of lower thresholds (i.e., the "Er" state and the "A" state), or in the group of higher thresholds (i.e., the "B" state and the "C" state). The neighboring cell coupled to the word line WL(i+1) is categorized in either the group of small threshold transitions (i.e., the "Er" state and the "B" state), or in the group of large threshold transitions (i.e., the "A" state and the "C" state).

As given in the figure, the selected cell MTi has been exposed to the small inter-cell interference effect when the backside cell is in the "Er" state or the "A" state, and the neighboring cell coupled to the word line WL(i+1) is in the "Er" state or the "B" state. Thus, the voltages VCGLA_A1, VCGLA_B1, and VCGLA_C1 are used as read voltages for such a selected cell MTi, and data is sensed and strobed while application of these voltages. These voltages may be equal to, for example, the respective voltages VA, VB, and VC.

On the other hand, the selected cell MTi has been exposed to the large inter-cell interference effect when the backside cell is in the "B" state or the "C" state, and the neighboring cell coupled to the word line WL(i+1) is in the "A" state or the "C" state. Thus, the voltages VCGLA_A4, VCGLA_B4, and VCGLA_C4 are used as read voltages for such a selected cell MTi, and data is sensed and strobed while application of these voltages.

Further, when the backside cell is in the "Er" state or the "A" state, and the neighboring cell coupled to the word line WL(i+1) is in the "A" state or the "C" state, or when the backside cell is in the "B" state or the "C" state, and the neighboring cell coupled to the word line WL(i+1) is in the "Er" state or the "B" state, the selected cell MTi has been exposed to a medium degree of the inter-cell interference effect, which is intermediate between the degrees of the above two cases.

Next, FIG. 39B will be explained. In FIG. 39B, as in FIG. 36B, the backside cell is also categorized in either the group of small threshold transitions (i.e., the "Er" state and the "B" state), or in the group of large threshold transitions (i.e., the "A" state and the "C" state), as the categorization for the neighboring cell.

As such, the selected cell MTi has been exposed to the small inter-cell interference effect when the backside cell and the neighboring cell coupled to the word line WL(i+1) are both in the "Er" state or the "B" state, as shown in FIG. 39B. Accordingly, the voltages VCGLA_A1, VCGLA_B1, and VCGLA_C1 as discussed above are used as read voltages for such a selected cell MTi.

On the other hand, the selected cell MTi has been exposed to the large inter-cell interference effect when the backside cell and the neighboring cell coupled to the word line WL(i+1) are both in the "A" state or the "C" state. Accordingly, the voltages VCGLA_A4, VCGLA_B4, and VCGLA_C4 as discussed above are used as read voltages for such a selected cell MTi.

Further, when the backside cell is in the "Er" state or the "B" state, and the neighboring cell coupled to the word line WL(i+1) is in the "A" state or the "C" state, or when the backside cell is in the "A" state or the "C" state, and the neighboring cell coupled to the word line WL(i+1) is in the "Er" state or the "B" state, the selected cell MTi has been exposed to a medium degree of the inter-cell interference effect, which is intermediate between the degrees of the above two cases.

Figure 40:
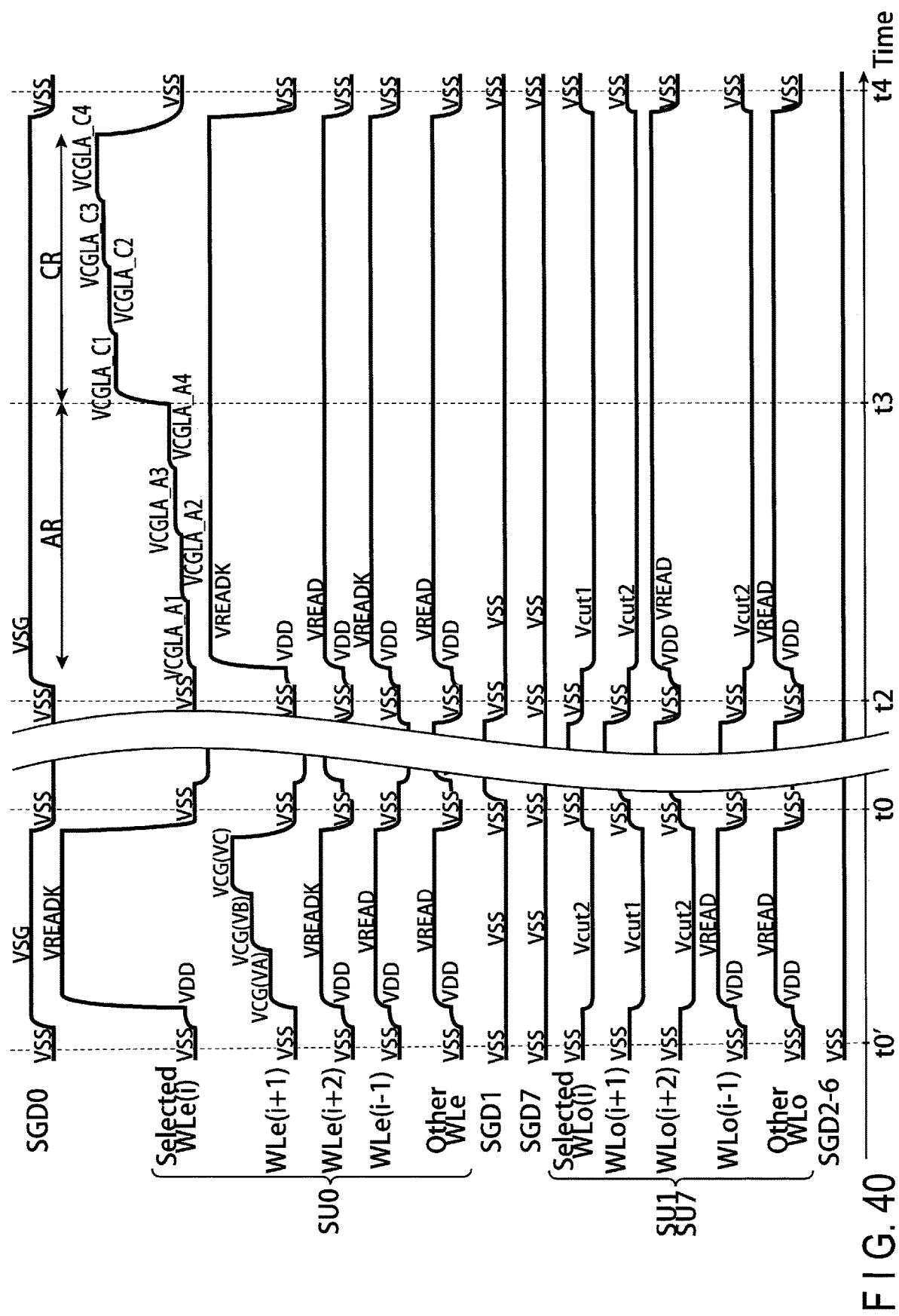
FIG. 40 is a timing chart showing changes in voltage on respective interconnects in a read operation according to another example of the seventh embodiment.

FIG. 40 is related to the read method according to this embodiment, and corresponds to FIG. 37 referred to for the preceding example of three-bit data case. As in FIG. 37, the prior-read operation for the word line WL(i+1) is performed during the period from time t0' to time t0. Note, however, that FIG. 40 shows an example that assumes that the memory cells each retain two-bit data and that the upper page data among them is the read subject.

As illustrated in the figure, during the period from time t0' to time t0, the row decoder 120 selects the word line WL(i+1) in the string unit SU0 and applies the read voltage VCG to the word line WL(i+1). Thus, data is read from the memory cells coupled to the word line WL(i+1), as the prior-read operation. This example involves the read operations AR, BR, and CR, as shown in FIG. 38. Accordingly, the voltages VA, VB, and VC are sequentially applied to the word line WL(i+1). The remaining aspects are the same as shown in FIG. 37. As a result, the memory cells having been turned off by the read operation AR and then turned on by the read operation BR are found to be in the "A" state, and the memory cells having been turned off by the read operation CR are found to be in the "C" state.

Subsequently, data is read from the backside cells during the period from time t0 to time t2. If the categorization rule explained with reference to FIG. 39A is adopted, operations performed during the period from time t0 to time t2 are similar to those shown in FIG. 18A. If, on the other hand, the categorization rule explained with reference to FIG. 39B is adopted, the word lines WLi in the respective string units SU1 and SU7 are each applied, during the respective periods from time t0 to time t1 and from time t1 to time t2, the voltages VA, VB, and VC as the sequentially-changing read voltage VCG, as in the case of the word line WL(i+1) in the string unit SU0 during the period from time t0' to time t0.

Thereafter, data is read from the memory cells coupled to the word line WLi in the string unit SU0, during the period from time t2 to time t4, which is the same as those illustrated in the period from time t2 to time t4, in FIG. 18A.

7.3 Effects of Seventh Embodiment

As described above, the inter-cell interference effect varies depending on write methods. For example, according to the 2-stage program as explained with reference to FIG. 20, the degree of the inter-cell interference effect will differ depending on the write data in the second stage program. More specifically, if the second stage program for the corresponding backside cell or neighboring cell has introduced a large threshold transition, the selected cell undergoes a large inter-cell interference effect. As above, determining the values of the read voltage VCGLA based on the inter-cell interference effect due to the write method allows for the improvement in read accuracy.

Note that the present embodiment has been described using the examples where the inter-cell interference effect from the backside cell and that from the neighboring cell are each categorized in two cases, i.e., when it is of a large degree and when it is of a small degree. Thus, four situations have been assumed for the combined inter-cell interference effect as given in FIG. 36A, FIG. 36B, FIG. 39A, and FIG. 39B, namely, when the degree of the combined effect is large, when it is medium (in two patterns), and when it is small. Of course, categorizing the degree of the inter-cell interference effects from the backside cell and the neighboring cell need not be limited to such two cases, e.g., large and small, but may be done with more detailed criteria. Categorization with detailed criteria can further enhance the read accuracy.

8. Eighth Embodiment

A semiconductor memory device according to the eighth embodiment will be described. This embodiment is directed the operations of the sense amplifier in the prior-read operation and the main read operation described for the foregoing first to seventh embodiments. The description will in principle concentrate to the point different from the first to the seventh embodiments.

8.1 Configuration of Sense Amplifier

First, the configuration of the sense amplifier 140 according to the present embodiment will be described, referring to FIG. 41. FIG. 41 is a circuit diagram of the sense amplifier 140 according to the embodiment, showing together the string unit SU0.

As shown in figure, the sense amplifier 140 includes sense amplifier units SAU (SAU0 to SAU(L−1)) for the respective bit lines BL.

The sense amplifier unit SAUs each include a sense unit SA, an arithmetic operation unit OP, and latch circuits DL0, DL1, DL2, and XDL.

The sense unit SA reads data from the memory cell by sensing the voltage on the corresponding bit line BL, and writes data to the memory cell by applying voltages to the bit line BL according to write data. That is, the sense unit SA is a module for directly controlling the corresponding bit line BL. In the read operation, the sense unit SA receives a strobe signal STB by, for example, the sequencer 170. The sense unit SA determines the read data at the timing that the signal STB is asserted (according to the definition as used in this embodiment, data "0" is set in response to a memory cell becoming on, and data "1" is set in response to a memory cell becoming off). The sense unit SA stores this data in its internal latch circuit (not illustrated in FIG. 41), and transfers the data to one of the latch circuits DL0, DL1, DL2, and XDL.

The latch circuits DL0, DL1, DL2, and XDL are each temporarily store the read data and the write data. The arithmetic operation unit OP performs various logical operations including the NOT operation, the OR operation, the AND operation, the XOR operation, and the XNOR operation, for the data held by the sense unit SA and the latch circuits DL0, DL1, DL2, and XDL. The sense unit SA and the latch circuits DL0, DL1, DL2, and XDL are connected to one another via a bus so that the transfer of the data is enabled among them.

The sense amplifier 140 performs data inputs and outputs with externals via the latch circuits XDL. That is, data received from the controller 200 is sent to the latch circuit DL0, DL1, or DL2, or the sense unit SA, via the corresponding latch circuit XDL. Also, data in the latch circuit DL0, DL1, or DL2, or the sense unit SA, is sent to the controller 200 via the corresponding latch circuit XDL. The latch circuits XDL function as a cache memory in the NAND flash memory 100. As such, even when the latch circuits DL0, DL1, and DL2 are all in use, the NAND flash memory 100 can be placed in the ready state if the latch circuits XDL are available.

The description continues, and will now go into more details about how the sense amplifier 140 operates in the prior-read operation and the main read operation described for the foregoing first to seventh embodiments.

8.2 First Example

As a first example, an instance will be assumed, where the inter-cell interference effect from the backside cells is to be compensated for but the inter-cell interference effect from the neighboring cells coupled to the word line WLi(i+1) is disregarded. It will be assumed that the memory cells in this first example store two-bit data. Also, the data writing in this example adopts the order shown in FIG. 10 explained with reference to the first embodiment, and the data reading in this example is performed by the method explained with reference to FIG. 12.

Figure 42:
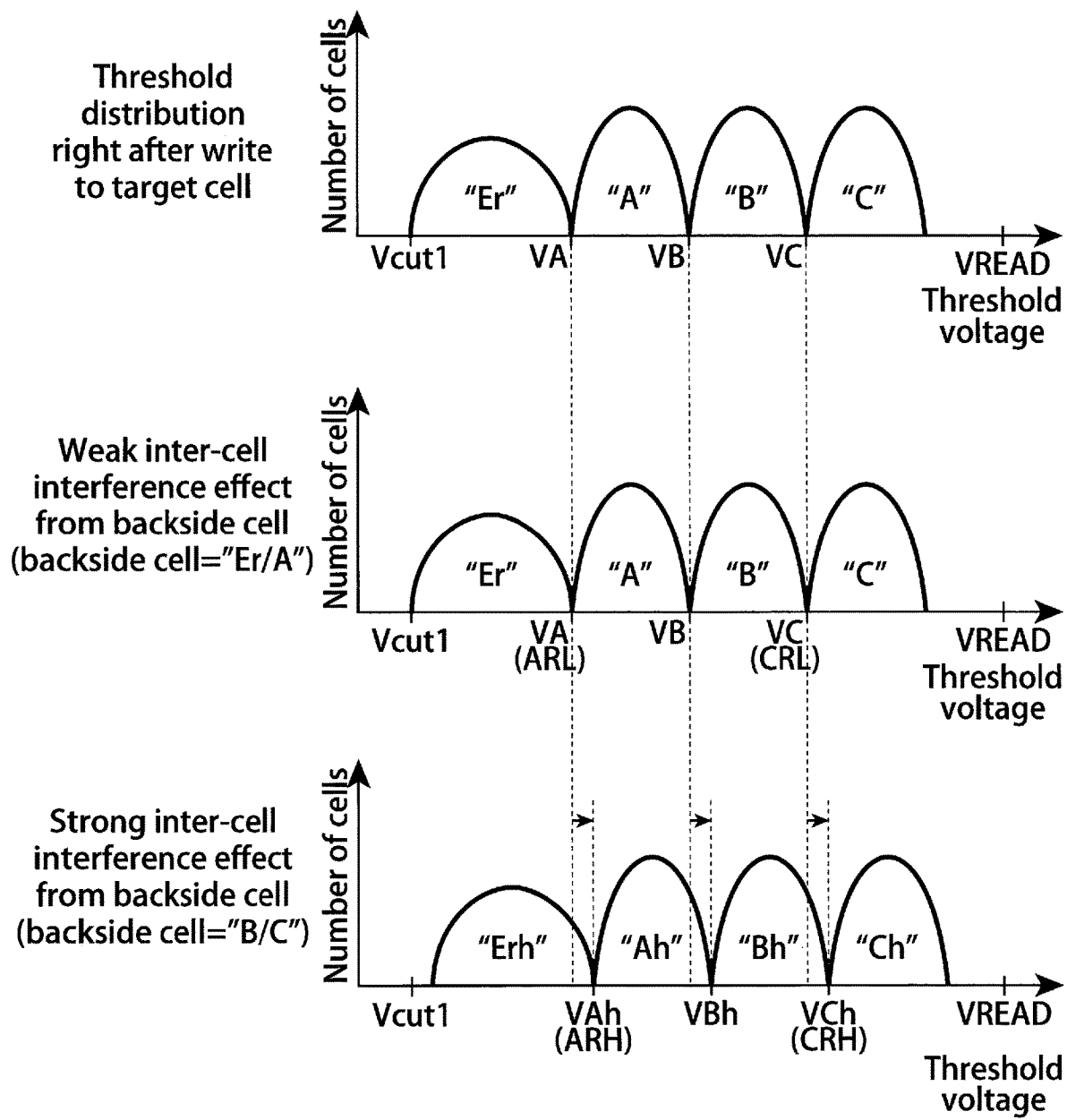
FIG. 42 includes graphs showing threshold distributions of memory cells before and after undergoing an inter-cell interference effect in a first example of the eighth embodiment.

It will also be assumed that the example deals with the threshold changes as shown in FIG. 42 which have occurred in the memory cells coupled to the word line WLi in the string unit SU3, due to the inter-cell interference effect from the backside cells. As illustrated in the figure, the voltages VA, VB, and VC each reside between the applicable threshold distributions when the data writing with the selected cells has just completed. Thereafter, data writing with the corresponding backside cells exerts the inter-cell interference effect on the selected cells in which the data has already been written. The degree of the inter-cell interference effect varies depending on the data written in the corresponding backside cell. That is, if the backside cell, upon being subjected to the data writing, has involved a large threshold transition, the degree of its inter-cell interference effect is large, and if the threshold transition has been small, the degree of the inter-cell interference effect is small. By way of example here, the description with reference to FIG. 42 assumes that, if the states according to the threshold of the backside cells are maintained in the "Er" state or placed in the "A" state, the inter-cell interference effect is practically absent, and no shifts of the threshold distributions of the corresponding selected cells are caused. On the other hand, if the threshold states of the backside cells are placed in the "B" state or the "C" state, a large inter-cell interference effect is assumed, and the threshold distributions of the selected cells are shifted toward the higher voltage side. The voltages between the threshold distributions after the shift toward the higher voltage side will be referred to as a voltage VAh, a voltage VBh, and a voltage VCh, respectively, and the states according to the shifted threshold distributions will be referred to as an "Erh" state, an "Ah" state, a "Bh" state, and a "Ch" state, respectively.

As will be appreciated, the read operation AR for reading the upper page includes an operation using the read voltage VA, which will be referred to as a read operation ARL, and an operation using the read voltage VAh, which will be referred to as a read operation ARH. Also, the read operation CR includes an operation using the read voltage VC, which will be referred to as a read operation CRL, and an operation using the read voltage VCh, which will be referred to as a read operation CRH. That is, when they are applied to FIG. 12 explained for the first embodiment, they are in the following relationships.

Read operation AR: Set of ARL and ARH
   VCGLA_A1=VA
   VCGLA_A2=VAh

Read operation CR: Set of CRL and CRH
   VCGLA_C1=VC
   VCGLA_C2=VCh

FIG. 43 shows the internal operations of the sense amplifier 140 for performing the operations corresponding to FIG. 12. In FIG. 43, one column of row headers lists operations to be performed in the order from the top to the bottom. One row of column headers indicates the bit lines BL(4j) and, for each of the below-referenced cases, the bit lines BL(4j+1), BL(4j+2), and BL(4j+3). Other rows of column headers indicate, respectively and for each of the cases, data (threshold states) stored in the memory cells coupled to the word line WLi in the string units SU2, SU3, and SU4. Data "0" or data "1" given in the table entries at the intersections between these rows and columns indicates data to be held in corresponding one of SA, DL0, and XDL, which can be referred to in another column of row headers.

According to the write order shown in FIG. 10 as discussed in the first embodiment, the write operation for the string unit SU2 is performed prior to the string unit SU3. On the other hand, the write operation for the string units SU4 is performed subsequently to the string unit SU3. Therefore, for reading data from the string unit SU3, it is not required to take into account an inter-cell interference effect from the string unit SU2, but only the inter-cell interference effects from the string unit SU4 need to be considered. In this relation, the memory cells in the string unit SU3, which are coupled to bit line BL(4j), only have their backside cells in the string unit SU2 and do not have a backside cell in the string unit SU4, as shown in FIG. 3. As such, for the memory cells coupled to the respective bit lines BL(4j) among the selected memory cells, it is not necessary to consider the prior-reading data from the memory cells coupled to the word line WLi in not only the string unit SU2 but also in the string unit SU4. That is, read data may be determined based on results of the read operations ARL and CRL, for these memory cells. For simplification, thus, the description of the selected memory cells in the string unit SU3, which are coupled to the respective bit lines BL(4j), will consider only the condition that they are in the "Er" state, and the description of them being in the "A" state, the "B" state, or the "C" state will be omitted.

Meanwhile, the memory cells coupled to any of the bit lines BL(4j+1), BL(4j+2), and BL(4j+3) have their respective backside cells in the string unit SU4. This means that the backside cells corresponding to the memory cells coupled to these three series of the bit lines are memory cells to which consideration should be given regarding their inter-cell interference effects. As the degree of the inter-cell interference effect varies depending on the threshold voltage of the corresponding backside cell, the sense amplifier 140 may perform eight alternative operations as below (CASE I to CASE VIII), according to the combination of the threshold voltage of the backside cells and the threshold voltage of the selected memory cells. Particulars of CASE I to CASE VIII as applied to FIG. 43 are as follows.

CASE I: where the selected memory cells are in the "Er" state, and the corresponding backside cells (in SU4) are in the "Er" state or the "A" state.

CASE II: where the selected memory cells are in the "Erh" state, and the corresponding backside cells (in SU4) are in the "B" state or the "C" state. This is the case where the selected memory cells have been shifted from the "Er" state to the "Erh" state due to the inter-cell interference effect from the respective backside cells.

CASE III: where the selected memory cells are in the "A" state, and the corresponding backside cells (in SU4) are in the "Er" state or the "A" state.

CASE IV: where the selected memory cells are in the "Ah" state, and the corresponding backside cells (in SU4) are in the "B" state or the "C" state. This is the case where the selected memory cells have been shifted from the "A" state to the "Ah" state due to the inter-cell interference effect from the respective backside cells.

CASE V: where the selected memory cells are in the "B" state, and the corresponding backside cells (in SU4) are in the "Er" state or the "A" state.

CASE VI: where the selected memory cells are in the "Bh" state, and the corresponding backside cells (in SU4) are in the "B" state or the "C" state. This is the case where the selected memory cells have been shifted from the "B" state to the "Bh" state due to the inter-cell interference effect from the respective backside cells.

CASE VII: where the selected memory cells are in the "C" state, and the corresponding backside cells (in SU4) are in the "Er" state or the "A" state.

CASE VIII: where the selected memory cells are in the "Ch" state, and the corresponding backside cells (in SU4) are in the "B" state or the "C" state. This is the case where the selected memory cells have been shifted from the "C" state to the "Ch" state due to the inter-cell interference effect from the respective backside cells.

The sense amplifier 140 performs operations as described one by one below.

As indicated in FIG. 43, the read operation BR as the prior-read operation is first performed for the memory cells (backside cells) coupled to the word line WLi in the string unit SU4. This corresponds to time t0 to time t1 in FIG. 12. Accordingly, for each and every bit line BL, data "0" is held in the sense unit SA corresponding to the "Er" state or the "A" state backside cell, and data "1" is held in the sense unit SA corresponding to the "B" state or the "C" state backside cell. The data in these sense units SA are then transferred to the respective latch circuits DL0.

For example, the sequencer 170 or the respective arithmetic operation unit OP causes the latch circuit DL0 in each sense amplifier unit SAU(4j) corresponding to the bit line BL(4j) to hold data "0".

Subsequently, the main read operation for the word line WLi in the string unit SU3 is performed. Here, the read operation ARL is first performed. Upon this operation, data "0" is held in each of the sense units SA corresponding to the respective bit lines BL(4j). Also, data "0" is held in each of the sense units SA corresponding to the respective bit lines BL in CASE I. In each of the sense units SA corresponding to the respective bit lines BL in CASE II, data "0" or data "1" is held according to the threshold of the selected memory cell. This is because some of the "Erh" state memory cells might have a threshold higher than the voltage VA. In each of the sense units SA corresponding to the respective bit lines BL in CASE III to CASE VIII, data "1" is held because their selected memory cells are turned off.

Then, the arithmetic operation units OPs each perform the following computing operation, and the operation results are held in the respective latch circuits XDL.

~SA & ~DL0

The symbol "~" indicates inversion of data, and the symbol "&" indicates the AND operation. Accordingly, data "1" is held in each of the latch circuits XDL corresponding to the respective bit lines BL(4j) and bit lines BL in CASE I, and data "0" is held in each of the latch circuits XDL corresponding to the respective bit lines BL in CASE II to CASE VIII.

The main read operation proceeds to the read process ARH. Upon performing this process, data "0" is held in each of the sense units SA corresponding to the respective bit lines BL(4j). Also, data "0" is held in each of the sense units SA corresponding to the respective bit lines BL in CASE I and CASE II. In each of the sense units SA corresponding to the respective bit lines BL in CASE III, data "0" or data "1" is held according to the threshold of the applicable selected memory cell. This is because some of the "A" state memory cells might have a threshold lower than the voltage VAh. In each of the sense units SA corresponding to the respective bit lines BL in CASE IV to CASE VIII, data "1" is held because their selected memory cells are turned off.

Then, the arithmetic operation units OPs each perform the following computing operation, and the operation results are held in the respective latch circuits XDL.

~SA & DL0|XDL The symbol "|" indicates the OR operation. Accordingly, data "1" is held in each of the latch circuits XDL corresponding to the respective bit lines BL(4j) and bit lines BL in CASE I and CASE II, and data "0" is held in each of the latch circuits XDL corresponding to the respective bit lines BL in CASE III to CASE VIII.

The main read operation now proceeds to the read operation CR. Namely, the read operation CRL is first performed. Upon performing this operation, data "0" is held in each of the sense units SA corresponding to the respective bit lines BL(4j). Also, data "0" is held in each of the sense units SA corresponding to the respective bit lines BL in CASE I to CASE V. In each of the sense units SA corresponding to the respective bit lines BL in CASE VI, data "0" or data "1" is held according to the threshold of the selected memory cell. This is because some of the "Bh" state memory cells might have a threshold higher than the voltage VC. In each of the sense units SA corresponding to the respective bit lines BL in CASE VII and CASE VIII, data "1" is held because their selected memory cells are turned off.

Then, the arithmetic operation units OP each perform the following computing operation, and the operation results are held in the respective latch circuits XDL.

SA & ~DL0|XDL Accordingly, data "1" is held in each of the latch circuits XDL corresponding to the respective bit lines BL(4j) and bit lines BL in CASE I, CASE II, and CASE VII, and data "0" is held in each of the latch circuits XDL corresponding to the respective bit lines BL in CASE III to CASE VI and CASE VIII.

Subsequently, the read operation CRH is performed. Upon this operation, data "0" is held in each of the sense units SA corresponding to the respective bit lines BL(4j). Also, data "0" is held in each of the sense units SA corresponding to the respective bit lines BL in CASE I to CASE VI. In each of the sense units SA corresponding to the respective bit lines BL in CASE VII, data "0" or data "1" is held according to the threshold of the selected memory cell. This is because some of the "C" state memory cells might have a threshold lower than the voltage VCh. In each of the sense units SA corresponding to the respective bit lines BL in CASE VIII, data "1" is held because their selected memory cells are turned off.

Then, the arithmetic operation units OP each perform the following computing operation, and the operation results are held in the respective latch circuits XDL.

SA & DL0|XDL

Accordingly, data "1" is held in each of the latch circuits XDL corresponding to the respective bit lines BL(4j) and bit lines BL in CASE I, CASE II, CASE VII, and CASE VIII, and data "0" is held in each of the latch circuits XDL corresponding to the respective bit lines BL in CASE III to CASE VI.

As a results of the above operation, data "1" is consequently held in each of the latch circuits XDL corresponding to the selected memory cells each being in one of the "Er" state, the "Erh" state, the "C" state, and the "Ch" state. Meanwhile, data "0" is consequently held in each of the latch circuits XDL corresponding to the selected memory cells each being in one of the "A" state, the "Ah" state, the "B" state, and the "Bh" state. Reading the upper page is thus completed.

8.3 Second Example

Next, a second example will be described, assuming an instance where the inter-cell interference effect from the neighboring cells coupled to the word line WL(i+1) is further taken into consideration in the context of the first example described in above 8.2. In other words, it is intended in this second example that both the influence from the backside cells and the influence from the neighboring cells are to be compensated for. Note that the description will assume, as one exemplary instance, that the data writing has been performed in the order shown in FIG. 10 as explained with reference to the first embodiment, and the sense amplifier 140 performs its operations in the course of the data read explained with reference to FIG. 18A for the third embodiment.

It will also be assumed that the example deals with the threshold changes as shown in FIG. 44 which have occurred in the memory cells coupled to the word line WLi in the string unit SU3, due to the inter-cell interference effects. In this example, added to what is shown in FIG. 42 for the first example in above 8.2, the memory cells undergoing the inter-cell interference effect from the neighboring cells coupled to the word line WL(i+1) also generally shift their threshold distributions toward the higher voltage side. The degree of such an inter-cell interference effect from the neighboring cells coupled to the word line WL(i+1) also varies depending on the amount of threshold voltage transition that has taken place in each neighboring cell. As in the foregoing description for the backside cells, this example will assume that, if the threshold states of the neighboring cells are the "Er" state or the "A" state, the inter-cell interference effect from the neighboring cells is practically absent, and if the threshold states of the neighboring cells are the "B" state or the "C" state, the threshold distributions of the corresponding selected cells are shifted toward the higher voltage side. In this example, the voltages between the threshold distributions after the shift toward the higher voltage side due to the influence from the neighboring cells will be referred to as a voltage VAh', a voltage VBh', and a voltage VCh', respectively. Also, the states according to the shifted threshold distributions will be referred to as an "Erh'" state, an "Ah'" state, a "Bh'" state, and a "Ch'" state, respectively.

By way of example, this second example will assume a condition that the threshold shift caused by the influence from the neighboring cells coupled to the word line WL(i+1) is larger than the threshold shift caused by the influence from the backside cells. As such, the voltages are supposed to be in the relationships of VAh'>VAh, VBh'>VBh, and VCh'>VCh. Note, however, that the relationship between the inter-cell interference effect from the backside cells and the inter-cell interference effect from the neighboring cells coupled to the word line WL(i+1) would change in response to various circumstances. The example described here therefore considers only one of various cases for explanation, and the mentioned voltage size relationships do not pose any limitations.

Moreover, the memory cells undergoing both the inter-cell interference effect from the backside cells and the inter-cell interference effect from the neighboring cells coupled to the word line WL(i+1) shift their threshold distributions toward the higher voltage side, to a greater extent. In this example, the voltages between the threshold distributions after such shifts will be referred to as a voltage VAhh', a voltage VBhh', and a voltage VChh', respectively. The states according to the shifted threshold distributions here will be referred to as an "Erhh'" state, an "Ahh'" state, a "Bhh'" state, and a "Chh'" state, respectively. As such, the voltages are supposed to be in the relationships of VAhh'>VAh', VBhh'>VBh', and VChh'>VCh'.

As will be appreciated, the read operation AR for reading the upper page includes an operation using the read voltage VA, which will be referred to as a read operation ARL, an operation using the read voltage VAh, which will be referred to as a read operation ARH, an operation using the read voltage VAh', which will be referred to as a read operation ARH', and an operation using the read voltage VAhh', which will be referred to as a read operation ARHH'.

The read operation CR likewise includes four read operations CRL, CRH, CRH', and CRHH. That is, when they are applied to FIG. 18A explained for the third embodiment, they are in the following relationships.

Read operation AR: Set of ARL, ARH, ARH', and ARHH'
   VCGLA_A1=VA
   VCGLA_A2=VAh
   VCGLA_A3=VAh'
   VCGLA_A4=VAhh'
Read operation CR: Set of CRL, CRH, CRH', and CRHH'
   VCGLA_C1=VC
   VCGLA_C2=VCh
   VCGLA_C3=VCh'
   VCGLA_C4=VChh'

Figure 45:
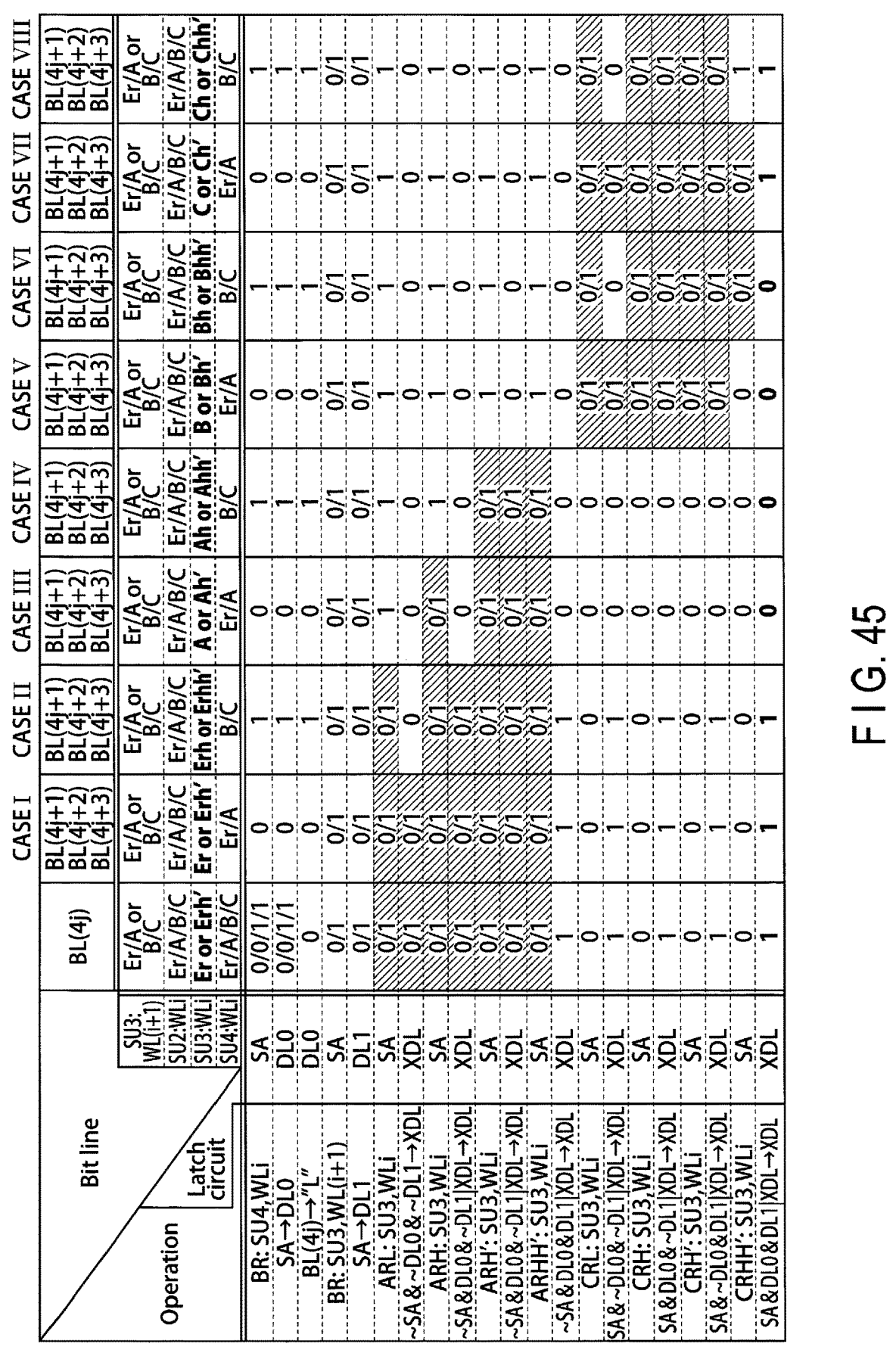

FIG. 45 shows the internal operations of the sense amplifier 140 for performing the operations corresponding to FIG. 18A. In FIG. 45, as in FIG. 43, one column of row headers lists operations to be performed in the order from the top to the bottom. One row of column headers indicates the bit lines BL(4j) and, for each of the below-referenced cases, the bit lines BL(4j+1), BL(4j+2), and BL(4j+3). Other rows of column headers indicate, respectively and for each of the cases, data (threshold states) stored in the memory cells coupled to the word line WLi in the string units SU2, SU3, and SU4, and data (threshold states) stored in the memory cells coupled to the word line WL(i+1) in the string unit SU3.

The operations with the bit lines BL(4j) will be first discussed. Similar to the example with reference to FIG. 43, only the erased state memory cells will be explained in relation to the bit lines BL(4j). Also as already described, it is not necessary to consider the influence from the backside cells for the memory cells coupled to the bit lines BL(4j) in this example, but only the influence from the neighboring cells coupled to the word line WL(i+1) should be considered. As such, the erased state memory cells coupled to the respective bit lines BL(4j) have the threshold distribution of either the "Er" state or the "Erh'" state.

On the other hand, the memory cells coupled to the bit lines BL(4j+1), BL(4j+2), and BL(4j+3) have their respective backside cells in the string unit SU4. Particulars of CASE I to CASE VIII as applied to FIG. 45 are as follows.

CASE I: where the backside cells (in SU4) are in the "Er" state or the "A" state. The selected memory cells are in the "Er" state if the corresponding neighboring cells coupled to the word line WL(i+1) are in the "Er" state or the "A" state, and the selected memory cells are in the "Erh'" state if the neighboring cells are in the "B" state or the "C" state.

CASE II: where the backside cells (in SU4) are in the "B" state or the "C" state. The selected memory cells are in the "Erh" state if the corresponding neighboring cells coupled to the word line WL(i+1) are in the "Er" state or the "A" state, and the selected memory cells are in the "Erhh'" state if the neighboring cells are in the "B" state or the "C" state.

CASE III: where the backside cells (in SU4) are in the "Er" state or the "A" state. The selected memory cells are in the "A" state if the corresponding neighboring cells coupled to the word line WL(i+1) are in the "Er" state or the "A" state, and the selected memory cells are in the "Ah'" state if the neighboring cells are in the "B" state or the "C" state.

CASE IV: where the backside cells (in SU4) are in the "B" state or the "C" state. The selected memory cells are in the "Ah" state if the corresponding neighboring cells coupled to the word line WL(i+1) are in the "Er" state or the "A" state, and the selected memory cells are in the "Ahh'" state if the neighboring cells are in the "B" state or the "C" state.

CASE V: where the backside cells (in SU4) are in the "Er" state or the "A" state. The selected memory cells are in the "B" state if the corresponding neighboring cells coupled to the word line WL(i+1) are in the "Er" state or the "A" state, and the selected memory cells are in the "Bh'" state if the neighboring cells are in the "B" state or the "C" state.

CASE VI: where the backside cells (in SU4) are in the "B" state or the "C" state. The selected memory cells are in the "Bh" state if the corresponding neighboring cells coupled to the word line WL(i+1) are in the "Er" state or the "A" state, and the selected memory cells are in the "Bhh'" state if the neighboring cells are in the "B" state or the "C" state.

CASE VII: where the backside cells (in SU4) are in the "Er" state or the "A" state. The selected memory cells are in the "C" state if the corresponding neighboring cells coupled to the word line WL(i+1) are in the "Er" state or the "A" state, and the selected memory cells are in the "Ch'" state if the neighboring cells are in the "B" state or the "C" state.

CASE VIII: where the backside cells (in SU4) are in the "B" state or the "C" state. The selected memory cells are in the "Ch" state if the corresponding neighboring cells coupled to the word line WL(i+1) are in the "Er" state or the "A" state, and the selected memory cells are in the "Chh'" state if the neighboring cells are in the "B" state or the "C" state.

The sense amplifier 140 performs operations as described one by one below.

Similar to the example with reference to FIG. 43, the read operation BR as the prior-read operation is first performed for the memory cells coupled to the word line WLi in the string unit SU4, and the data in each sense unit SA is transferred to the respective latch circuit DL0. The latch circuit DL0 in each sense amplifier unit SAU(4j) corresponding to the bit line BL(4j) is caused to hold data "0".

Subsequently, the word line WL(i+1) in the selected string unit SU3 is selected and the read operation BR as the prior-read operation is performed. If the neighboring cells coupled to the word line WL(i+1) are in the "Er" state or the "A" state, data "0" is held in the respective, corresponding sense units SA, and if the neighboring cells are in the "B" state or the "C" state, data "1" is held in the corresponding sense units SA. The data in the sense units SA is transferred to the corresponding latch circuits DL1.

Next, the main read operation for the word line WLi in the string unit SU3 is performed. Here, the read operation ARL is first performed. Upon the read operation ARL, data "O0" or data "1" is held in each of the sense units SA corresponding to the respective bit lines BL(4j) and bit lines BL in CASE I and CASE II, according to the threshold of the selected memory cell. The threshold voltage of the memory cell transistor is dependent on the inter-cell interference effect from the corresponding backside cell and the inter-cell interference effect from the corresponding neighboring cell coupled to the word line WL(i+1). That is, whether each sense unit SA would hold data "0" or data "1" is not uniquely determined, and either data "0" or data "1" is held according to various factors such as the degree of an inter-cell interference effect, the nature of an inter-cell interference effect that would increase or decrease the threshold, and so on. FIG. 45 hatches the table entries for such an occasion of data determination dependent on the inter-cell interference effects. Meanwhile, in each of the sense units SA corresponding to the respective bit lines BL in CASE III to CASE VIII, data "1" is held as in FIG. 43, because their selected memory cells are turned off.

Next, the arithmetic operation units OP each perform the following computing operation, and the operation results are held in the respective latch circuits XDL.

~SA & ~DL0 & ~DL1

Accordingly, data "0" or data "1" is held in each of the latch circuits XDL corresponding to the respective bit lines BL(4j) and bit lines BL in CASE I, and data "0" is held in each of the latch circuits XDL corresponding to the respective bit lines BL in CASE II to CASE VIII.

The main read operation proceeds to the read operation ARH. As a result, data "0" or data "1" is held in each of the sense units SA corresponding to the respective bit lines BL(4j) and bit lines BL in CASE I to CASE III, according to the threshold of the selected memory cell. In each of the sense units SA corresponding to the respective bit lines BL in CASE IV to CASE VIII, data "1" is held because their selected memory cells are turned off.

Then, the arithmetic operation units OP each perform the following computing operation, and the operation results are held in the respective latch circuits XDL.

~SA & DL0 & ~DL1|XDL

Accordingly, data "0" or data "1" is held in each of the latch circuits XDL corresponding to the respective bit lines BL(4j) and bit lines BL in CASE I and CASE II, and data "0" is held in each of the latch circuits XDL corresponding to the respective bit lines BL in CASE III to CASE VIII.

Subsequently, the read operation ARH' is performed. As a result, data "0" or data "1" is held in each of the sense units SA corresponding to the respective bit lines BL(4j) and bit lines BL in CASE I to CASE IV, according to the threshold of the selected memory cell. In each of the sense units SA corresponding to the respective bit lines BL in CASE V to CASE VIII, data "1" is held because their selected memory cells are turned off.

Then, the arithmetic operation units OP each perform the following computing operation, and the operation results are held in the respective latch circuits XDL.

~SA & DL0 & ~DL1|XDL

Accordingly, data "0" or data "1" is held in each of the latch circuits XDL corresponding to the respective bit lines BL(4*j*) and bit lines BL in CASE I to CASE IV, and data "0" is held in each of the latch circuits XDL corresponding to the respective bit lines BL in CASE V to CASE VIII.

Subsequently, the read operation ARHH' is performed. As a result, data "0" or data "1" is held in each of the sense units SA corresponding to the respective bit lines BL(4*j*) and bit lines BL in CASE I to CASE IV. In each of the sense units SA corresponding to the respective bit lines BL in CASE V to CASE VIII, data "1" is held because their selected memory cells are turned off.

Then, the arithmetic operation units OP each perform the following computing operation, and the operation results are held in the respective latch circuits XDL.

~SA & DL0 & DL1|XDL

Accordingly, data "1" is held in each of the latch circuits XDL corresponding to the respective bit lines BL(4*j*) and bit lines BL in CASE I and CASE II, and data "0" is held in each of the latch circuits XDL corresponding to the respective bit lines BL in CASE III to CASE VIII.

The main read operation now proceeds to the read operation CR. Namely, the read operation CRL is first performed. As a result, data "0" is held in each of the sense units SA corresponding to the respective bit lines BL(4*j*) and bit lines BL in CASE I to CASE IV. In each of the sense units SA corresponding to the respective bit lines BL in CASE V to CASE VIII, data "0" or data "1" is held according to the threshold of the selected memory cell.

Then, the arithmetic operation units OP each perform the following computing operation, and the operation results are held in the respective latch circuits XDL.

SA & ~DL0 & ~DL1|XDL

Accordingly, data "1" is held in each of the latch circuits XDL corresponding to the respective bit lines BL(4*j*) and bit lines BL in CASE I and CASE II, and data "0" is held in each of the latch circuits XDL corresponding to the respective bit lines BL in CASE III, CASE IV, CASE VI, and CASE VIII. Data "0" or data "1" is held in each of the latch circuits XDL corresponding to the respective bit lines BL in CASE V and the CASE VII.

Subsequently, the read operation CRH is performed. As a result, data "0" is held in each of the sense units SA corresponding to the respective bit lines BL(4*j*) and bit lines BL in CASE I to CASE IV. On the other hand, in each of the sense units SA corresponding to the respective bit lines BL in CASE V to CASE VIII, data "0" or data "1" is held according to the threshold of the applicable selected memory cell.

Then, the arithmetic operation units OP each perform the following computing operation, and the operation results are held in the respective latch circuits XDL.

SA & DL0 & ~DL1|XDL

Accordingly, data "1" is held in each of the latch circuits XDL corresponding to the respective bit lines BL(4*j*) and bit lines BL in CASE I and CASE II, and data "0" is held in each of the latch circuits XDL corresponding to the respective bit lines BL in CASE III and CASE IV. Data "0" or data "1" is held in each of the latch circuits XDL corresponding to the respective bit lines BL in CASE V to CASE VIII.

Subsequently, the read operation CRH' is performed. As a result, data "0" is held in each of the sense units SA corresponding to the respective bit lines BL(4*j*) and bit lines BL in CASE I to CASE IV. In each of the sense units SA corresponding to the respective bit lines BL in CASE V to CASE VIII, data "0" or data "1" is held according to the threshold of the applicable selected memory cell.

Then, the arithmetic operation units OP each perform the following computing operation, and the operation results are held in the respective latch circuits XDL.

SA & ~DL0 & DL1|XDL

Accordingly, data "1" is held in each of the latch circuits XDL corresponding to the respective bit lines BL(4*j*) and bit lines BL in CASE I and CASE II, and data "0" is held in each of the latch circuits XDL corresponding to the respective bit lines BL in CASE III and CASE IV. Data "0" or data "1" is held in each of the latch circuits XDL corresponding to the respective bit lines BL in CASE V to CASE VIII.

Subsequently, the read operation CRHH' is performed. As a result, data "0" is held in each of the sense units SA corresponding to the respective bit lines BL(4*j*) and bit lines BL in CASE I to CASE V, and data "1" is held in each of the sense units SA corresponding to the respective bit lines BL in CASE VIII. In each of the sense units SA corresponding to the respective bit lines BL in CASE VI and CASE VII, data "0" or data "1" is held according to the threshold of the applicable selected memory cell.

Then, the arithmetic operation units OP each perform the following computing operation, and the operation results are held in the respective latch circuits XDL.

SA & DL0 & DL1|XDL

Accordingly, data "1" is held in each of the latch circuits XDL corresponding to the respective bit lines BL(4*j*) and bit lines BL in CASE I, CASE II, CASE VII, and CASE VIII, and data "0" is held in each of the latch circuits XDL corresponding to the respective bit lines BL in CASE III to CASE VI.

According to the above processes, data "1" is consequently held in each of the latch circuits XDL corresponding to the selected memory cells in the "Er", "Erh", "Erh'", "Erhh'", "C", "Ch", "Ch'", Chh'" states. Data "0" is consequently held in each of the latch circuits XDL corresponding to the selected memory cells in the "A", "Ah", "Ah'", "Ahh'", "B", "Bh", "Bh'", and "Bhh'" states. Reading the upper page is thus completed.

8.4 Third Example

The examples used in above 8.2 and 8.3 have assumed the instances where the data having been written in the order shown in FIG. 10 is read from the string unit SU3. In such instances, the inter-cell interference effect from the string unit SU2, i.e., one of the neighboring string units SU2 and SU4 for the string unit SU3, can be ignored as previously discussed. The prior-read operation with the string unit SU2 is therefore not required.

In contrast, the present third example will take into account the influence from both of the two neighboring string units SU. To this end, description will be given of an instance where, for example, the data having been written in the order shown in FIG. 14 explained for the second embodiment is read from the string unit SU4. According to the write order in this instance, the data writing is performed with the string unit SU4, and then the string units SU3 and SU5. As such, the data written in the string unit SU4 is exposed to the inter-cell interference effects from both the string units SU3 and SU5. When the layout shown in FIG. 4 is adopted, nevertheless, consideration should be given to only the memory cells coupled to the respective bit lines BL(4*j*+1), BL(4*j*+2), and BL(4*j*+3) for the string unit SU3 and the memory cells coupled to the respective bit lines BL(4j) for the string unit SU5, as indicated in FIG. 15. Note that this example will disregard the inter-cell interference effect from the neighboring cells coupled to the word line WL(i+1).

FIG. 46 shows the internal operations of the sense amplifier 140 for performing the operations corresponding to FIG. 16, and what are shown in FIG. 46 may refer to the explanation of FIG. 43 given in above 8.2.

The operations with the bit lines BL(4j) will be first discussed. As understood from the foregoing description, the memory cells in the string unit SU4, which are coupled to the BL(4j), only have their backside cells in the string unit SU5 and have no backside cell in the string unit SU3. Thus, for the operations with the bit lines BL(4j), the description will assume that the selected memory cells are in the "Er" state or in the "Erh" state due to the inter-cell interference effect from the string unit SU5.

Meanwhile, the memory cells coupled to the bit lines BL(4j+1), BL(4j+2), and BL(4j+3) have their respective backside cells in the string unit SU3. CASE I to CASE VIII follow the explanation with reference to FIG. 43. Note, however, that the backside cells here are located in the string unit SU3.

As indicated in FIG. 46, the read operation BR as the prior-read operation is first performed for the memory cells coupled to the word line WLi in the string unit SU5. This corresponds to time t0 to time t1 in FIG. 16. Accordingly, for each and every bit line BL, data "0" is held in the sense unit SA corresponding to the "Er" state or the "A" state backside cell, and data "1" is held in the sense unit SA corresponding to the "B" state or the "C" state backside cell. The data in these sense units SA are then transferred to the respective latch circuits DL0. Also, for example, the sequencer 170 or the respective arithmetic operation unit OP causes the latch circuit DL0 in each of the sense amplifier units SAU(4j+1), SAU(4j+2), and SAU(4j+3) corresponding to the respective bit lines BL(4j+1), BL(4j+2), and BL(4j+3) to hold data "0".

Next, the read operation BR as the prior-read operation is performed for the memory cells coupled to the word line WLi in the string unit SU3. This corresponds to time t1 to time t2 in FIG. 16. Accordingly, for each and every bit line BL, data "0" is held in the sense unit SA corresponding to the "Er" state or the "A" state backside cell, and data "1" is held in the sense unit SA corresponding to the "B" state or the "C" state backside cell. The data in these sense units SA are then transferred to the respective latch circuits DL1. Also, for example, the sequencer 170 or the respective arithmetic operation unit OP causes the latch circuit DL1 in each sense amplifier unit SAU(4j) corresponding to the respective bit lines BL(4j) to hold data "0".

According to the above processes, the latch circuits DL0 in the respective sense amplifier units SAU(4j) now hold the prior-reading results for the string unit SU5. Meanwhile, the latch circuits DL1 in the respective sense amplifier units SAU(4j+1), SAU(4j+2), and SAU(4j+3) hold the prior-reading results for the string unit SU3. Note that the prior-read operation with the string unit SU3 may be performed prior to the prior-read operation with the string unit SU5.

Subsequently, the main read operation for the word line WLi in the string unit SU4 is performed. The read operation ARL is first performed. As a result, data "0" or data "1" is held in each of the sense units SA corresponding to the respective bit lines BL(4j), according to the threshold of the selected memory cell. More specifically, the memory cells which have shifted to the "Erh" state due to the inter-cell interference effect from the string unit SU5 are turned off by the read operation ARL. Thus, data "1" is held in each of the sense units SA corresponding to such memory cells.

The remaining aspects are basically the same as explained with reference to FIG. 43, so will be omitted.

8.5 Fourth Example

Figure 47:
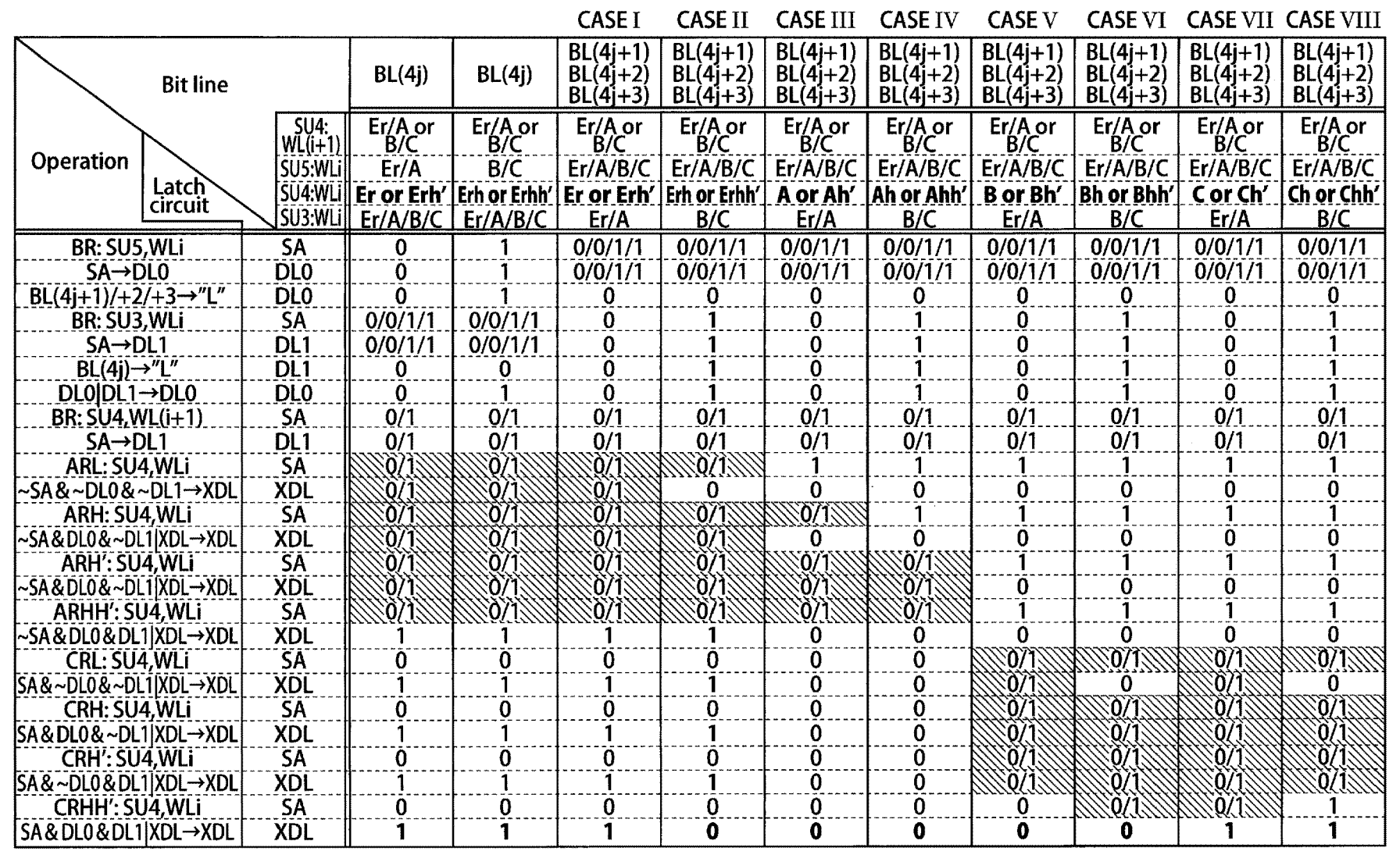

Next, a fourth example will be described, assuming an instance where the inter-cell interference effect from the neighboring cells coupled to the word line WL(i+1) is further taken into consideration in the context of the example described in above 8.4. FIG. 47 shows the internal operations of the sense amplifier 140 for performing the operations corresponding to FIG. 18A, and what are shown in FIG. 47 may refer to the explanation of FIG. 43 given in above 8.3. Note, however, that this example in FIG. 47 assumes that data is read from the string unit SU4.

As indicated in FIG. 47, and as explained with reference to FIG. 46 in above 8.4, the read operation BR is performed for the memory cells coupled to the word line WLi in the string unit SU5, so that the read results for the bit lines BL(4j) are held in the corresponding latch circuits DL0. Subsequently, the read operation BR is performed for the memory cells coupled to the word line WLi in the string unit SU3, so that the read results for the bit lines BL(4j+1), BL(4j+2), and BL(4j+3) are held in the corresponding latch circuits DL1. The data in the latch circuits DL0 and the data in the corresponding latch circuits DL1 are subjected to the OR operation, and the operation results are held in the latch circuits DL0, respectively.

In this example, the read operation BR is further performed for the memory cells coupled to the word line WL(i+1) in the string unit SU4, so that the read results for the bit lines BL(4j), BL(4j+1), BL(4j+2), and BL(4j+3) are held in the corresponding latch circuits DL1, respectively.

Consequently, the latch circuits DL0 hold the prior-reading results for the word line WLi in the string units SU3 and SU5, and the latch circuits DL1 hold the prior-reading results for the word line WL(i+1) in the string unit SU4. The succeeding operations proceed in a similar manner to the operations shown in FIG. 45. That is, the read operations ARL, ARH, ARH', ARHH', CRL, CRH, CRH', and CRHH' are performed.

8.6 Effects of Eighth Embodiment

According to the present embodiment, the sense amplifier 140 can for example determine the data while considering the influence from backside cells and neighboring cells by operating in the above manner.

9. Modifications, Etc.

As in the foregoing disclosures, the semiconductor memory device according to the embodiments includes a first memory cell (e.g., SU2) and a second memory cell (e.g., SU3) each capable of retaining data, a first word line (e.g., SU2, WLi) coupled to the first memory cell, a second word line (e.g., SU3, WLi) coupled to the second memory cell, and a first bit line capable of being electrically coupled to both the first memory cell and the second memory cell. The first memory cell faces the second memory cell with a first semiconductor layer interposed therebetween. The semiconductor memory device performs a data read operation including a first operation (e.g., read-ahead with a backside cell) and a second operation (e.g., main read with a selected cell). For reading data from the first memory cell, the semiconductor memory device performs the first operation (e.g., read-ahead) in which a first voltage (e.g., Vcut1) is applied to the first word line (e.g., SU2, WLi) and a second voltage (e.g., VB) higher than the first voltage is applied to the second word line (e.g., SU3, WLi). The semiconductor memory device performs, after the first operation, the second operation (e.g., main read) in which a third voltage (e.g., VCGLA_A1) higher than the first voltage and a fourth voltage (e.g., VCGLA_A2) different from the third voltage are applied to the first word line (e.g., SU2, WLi) and a fifth voltage (e.g., Vcut1) lower than the second to the fourth voltage is applied to the second word line (e.g., SU3, WLi). The first voltage (e.g., Vcut1) and the fifth voltage (e.g., Vcut1) each are a memory cell-turning off voltage.

According to this configuration, data reading is performed in consideration of the influence of the backside cell, in the structure in which two memory cells share a memory pillar. The configuration therefore enhances reliability in data reading. Note that the embodiments having been described are only examples, and can be modified in various ways. To be more specific, the embodiments have assumed the instances where the memory cell transistors MTs are each store two-bit data or three-bit data. However, the memory cell transistors MTs may store four or more bit data. Also, while various write orders have been presented in the embodiments, the applicable write orders are not limited to them, and changes or shuffles can be introduced as many as possible. Moreover, the NAND strings 50 may include one or more dummy transistors between the selection transistors ST1 and ST2 and the memory cell transistors MT. A dummy transistor functions as a current path. As such, dummy transistors are turned on when the corresponding string unit SU is selected. Furthermore, each operation and processing appearing in the related flowcharts, timing charts, etc., can be changed or switched with others wherever possible.

The memory cells are not limited to the structure explained with reference to FIG. 6. In this relation, FIG. 48 shows a certain planar pattern of the word lines WL, intended for the string units SU1 and SU2 in the memory cell part shown in FIG. 4.

According to FIG. 48, each memory pillar MP of FIG. 4 is divided into two memory pillars MP-1 and MP-2. The memory pillars MP-1 and MP-2 are separated by, for example, an insulating film that fills the slit SLT2. The memory pillars MP-1 and MP-2 are arranged so that their respective surfaces, facing one another, each constitute an even plane with the surface of the word line WLo or WLe to which they belong.

FIG. 49 is an X-Y plane cross section of the memory pillars MP-1 and MP-2 and the memory cell transistors MT of the example shown in FIG. 48, and corresponds to FIG. 6 explained for the first embodiment. According to this example as illustrated in FIG. 49, the group of the insulating layer 30, the semiconductor layer 31, and the insulating layers 32 to 34 explained with reference to FIG. 6 is separated into two by the insulating layer 37 disposed in the slit SLT2. The separated groups form their respective memory cell transistors MT.

FIG. 50 shows another exemplary planar pattern of the word lines WL, corresponds to the string units SU1 and SU2 in the memory cell part shown in FIG. 4. According to this example as shown in FIG. 50, a multilayer structure 51 is provided between each word line WLo and each slit SLT2 and between each word line WLe and each slit SLT2, in the structure explained with reference to, for example, FIG. 48. The multilayer structure 51 each extend in the X direction as well.

A plurality of isolating pillars IPs is in the insulating layer in the slit SLT2 between two multilayer structure 51 arranged in the Y direction. Each isolating pillar IP extends in the Z direction as the memory pillar MP, and is formed by, for example, an insulating layer. Each isolating pillar IP also partially overlaps with two multilayer structure 51 arranged in the Y direction, whereby forming two isolated regions in each of the multilayer structure 51, i.e., right and left regions sandwiching the isolating pillar IP. In this structure, an area involving the region of the multilayer structure 51 bridging between two neighboring isolating pillars IPs functions as one memory cell transistor MT.

Figure 51:
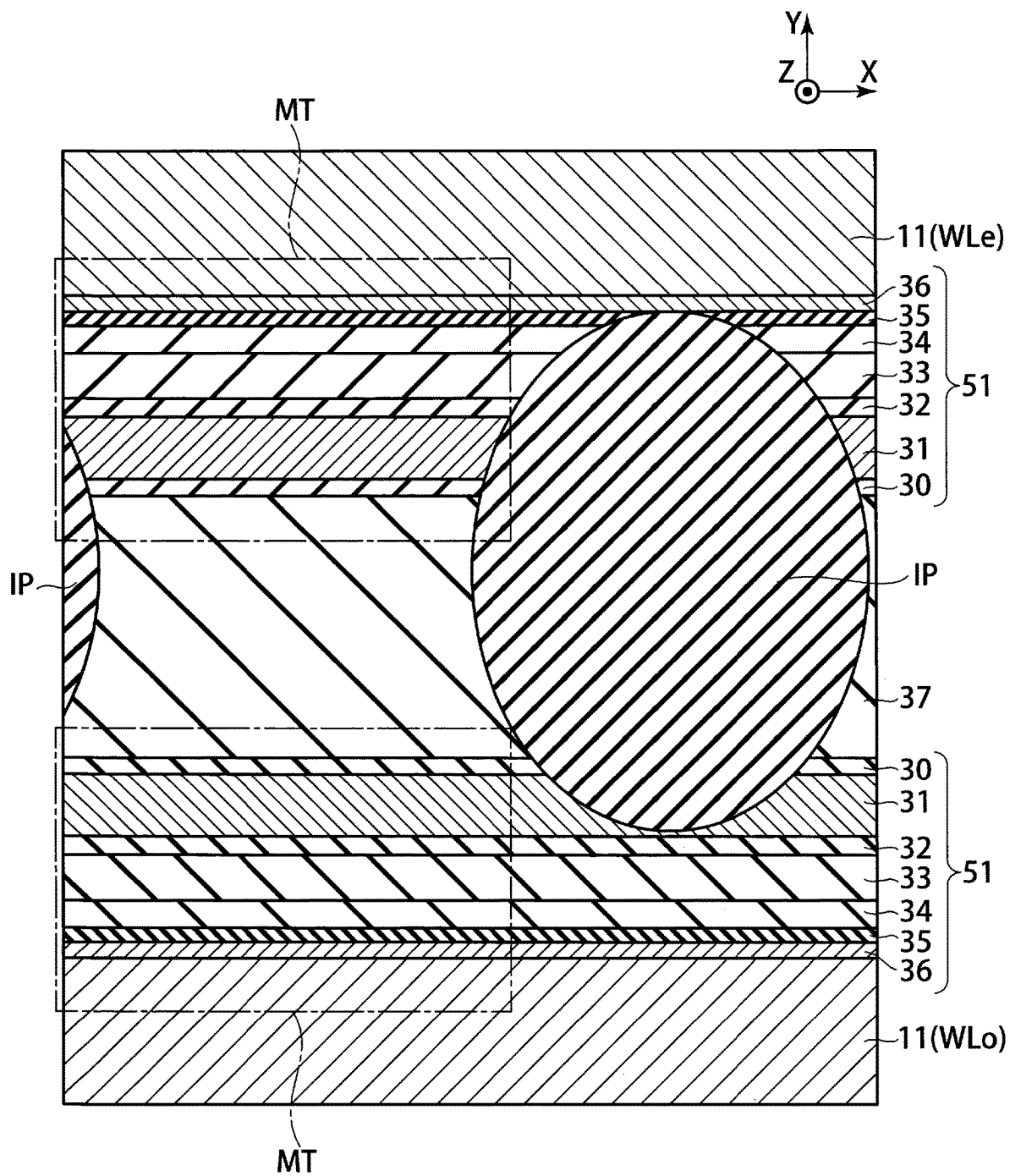

FIG. 51 is an X-Y plane cross section of the isolating pillar IP and the memory cell transistors MT of the example shown in FIG. 50, and corresponds to FIG. 6. According to this example as shown in FIG. 51, the conductive layer 36, the insulating layers 35, 34, 33, and 32, the semiconductor layer 31, and the gate insulating layer 30 are provided one by one over each of the word lines WLe and WLo. An insulating film, functioning as the isolating pillar IP, is disposed across the semiconductor layers 31 which are opposed to each other with the slit SLT2 therebetween. There is the insulating layer 37 occupying the space (slit SLT2) between the opposing insulating layers 30.

Note that in each embodiment concerning the present disclosures:

(1) When the memory cell holds two-bit data ("Er", "A", "B", or "C"), the voltage applied to the selected word line in the read process of A level may range from, for example, 0V to 0.55V. However, the present embodiments are not limited to this, and the voltage may be set within any of the ranges of 0.1V to 0.24V, 0.21V to 0.31V, 0.31V to 0.4V, 0.4V to 0.5V, and 0.5V to 0.55V.

The voltage applied to the selected word line in the read process of B level may range from, for example, 1.5V to 2.3V. The embodiments are not limited to this, and the voltage may be set within any of the ranges of 1.65V to 1.8V, 1.8V to 1.95V, 1.95V to 2.1V, and 2.1V to 2.3V.

The voltage applied to the selected word line in the read process of C level may range from, for example, 3.0V to 4.0V. The embodiments are not limited to this, and the voltage may be set within any of the ranges of 3.0V to 3.2V, 3.2V to 3.4V, 3.4V to 3.5V, 3.5V to 3.6V, and 3.6V to 4.0V.

A time (tR) for the read operation may be set within the range of, for example, 25 μs to 38 μs, 38 μs to 70 μs, or 70 μs to 80 μs.

(2) The write operation may include a program process and a verify process. In the course of the write operation, the voltage first applied to the selected word line in the program process may range from, for example, 13.7V to 14.3V. The embodiments are not limited to this, and the voltage may be set within any of the ranges of, for example, 13.7V to 14.0V and 14.0V to 14.6V.

The voltage first applied to the odd-numbered word line selected for data write and the voltage first applied to the even-numbered word line selected for data write may be different.

If the program process follows the incremental step pulse programming (ISPP), the voltage may be stepped up by, for example, 0.5V.

The voltage applied to the unselected word lines may be set within the range of, for example, 6.0V to 7.3V. However, the embodiments are not limited to this, and the voltage may be set within the range of, for example, 7.3V to 8.4V or set to 6.0V or lower.

A pass voltage to be applied may be changed depending on whether the unselected word line is an odd-numbered word line or an even-numbered word line.

A time (tProg) for the write operation may be set within the range of, for example, 1,700 μs to 1,800 μs, 1,800 μs to 1,900 μs, or 1,900 μs to 2,000 μs.

(3) In the erase operation, the voltage first applied to the well, which may be formed in the upper portion of the semiconductor substrate and above which the memory cells may be arranged, may be set within the range of, for example, 12V to 13.6V. However, the embodiments are not limited to this, and the voltage may be set within the range of, for example, 13.6V to 14.8V, 14.8V to 19.0V, 19.0V to 19.8V, or 19.8V to 21V.

A time (tErase) for the erase operation may be set within the range of, for example, 3,000 μs to 4,000 μs, 4,000 μs to 5,000 μs, or 4,000 μs to 9,000 μs.

(4) With regard to the structure of the memory cell, the charge accumulating layer may be arranged on a 4 to 10 nm-thick tunnel insulating film. The charge accumulating layer may have a stacked structure of a 2 to 3 nm-thick insulating film of SiN or SiON and 3 to 8 nm-thick polysilicon. Metals such as Ru may be added to the polysilicon. The insulating film is provided on the charge accumulating layer. The insulating film may include a 4 to 10 nm-thick silicon oxide film sandwiched between a 3 to 10 nm-thick lower High-k film and a 3 to 10 nm-thick upper High-k film. As the High-k films, HfO, etc. may be used. The silicon oxide film may be thicker than each High-k film. A 30 to 70 nm-thick control electrode may be formed on a 3 to 10 nm-thick work function adjusting material on the insulating film. Here, the work function adjusting material may be a metal oxide film such as TaO or a metal nitride film such as TaN. As the control electrode, W, etc. is usable.

An air gap may be formed between the memory cells.

The above embodiments have exemplified the semiconductor memory devices as NAND flash memories. However, the embodiments are applicable not only to NAND flash memories but also to other general semiconductor memories, and also applicable to various kinds of storage devices other than semiconductor memories.

While certain embodiments have been described, they have been presented by way of example only, and are not intended to limit the scope of the inventions. Indeed, the novel embodiments described herein may be embodied in a variety of other forms. Furthermore, various omissions, substitutions, and changes in the form of the embodiments may be made without departing from the spirit of the inventions. The accompanying claims and their equivalents are intended to cover such forms or modifications as would fall within the scope and the spirit of the inventions.

What is claimed is:

1. A semiconductor memory device comprising:
a first memory cell;
a second memory cell;
a first word line coupled to the first memory cell;
a second word line coupled to the second memory cell; and
a first bit line capable of being electrically coupled to both the first memory cell and the second memory cell,
wherein the first memory cell faces the second memory cell with a first semiconductor layer interposed therebetween,
the semiconductor memory device is configured to perform a data read operation including a first operation and a second operation, and
when reading data from the first memory cell, the semiconductor memory device is configured to
perform the first operation in which a first voltage is applied to the first word line and a second voltage higher than the first voltage is applied to the second word line, and
perform, after the first operation, the second operation in which a third voltage higher than the first voltage and a fourth voltage different from the third voltage are applied to the first word line and a fifth voltage lower than the second to the fourth voltage is applied to the second word line, and
wherein the first voltage and the fifth voltage turn off a memory cell.

2. The device according to claim 1, further comprising a first sense amplifier configured to determine data based on a voltage of the first bit line or a current in the first bit line in the data read operation,
wherein, when reading data from the first memory cell, the first sense amplifier is configured to
determine data in a period during the third voltage is applied to the first word line in the second operation, when the second memory cell turns on in the first operation, and
determine data in a period during the fourth voltage is applied to the first word line in the second operation, when the second memory cell turns off in the first operation.

3. The device according to claim 2, further comprising:
a third memory cell;
a fourth memory cell coupled to the first word line;
a third word line coupled to the third memory cell;
a second bit line capable of being electrically coupled to both the third memory cell and the fourth memory cell;
a first transistor configured to couple the first memory cell with the first bit line;
a second transistor configured to couple the second memory cell with the first bit line;
a third transistor configured to couple the third memory cell with the second bit line; and
a fourth transistor configured to couple the fourth memory cell with the second bit line;
wherein the third memory cell faces the fourth memory cell with a second semiconductor layer interposed therebetween,
data stored in the first memory cell and the fourth memory cell is read in parallel,
when reading data from the first memory cell and the fourth memory cell, the semiconductor memory device is configured to
perform the first operation in which the second transistor is turned on and data is read from the second memory cell, and
perform the second operation in which the first transistor and the fourth transistor are turned on and data is read from the first memory cell and the fourth memory cell,
wherein the third transistor is kept off during a period of reading the data from the first memory cell and the fourth memory cell.

4. The device according to claim 3, wherein data is written into the first memory cell and the fourth memory cell in parallel,
data is written into the second memory cell after the data is written into the first memory cell and the fourth memory cell, and data is written into the third memory cell before the data is written into the first memory cell and the fourth memory cell.

5. The device according to claim 1, further comprising:
a third memory cell;
a fourth memory cell coupled to the first word line;
a third word line coupled to the third memory cell; and
a second bit line capable of being electrically coupled to both the third memory cell and the fourth memory cell,
wherein the third memory cell faces the fourth memory cell with a second semiconductor layer interposed therebetween,
the data read operation further includes a third operation before the second operation,
data stored in the first memory cell and the fourth memory cell is read in parallel, and
when reading data from the first memory cell and the fourth memory cell, the semiconductor memory device is configured to
perform the third operation in which a sixth voltage is applied to the first word line and a seventh voltage higher than the sixth voltage is applied to the third word line, and
perform the second operation in which an eighth voltage lower than the second to the fourth, and the seventh voltage is applied to the third word line, and
wherein the sixth voltage and the eighth voltage turn off a memory cell.

6. The device according to claim 5, further comprising a second sense amplifier configured to determine data based on a voltage of the second bit line or a current in the second bit line in the data read operation,
wherein, when reading data from the fourth memory cell, the second sense amplifier is configured to
determine data in a period during the third voltage is applied to the first word line in the second operation, when the third memory cell is turned on in the third operation, and
determine data in a period during the fourth voltage is applied to the first word line in the second operation, when the third memory cell is turned off in the third operation.

7. The device according to claim 6, wherein data is written into the first memory cell and the fourth memory cell in parallel,
data is written into the second memory cell and the third memory cell after the data is written into the first memory cell and the fourth memory cell.

8. The device according to claim 1, further comprising:
a third memory cell;
a fourth memory cell;
a third word line coupled to the third memory cell; and
a fourth word line coupled to the fourth memory cell,
wherein the third memory cell faces the fourth memory cell with a second semiconductor layer interposed therebetween,
the first bit line is capable of being electrically coupled to both the third memory cell and the fourth memory cell,
the data read operation further includes a third operation before the second operation, and
when reading data from the first memory cell, the semiconductor memory device is configured to
perform the third operation in which a sixth voltage is applied to the third word line, a seventh voltage higher than the sixth voltage is applied to the first word line, an eighth voltage is applied to the second word line, and a ninth voltage is applied to the fourth word line, and
perform the second operation in which a tenth voltage different from the third voltage and the fourth voltage is applied to the first word line, and an eleventh voltage different from the third to the fifth voltage is further applied to the first word line, and
wherein the seventh voltage turns on a memory cell, and the eighth voltage and the ninth voltage turn off a memory cell.

9. The device according to claim 8, wherein the third memory cell is electrically coupled between the first memory cell and the first bit line, and
the fourth memory cell is electrically coupled between the second memory cell and the first bit line.

10. The device according to claim 8, further comprising a first sense amplifier configured to determine data based on a voltage of the first bit line or a current in the first bit line in the data read operation,
wherein, when reading data from the first memory cell, the first sense amplifier is configured to:
determine data in a period during the third voltage is applied to the first word line in the second operation, when the second memory cell turns on in the first operation and the third memory cell turns on in the third operation, and
determine data in a period during the eleventh voltage is applied to the first word line in the second operation, when the second memory cell turns off in the first operation and the third memory cell turns off in the third operation.

11. The device according to claim 10, wherein the eleventh voltage is higher than the third voltage.

12. The device according to claim 10, wherein the first sense amplifier is configured to:
determine data in a period during the fourth voltage is applied to the first word line in the second operation, when the second memory cell turns on in the first operation and the third memory cell turns off in the third operation, and
determine data in a period during the tenth voltage is applied to the first word line in the second operation, when the second memory cell turns off in the first operation and the third memory cell turns on in the third operation.

13. A semiconductor memory device comprising:
a memory cell set including a first memory cell and a second memory cell; and
a bit line capable of being electrically coupled to the first memory cell and the second memory cell of the memory cell set,
wherein the first memory cell faces the second memory cell with a semiconductor layer interposed therebetween,
the semiconductor memory device is configured to perform a read operation with the memory cell set, the read operation including a first operation to read data from one of the first memory cell and the second memory cell, and a second operation to read data from remaining one of the first memory cell and the second memory cell,
when the first memory cell of the memory cell set is selected, the semiconductor memory device is configured to:
perform the first operation to read data from the second memory cell, and perform, after the first operation, the second operation to read data from the first memory cell, and when the second memory cell of the memory cell set is selected, the semiconductor memory device is configured to perform the second operation to read data from the second memory cell without the first operation.

14. The device according to claim 13, further comprising:
a first word line coupled to the first memory cell;
a second word line coupled to the second memory cell; and
a sense amplifier configured to determine data read on the bit line from one of the first memory cell and the second memory cell,
wherein when the first memory cell is selected in the read operation, the semiconductor memory device is configured to:
perform the first operation in which a first voltage is applied to the first word line and a second voltage higher than the first voltage is applied to the second word line, and
perform the second operation in which a third voltage higher than the first voltage and a fourth voltage different from the third voltage are applied to the first word line and a fifth voltage lower than the second to the fourth voltage is applied to the second word line, and
wherein the first voltage and the fifth voltage turn off a memory cell.

15. The device according to claim 13, further comprising:
a first word line;
a second word line; and
a third word line,
wherein the memory cell set includes a first memory cell set and a second memory cell set,
the bit line includes a first bit line and a second bit line,
a first memory cell of the first memory cell set and a first memory cell of the second memory cell set are coupled to the first word line,
a second memory cell of the first memory cell set is coupled to the second word line,
a second memory cell of the second memory cell set is coupled to the third word line, and
in the read operation, the semiconductor memory device is configured to:
perform the first operation and the second operation with the first memory cell set, when the first memory cell of the first memory cell set is selected,
perform the second operation with the first memory cell set without the first operation, when the second memory cell of the first memory cell set is selected,
perform the second operation with the second memory cell set without the first operation, when the first memory cell of the second memory cell set is selected, and
perform the first operation and the second operation with the second memory cell set, when the second memory cell of the second memory cell set is selected.

16. The device according to claim 15, wherein data is written into the first memory cell of the first memory cell set and the first memory cell of the second memory cell set in parallel,
data is written into the second memory cell of the first memory cell set after the data is written into the first memory cell of the first memory cell set and the first memory cell of the second memory cell set, and
data is written into the second memory cell of the second memory cell set before the data is written into the first memory cell of the first memory cell set and the first memory cell of the second memory cell set.

17. The device according to claim 13, further comprising:
a first word line;
a second word line; and
a third word line,
wherein the memory cell set includes a first memory cell set and a second memory cell set,
the bit line includes a first bit line and a second bit line,
a first memory cell of the first memory cell set and a first memory cell of the second memory cell set are coupled to the first word line,
a second memory cell of the first memory cell set is coupled to the second word line,
a second memory cell of the second memory cell set is coupled to the third word line, and
in the read operation, the semiconductor memory device is configured to:
perform the first operation and the second operation with the first memory cell set, when the first memory cell of the first memory cell set is selected,
perform the second operation with the first memory cell set without the first operation, when the second memory cell of the first memory cell set is selected,
perform the first operation and the second operation with the second memory cell set, when the first memory cell of the second memory cell set is selected, and
perform the second operation with the second memory cell set without the first operation, when the second memory cell of the second memory cell set is selected.

18. The device according to claim 15, wherein data is written into the first memory cell of the first memory cell set and the first memory cell of the second memory cell set in parallel,
data is written into the second memory cell of the first memory cell set after the data is written into the first memory cell of the first memory cell set and the first memory cell of the second memory cell set, and
data is written into the second memory cell of the second memory cell set after the data is written into the first memory cell of the first memory cell set and the first memory cell of the second memory cell set.

19. The device claim 15, wherein the first word line is between the second word line and the third word line.

20. The device claim 18, wherein the first word line is between the second word line and the third word line.

* * * * *